(12) United States Patent
Kambe et al.

(10) Patent No.: US 9,105,858 B2
(45) Date of Patent: Aug. 11, 2015

(54) ORGANIC ELECTROLUMINESCENT DEVICE AND DISPLAY APPARATUS

(75) Inventors: Emiko Kambe, Kanagawa (JP); Yasunori Kijima, Tokyo (JP)

(73) Assignee: JOLED INC., Tokyo (JP)

( * ) Notice: Subject to any disclaimer, the term of this patent is extended or adjusted under 35 U.S.C. 154(b) by 552 days.

(21) Appl. No.: 12/730,637

(22) Filed: Mar. 24, 2010

(65) Prior Publication Data

US 2010/0252823 A1  Oct. 7, 2010

(30) Foreign Application Priority Data

Apr. 3, 2009  (JP) ................................. 2009-090765

(51) Int. Cl.
| | |
|---|---|
| H01L 51/54 | (2006.01) |
| H01L 51/50 | (2006.01) |
| H01L 27/32 | (2006.01) |
| H01L 51/00 | (2006.01) |

(52) U.S. Cl.
CPC ........ H01L 51/5048 (2013.01); H01L 51/0072 (2013.01); *H01L 27/3244* (2013.01); *H01L 51/006* (2013.01); *H01L 51/0059* (2013.01); *H01L 2251/558* (2013.01)

(58) Field of Classification Search
CPC ............ H01L 51/0072; H01L 51/5048; H01L 27/3244; H01L 51/0059; H01L 2251/558; H01L 51/006

See application file for complete search history.

(56) References Cited

U.S. PATENT DOCUMENTS

| 5,766,779 | A  * | 6/1998 | Shi et al. ........................ 428/690 |
| 6,727,644 | B2 * | 4/2004 | Hatwar et al. ................ 313/504 |
| 2002/0096995 | A1 * | 7/2002 | Mishima et al. .............. 313/506 |
| 2003/0165715 | A1 * | 9/2003 | Yoon et al. .................... 428/690 |

(Continued)

FOREIGN PATENT DOCUMENTS

| JP | 2008-52144 | 6/2008 |
| JP | 2008-521243 | 6/2008 |

*Primary Examiner* — Dawn Garrett
(74) *Attorney, Agent, or Firm* — Dentons US LLP

(57) ABSTRACT

An organic electroluminescent device includes an anode; a cathode; an organic layer including a light-emitting layer and disposed between the anode and the cathode; and an electron transport layer constituting the organic layer, disposed between the cathode and the light-emitting layer, and having a stacked structure including a layer containing a benzimidazole derivative and a layer containing a dibenzimidazole derivative represented by general formula (1):

General formula (1)

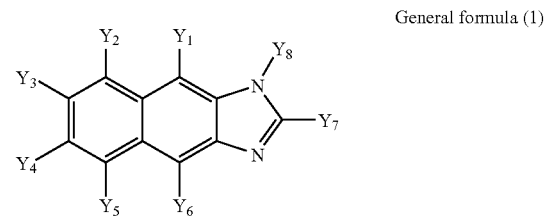

wherein $Y_1$ to $Y_8$ each represent a substituted or unsubstituted aryl group having 6 to 60 carbon atoms, a substituted or unsubstituted alkenyl group, a substituted or unsubstituted pyridyl group, a substituted or unsubstituted quinolyl group, a substituted or unsubstituted alkyl group having 1 to 20 carbon atoms, a substituted or unsubstituted alkoxy group having 1 to 20 carbon atoms, or a substituted or unsubstituted aliphatic cyclic group, and $Y_7$ and $Y_8$ may form a ring through a linking group.

9 Claims, 9 Drawing Sheets

(56) References Cited

U.S. PATENT DOCUMENTS

| | | | |
|---|---|---|---|
| 2006/0105202 A1* | 5/2006 | Kitamura | 428/690 |
| 2006/0204786 A1* | 9/2006 | Begley et al. | 428/690 |
| 2007/0018154 A1 | 1/2007 | Bae et al. | |
| 2007/0018155 A1* | 1/2007 | Bae et al. | 257/40 |
| 2007/0069203 A1 | 3/2007 | Lee et al. | |
| 2007/0200490 A1* | 8/2007 | Kawamura et al. | 313/504 |
| 2008/0233387 A1* | 9/2008 | Kambe et al. | 428/332 |
| 2008/0290788 A1* | 11/2008 | Nagara et al. | 313/504 |
| 2009/0140641 A1* | 6/2009 | Nomura et al. | 313/504 |
| 2009/0243473 A1* | 10/2009 | Iwakuma et al. | 313/504 |

* cited by examiner

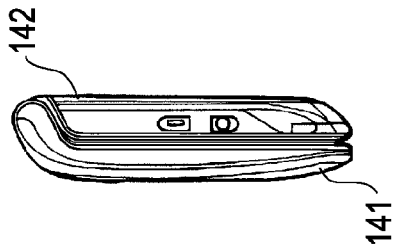
FIG. 8E
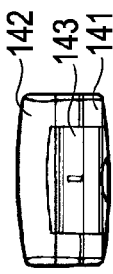
FIG. 8F
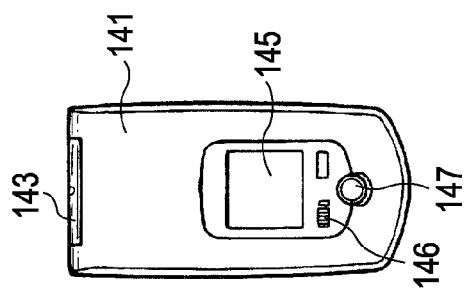
FIG. 8C
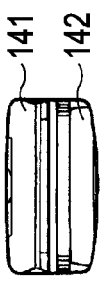
FIG. 8G
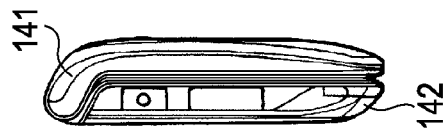
FIG. 8D
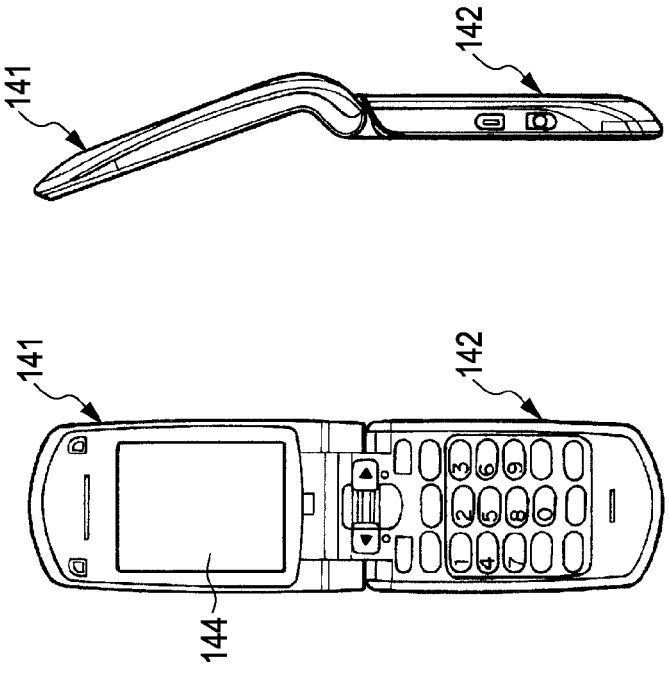
FIG. 8B
FIG. 8A

ORGANIC ELECTROLUMINESCENT DEVICE AND DISPLAY APPARATUS

BACKGROUND OF THE INVENTION

1. Field of the Invention

The present invention relates to an organic electroluminescent device (organic EL device) and a display apparatus. In particular, the present invention relates to an organic electroluminescent device and a display apparatus that include an electron transport layer containing a nitrogen-containing heterocyclic derivative.

2. Description of the Related Art

Organic electroluminescent devices (organic EL devices) that use electroluminescence (hereinafter abbreviated as EL) of organic materials include an anode, a cathode, and an organic layer including a light-emitting layer and disposed between the anode and the cathode, and are attracting attention as light-emitting devices that can emit light with high luminance by a low-voltage direct current drive.

In organic electroluminescent devices having such a structure, various studies have been made on the layer structure between the anode and the cathode and configurations of materials for respective layers in order to improve luminous efficiency and lifetime characteristics. For example, a configuration has been proposed in which a dibenzimidazole derivative is used as a material for an electron injection layer and an electron transport layer that are provided between a light-emitting layer and a cathode (refer to Japanese Unexamined Patent Application Publication (Translation of PCT Application) Nos. 2008-521243 and 2008-521244).

SUMMARY OF THE INVENTION

The dibenzimidazole derivatives described in Japanese Unexamined Patent Application Publication (Translation of PCT Application) Nos. 2008-521243 and 2008-521244) have high electron injection barriers and low electron mobility. As a result, an increase in the voltage and a decrease in the luminous efficiency due to shortage of electrons occur.

Accordingly, it is desirable to provide an organic electroluminescent device in which luminous efficiency and lifetime characteristics can be further improved.

According to an embodiment of the present invention, there is provided an organic electroluminescent device including an anode, a cathode, an organic layer including at least a light-emitting layer and disposed between the anode and the cathode, and an electron transport layer constituting the organic layer and disposed between the cathode and the light-emitting layer. This electron transport layer has a structure in which a layer containing a dibenzimidazole derivative represented by general formula (1) below and a layer containing a benzimidazole derivative are stacked in this order from the light-emitting layer side.

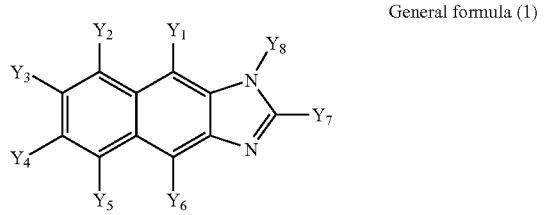

General formula (1)

In general formula (1), $Y_1$ to $Y_8$ each represent a substituted or unsubstituted aryl group having 6 to 60 carbon atoms, a substituted or unsubstituted alkenyl group, a substituted or unsubstituted pyridyl group, a substituted or unsubstituted quinolyl group, a substituted or unsubstituted alkyl group having 1 to 20 carbon atoms, a substituted or unsubstituted alkoxy group having 1 to 20 carbon atoms, or a substituted or unsubstituted aliphatic cyclic group, and $Y_7$ and $Y_8$ may form a ring through a linking group.

According to an embodiment of the present invention, there is provided a display apparatus including a substrate on which an organic electroluminescent device having the above-described structure is arranged.

In the organic electroluminescent device and display apparatus having the above structure, the electron transport layer has a stacked structure, and the layer containing the benzimidazole derivative is provided on the cathode side of the layer containing the dibenzimidazole derivative represented by general formula (1). When only the dibenzimidazole derivative represented by general formula (1) is used, the electron injection barrier from the cathode is high. However, the electron injection barrier can be reduced by stacking a benzimidazole derivative having a high electron injection property on the cathode side. When only such a benzimidazole derivative is used, electrons are excessively supplied to a light-emitting layer. However, the amount of electrons can be adjusted by stacking the dibenzimidazole derivative on the light-emitting layer side, thus adjusting the amount of electrons necessary and sufficient for forming excitons necessary for light emission. In particular, the amount of necessary electrons can be satisfactorily adjusted by adjusting the thickness of the layer containing the dibenzimidazole derivative.

As a result, as described in Examples below, an organic electroluminescent device having a long lifetime and a high efficiency can be produced.

As described above, according to an embodiment of the present invention, luminous efficiency and lifetime characteristics of an organic electroluminescent device can be improved, thus realizing a reduction in the electric power consumption and an improvement in the long-term reliability of a display apparatus including the organic electroluminescent device.

BRIEF DESCRIPTION OF THE DRAWINGS

FIGS. 8A to 8G are views showing a mobile terminal apparatus, for example, a mobile phone, to which an embodiment of the present invention is applied;

DESCRIPTION OF THE PREFERRED EMBODIMENTS

1. Overall Structure of Organic Electroluminescent Device

Figure 1:
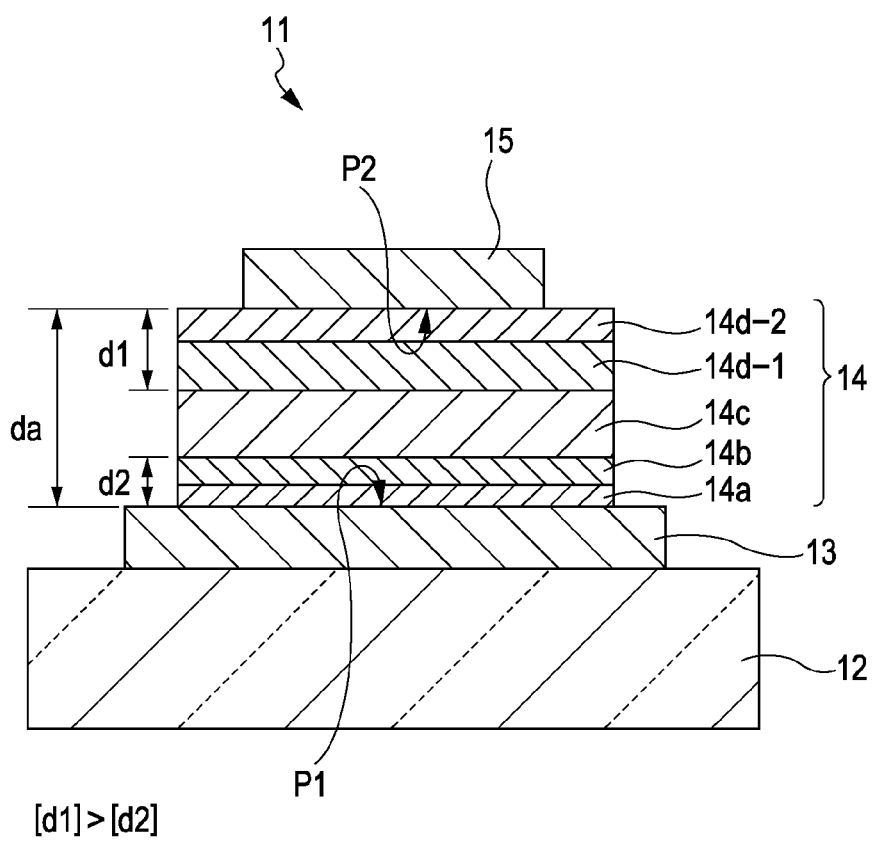
FIG. 1 is a cross-sectional view showing the structure of an organic electroluminescent device according to an embodiment of the present invention.

FIG. 1 is a cross-sectional view showing an example of the structure of an organic electroluminescent device according to an embodiment of the present invention. An organic electroluminescent device 11 shown in FIG. 1 includes an anode 13 provided on a substrate 12, an organic layer 14 stacked the anode 13, and a cathode 15 provided on the organic layer 14.

A description will now be made of the structure of a top-emission-type organic electroluminescent device 11 in which light emitted when holes injected from the anode 13 and electrons injected from the cathode 15 are recombined in a light-emitting layer 14c is extracted from the cathode 15 side opposite to the substrate 12.

2. Substrate

The substrate 12 on which the organic electroluminescent device 11 is provided is appropriately selected from a transparent substrate such as a glass substrate, a silicon substrate, a film-like flexible substrate, and the like and used. When the drive system of a display apparatus produced by using the organic electroluminescent devices 11 is the active matrix system, a TFT substrate including TFTs arranged so as to correspond to respective pixels is used as the substrate 12. In such a case, the display apparatus is configured so that the top-emission-type organic electroluminescent devices 11 are driven by the TFTs.

3. Structure of Anode

The anode 13 provided as a lower electrode on the substrate 12 is composed of an electrode material in which the work function from the vacuum level is large. Examples of such a material include chromium (Cr), gold (Au), an alloy of tin oxide ($SnO_2$) and antimony (Sb), an alloy of zinc oxide (ZnO) and aluminum (Al), a silver (Ag) alloy, and oxides of these metals or alloys. These materials may be used alone or in a mixed state.

When the organic electroluminescent device 11 is a top-emission-type device, the anode 13 may be composed of a material having a high reflectance. Thus, the light extraction efficiency to the outside can be improved by an interference effect and a high reflectance effect. For example, a material containing Al, Ag, or the like as a main component is preferably used as such an electrode material. When a layer composed of a transparent electrode material, such as ITO, having a large work function is provided on such a layer composed of a material having a high reflectance, the carrier injection efficiency can also be increased.

Alternatively, the anode 13 may be composed of an Al alloy, and a metal, such as neodymium, having a relatively smaller work function than that of Al serving as a main component may be used as an accessory component of the Al alloy. Thus, the stability of the Al alloy is improved to realize a stable anode having a high reflectance. In such a case, the work function is often smaller than an anode composed of a layer of a transparent electrode material, such as ITO, having a large work function. Consequently, the hole injection barrier often becomes high when only a commonly used amine compound is used as the hole injection layer. Therefore, by forming a layer of an amine compound and an acceptor material such as 2,3,5,6-tetrafluoro-7,7,8,8-tetracyanoquinodimethane (F4TCNQ) mixed therein, a p-doped layer composed of polyethylenedioxythiophene-polystyrene sulfonic acid (PEDOT-PSS) or the like at an interface with the anode or by using an azatriphenylene derivative described below, a low drive voltage can be achieved. An azatriphenylene derivative is preferable especially from the standpoint of device stability and a low drive voltage.

When the drive system of a display apparatus produced by using the organic electroluminescent devices 11 is the active matrix system, such anodes 13 are patterned so as to correspond to respective pixels including respective TFTs. As an upper layer of the anode 13, an insulating film (not shown) is provided, and the surfaces of the anodes 13 of the respective pixels are exposed through openings of the insulating film.

4. Structure of Cathode

The cathode 15 is formed as a layer composed of a material having a small work function such that the layer is in contact with the organic layer 14, and has a configuration which is good in optical transparency. As such a configuration, for example, the cathode 15 has a structure in which a first layer 15a and a second layer 15b are stacked in this order from the anode 13 side.

The first layer 15a is composed of a material having a small work function and good optical transparency. Examples of such a material include alkali metal oxides, alkali metal fluorides, alkaline earth metal oxides and alkaline earth metal fluorides, such as $Li_2O$, $Cs_2Co_3$, $Cs_2SO_4$, $MgF$, $LiF$, and $CaF_2$. The second layer 15b is composed of a material having optical transparency and good electrical conductivity and is formed, for example, in the form of a thin-film Mg—Ag electrode or Ca electrode. In particular, when this organic electroluminescent device 11 is a top-emitting device constituted by a resonator structure in which emitted light is resonated between the anode 13 and the cathode 15 and is extracted, the second layer 15b is formed of, for example, a semi-transmissive reflective material such as Mg—Ag to cause the light to resonate between the second layer 15b and the anode 13. Alternatively, the second layer 15b is composed of, for example, a transparent $SiN_x$ compound, and is formed as a sealing electrode for suppressing the degradation of the electrode.

The first layer 15a and the second layer 15b are formed by a method such as a vacuum evaporation method, a sputtering method, a plasma chemical vapor deposition (CVD) method, or the like. When the drive system of a display apparatus produced by using the organic electroluminescent devices 11 is the active matrix system, the cathode 15 may be formed as a solid film on the substrate 12 such that the cathode 15 is insulated from the anode 13 by an insulating film (not shown) that covers peripheral edges of the anode 13, and the organic layer 14, and the cathode 15 may be used as a common electrode to the respective pixels.

5. Overall Structure of Organic Layer

The organic layer 14 disposed between the above-described anode 13 and cathode 15 includes at least a light-emitting layer 14c. The organic layer 14 is formed by stacking, from the anode 13 side, a hole supply layer (including a hole injection layer 14a and a hole transport layer 14b in this embodiment), the light-emitting layer 14c, a first electron transport layer 14d-1, and a second electron transport layer 14d-2 in this order. The hole supply layer formed by stacking the hole injection layer 14a and the hole transport layer 14b supplies holes from the anode 13 to the light-emitting layer 14c. The first electron transport layer 14d-1 and the second electron transport layer 14d-2 supply electrons from the cathode 15 to the light-emitting layer 14c.

According to this embodiment, an electron transport layer formed by stacking, from the light-emitting layer 14c side, the first electron transport layer 14d-1 and the second electron transport layer 14d-2 in this order is provided between the cathode 15 and the light-emitting layer 14c. One of the first electron transport layer 14d-1 and the second electron transport layer 14d-2 is a layer containing a dibenzimidazole derivative, and the other is a layer containing a benzimidazole derivative. Preferably, the first electron transport layer 14d-1 containing a dibenzimidazole derivative and the second electron transport layer 14d-2 containing a benzimidazole derivative are stacked in this order from the light-emitting layer 14c side.

Each of the above-mentioned layers is an organic layer formed by a vacuum evaporation method or another method such as a spin-coating method. The materials of the layers will be described in detail below.

6. Materials of Organic Layer

The materials of respective layers constituting the organic layer 14 will be first described in the order of the first electron transport layer 14d-1 and the second electron transport layer 14d-2, which constitute a feature of this embodiment, and the light-emitting layer 14c. Subsequently, the materials of the hole injection layer 14a and the hole transport layer 14b will be described.

First Electron Transport Layer and Second Electron Transport Layer

According to this embodiment, one of the first electron transport layer 14d-1 and the second electron transport layer 14d-2 contains a dibenzimidazole derivative represented by general formula (1) below.

General formula (1)

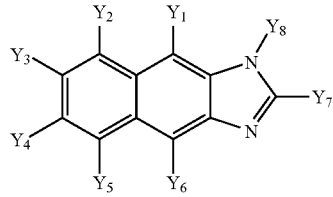

In general formula (1), $Y_1$ to $Y_8$ each represent a substituted or unsubstituted aryl group having 6 to 60 carbon atoms, a substituted or unsubstituted alkenyl group, a substituted or unsubstituted pyridyl group, a substituted or unsubstituted quinolyl group, a substituted or unsubstituted alkyl group having 1 to 20 carbon atoms, a substituted or unsubstituted alkoxy group having 1 to 20 carbon atoms, or a substituted or unsubstituted aliphatic cyclic group, and $Y_7$ and $Y_8$ may form a ring through a linking group.

Specific examples of the dibenzimidazole derivative represented by general formula (1) include compounds represented by structural formulae (1)-1 to (1)-21 below.

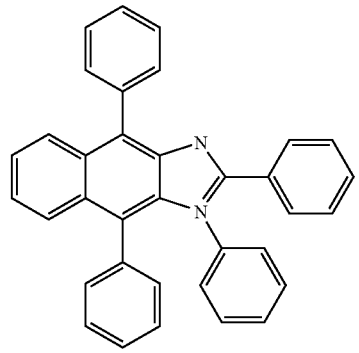

(1)-1

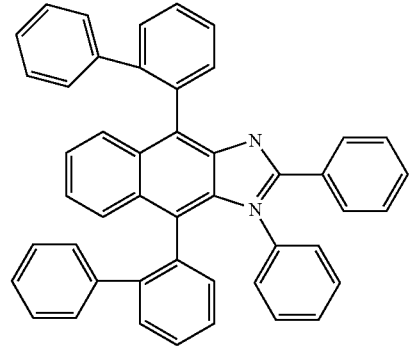

(1)-2

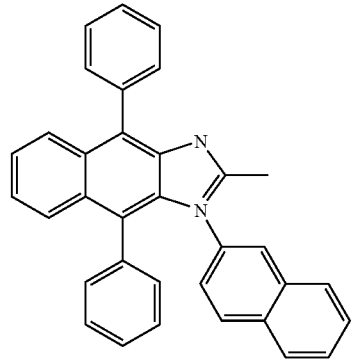

(1)-3

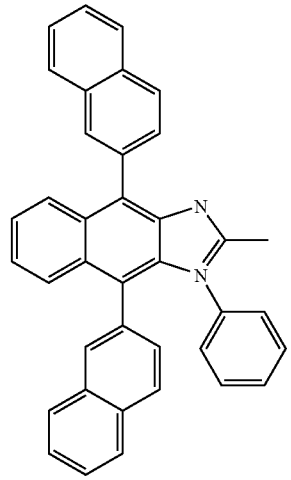

(1)-4

(1)-5
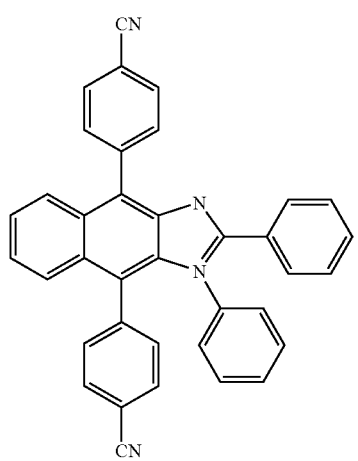
(1)-6
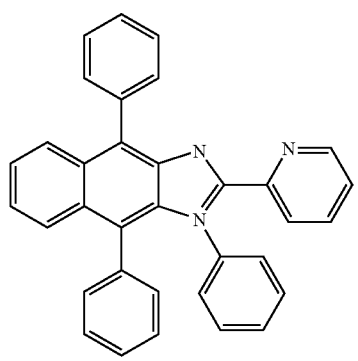
(1)-7
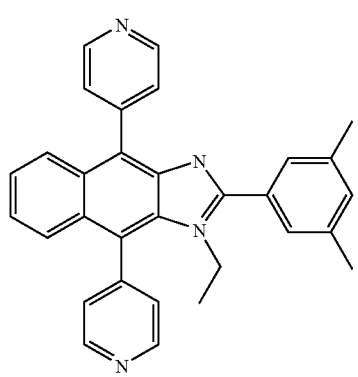
(1)-8
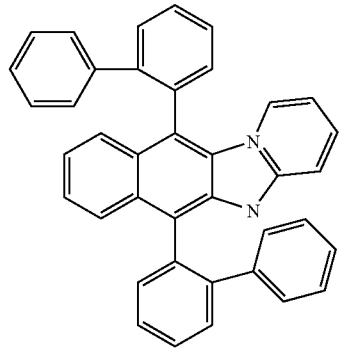
(1)-9
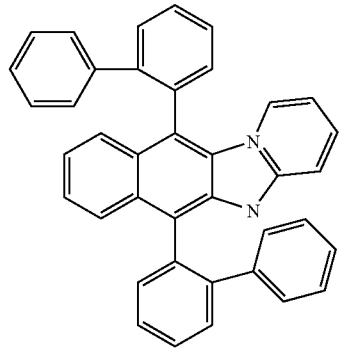
(1)-10
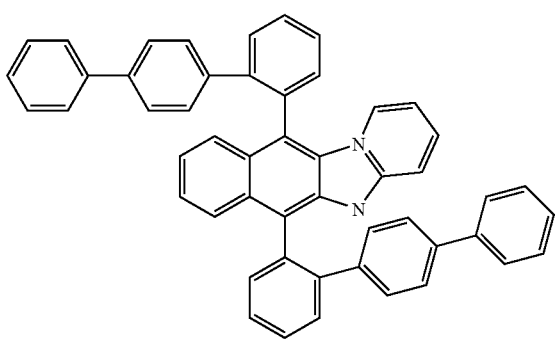
(1)-11
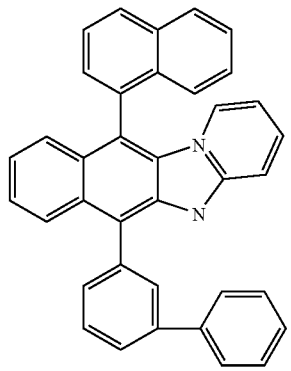
(1)-12
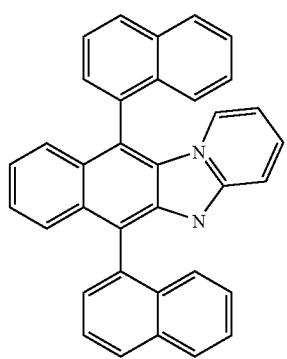

(1)-13 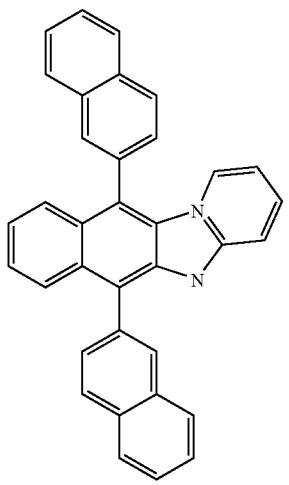
(1)-14 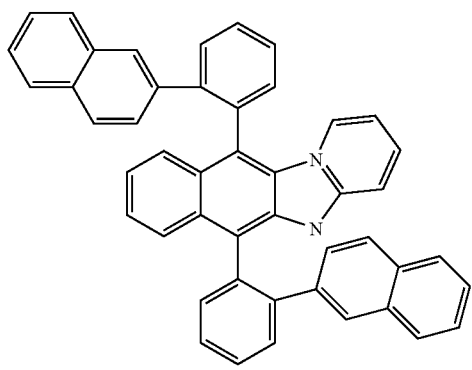
(1)-15 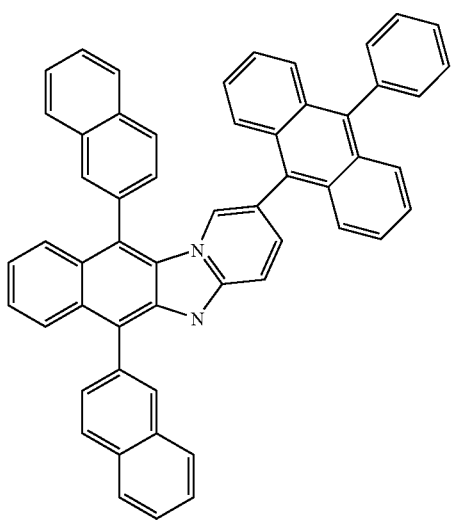
(1)-16 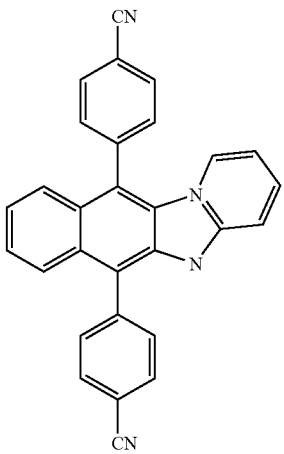
(1)-17 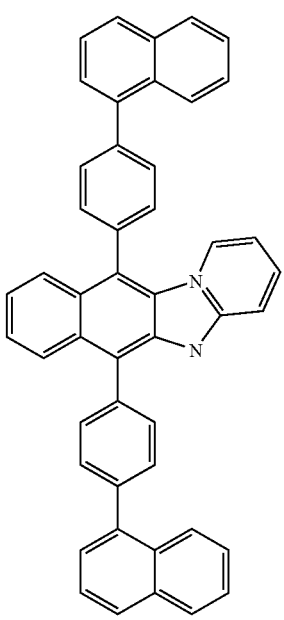
(1)-18 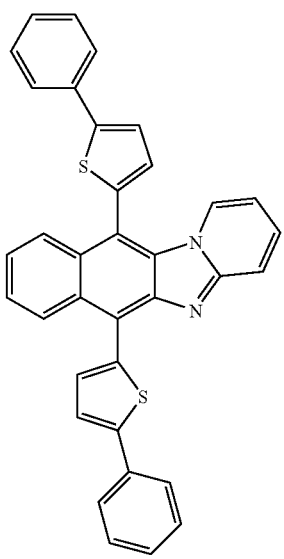

-continued (1)-19

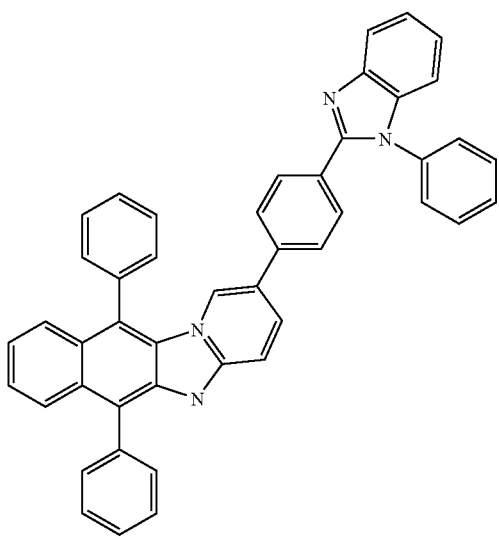

(1)-20

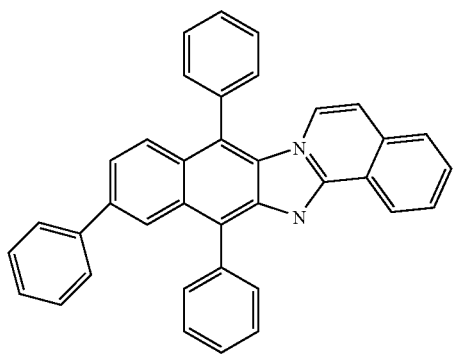

(1)-21

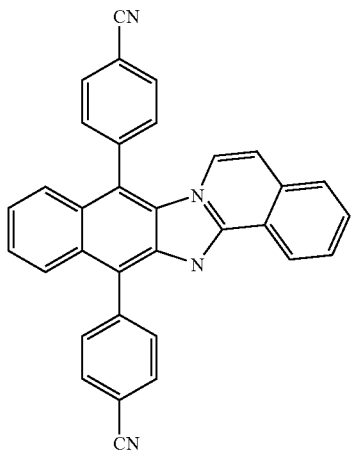

The dibenzimidazole derivative described above may constitute the first electron transport layer 14*d*-1 or the second electron transport layer 14*d*-2 in the form of a mixed layer containing another compound. In such a case, the other compound may be at least one selected from alkali metals, alkaline earth metals, rare earth metals, oxides thereof, composite oxides thereof, fluorides thereof, and carbonates thereof.

The dibenzimidazole derivative described above is preferably contained in the first electron transport layer 14*d*-1 disposed on the light-emitting layer 14*c* side. In this case, the thickness of the first electron transport layer 14*d*-1 is preferably 5 nm or more, and more preferably 10 nm.

According to this embodiment, out of the first electron transport layer 14*d*-1 and the second electron transport layer 14*d*-2, the layer that does not contain the dibenzimidazole derivative represented by general formula (1) contains a benzimidazole derivative. Herein, the benzimidazole derivative refers to a derivative having benzimidazole as the main skeleton. Such a benzimidazole derivative is preferably a material having a high electron injection property and is represented by any one of general formulae (2) to (4) below. The second electron transport layer 14*d*-2 may contain a plurality of materials represented by general formulae (2) to (4). Alternatively, the second electron transport layer 14*d*-2 may have a structure in which a plurality of layers containing the above materials are stacked.

General formula (2)

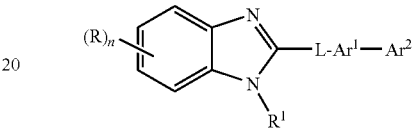

General formula (3)

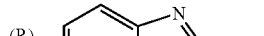

General formula (4)

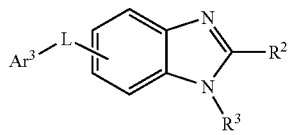

Each of the symbols in general formulae (2) to (4) is as follows.

R represents a hydrogen atom, a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, or a substituted or unsubstituted alkoxy group having 1 to 20 carbon atoms, and n represents an integer of 0 to 4.

$R^1$ represents a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, or an alkoxy group having 1 to 20 carbon atoms.

$R^2$ and $R^3$ each independently represent a hydrogen atom, a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, or a substituted or unsubstituted alkoxy group having 1 to 20 carbon atoms.

L represents a substituted or unsubstituted arylene group having 6 to 60 carbon atoms, a substituted or unsubstituted pyridinylene group, a substituted or unsubstituted quinolinylene group, a substituted or unsubstituted fluorenylene group, or merely a linking moiety.

$Ar^1$ represents a substituted or unsubstituted arylene group having 6 to 60 carbon atoms, a substituted or unsubstituted pyridinylene group, or a substituted or unsubstituted quinolinylene group.

Ar² represents a substituted or unsubstituted aryl group having 6 to 60 carbon atoms, a substituted or unsubstituted alkyl group having 1 to 20 carbon atoms, a substituted or unsubstituted alkoxy group having 1 to 20 carbon atoms, or a substituted or unsubstituted heteroaryl group having 3 to 40 carbon atoms.

Ar³ represents a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, a substituted or unsubstituted alkoxy group having 1 to 20 carbon atoms, or a group represented by —Ar¹—Ar² including Ar¹ and Ar² described above.

More specific structural examples of the benzimidazole derivative will be shown below.

Specific examples of the benzimidazole derivative represented by general formula (2) include compounds represented by structural formulae (2)-1 to (2)-79 below. Note that, in Tables 1 to 10, HAr represents [benzimidazole structure+ R, R¹] in general formula (2).

TABLE 1

| Structural formula No. | HAr-L-Ar¹—Ar² | | | |
|---|---|---|---|---|
| | HAr | L | Ar¹ | Ar² |
| (2)-1 | | | | |
| (2)-2 | | | | |
| (2)-3 | | | | |
| (2)-4 | | | | |
| (2)-5 | | | | |

TABLE 1-continued
| Structural formula No. | HAr | L | Ar¹ | Ar² |
|---|---|---|---|---|
| (2)-6 | 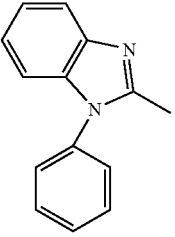 | 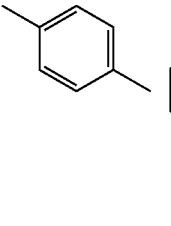 | 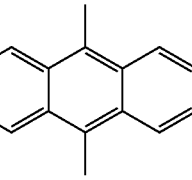 | 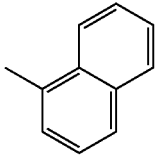 |
| (2)-7 | 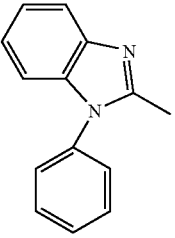 | 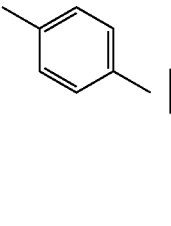 | 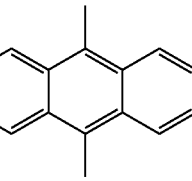 | 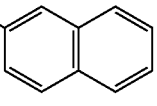 |
| (2)-8 | 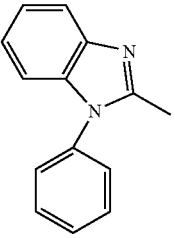 | 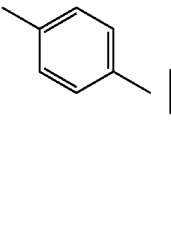 | 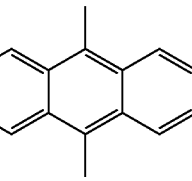 | 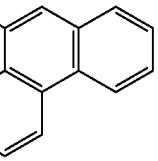 |
| (2)-9 | 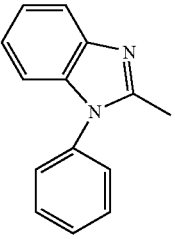 | 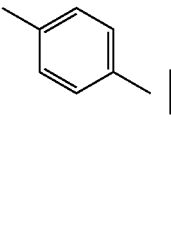 | 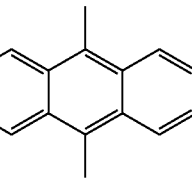 | 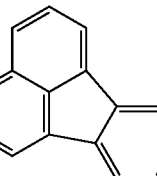 |
TABLE 2
| Structural formula No. | HAr | L | Ar¹ | Ar² |
|---|---|---|---|---|
| (2)-10 | 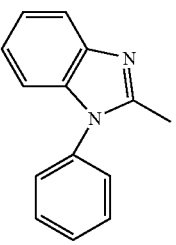 | 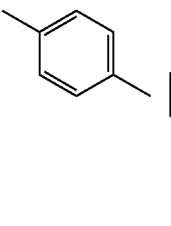 | 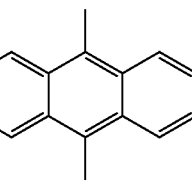 | 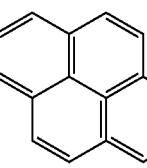 |

TABLE 2-continued
| Structural formula No. | HAr | L | Ar¹ | Ar² |
|---|---|---|---|---|
| (2)-11 | 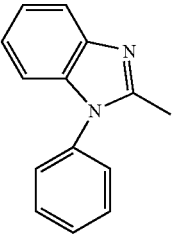 | 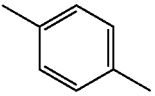 | 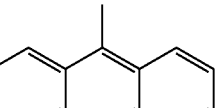 | 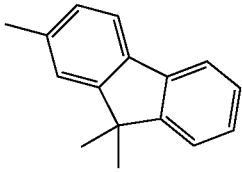 |
| (2)-12 | 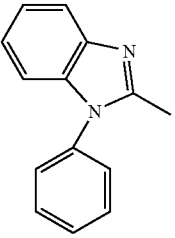 | 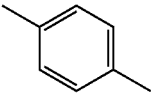 | 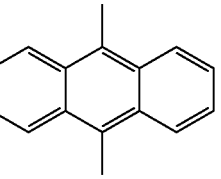 | 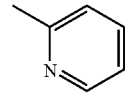 |
| (2)-13 | 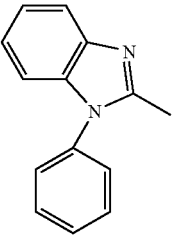 | 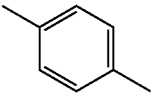 | 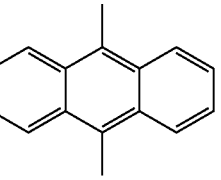 | 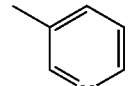 |
| (2)-14 | 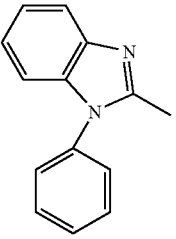 | 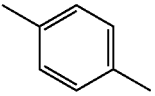 | 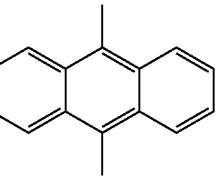 | 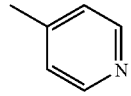 |
| (2)-15 | 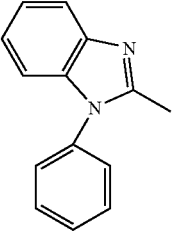 | 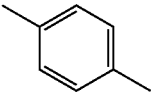 | 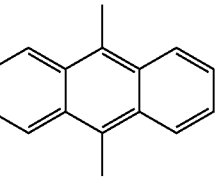 | 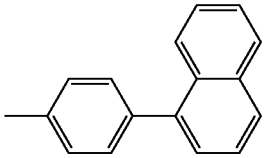 |

TABLE 3

| Structural formula No. | HAr—L—Ar¹—Ar² | | | |
|---|---|---|---|---|
| | HAr | L | Ar¹ | Ar² |
| (2)-16 | 1-methyl-2-methyl-benzimidazole | p-phenylene | 9,10-anthracenyl | 2-naphthyl |
| (2)-17 | 1-ethyl-2-methyl-benzimidazole | p-phenylene | 9,10-anthracenyl | 2-naphthyl |
| (2)-18 | 7-methyl-2-methyl-1-phenyl-benzimidazole | p-phenylene | 9,10-anthracenyl | 2-naphthyl |
| (2)-19 | 6-methyl-2-methyl-1-phenyl-benzimidazole | p-phenylene | 9,10-anthracenyl | 2-naphthyl |
| (2)-20 | 5-methyl-2-methyl-1-phenyl-benzimidazole | p-phenylene | 9,10-anthracenyl | 2-naphthyl |
| (2)-21 | 4-methyl-2-methyl-1-phenyl-benzimidazole | p-phenylene | 9,10-anthracenyl | 2-naphthyl |

TABLE 3-continued

| Structural formula No. | HAr | L | Ar¹ | Ar² |
|---|---|---|---|---|
| (2)-22 | (phenyl-substituted 1-phenyl-2-methylbenzimidazole) | (p-phenylene) | (9,10-anthracenediyl) | (2-naphthyl) |

TABLE 4

| Structural formula No. | HAr | L | Ar¹ | Ar² |
|---|---|---|---|---|
| (2)-23 | (5-phenyl-1-phenyl-2-methylbenzimidazole) | (p-phenylene) | (9,10-anthracenediyl) | (2-naphthyl) |
| (2)-24 | (5,6-diphenyl-1-phenyl-2-methylbenzimidazole) | (p-phenylene) | (9,10-anthracenediyl) | (2-naphthyl) |

TABLE 5

| Structural formula No. | HAr | L | Ar¹ | Ar² |
|---|---|---|---|---|
| (2)-25 | (1-(2-pyridyl)-2-methylbenzimidazole) | (p-phenylene) | (9,10-anthracenediyl) | (2-naphthyl) |

TABLE 5-continued
| Structural formula No. | HAr | L | Ar¹ | Ar² |
|---|---|---|---|---|
| (2)-26 | 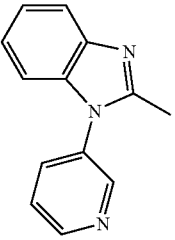 | 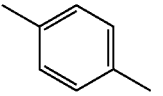 | 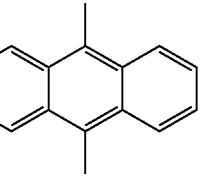 | 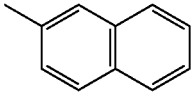 |
| (2)-27 | 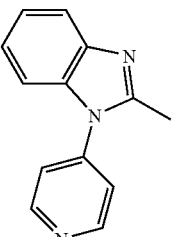 | 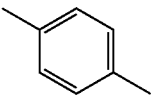 | 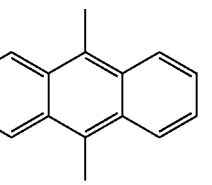 | 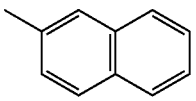 |
| (2)-28 | 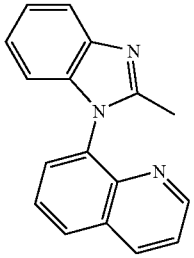 | 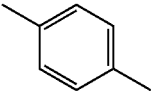 | 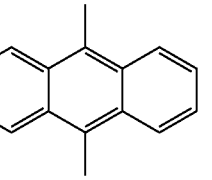 | 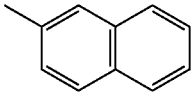 |
| (2)-29 | 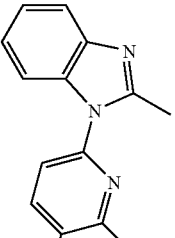 | 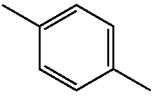 | 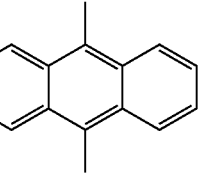 | 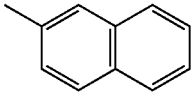 |
| (2)-30 | 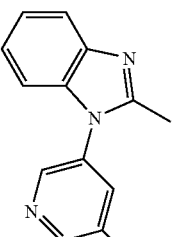 | 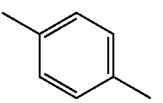 | 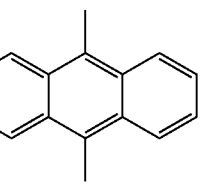 | 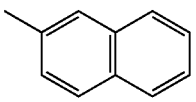 |

TABLE 6
| Structural formula No. | HAr | L | Ar¹ | Ar² |
|---|---|---|---|---|
| (2)-31 | 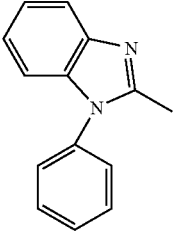 |  | 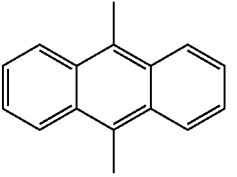 | 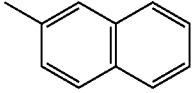 |
| (2)-32 | 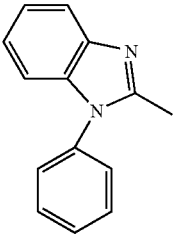 | 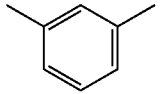 | 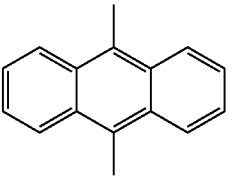 | 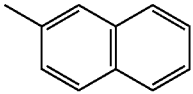 |
| (2)-33 | 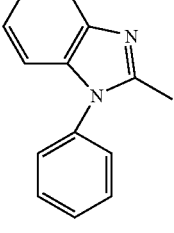 | 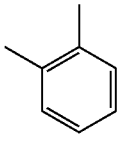 | 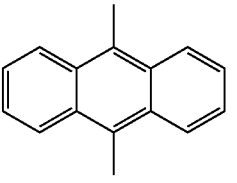 | 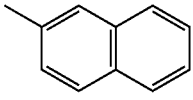 |
| (2)-34 | 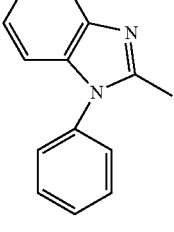 | 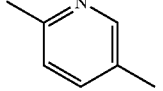 | 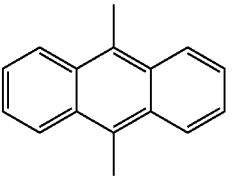 | 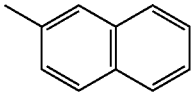 |
| (2)-35 | 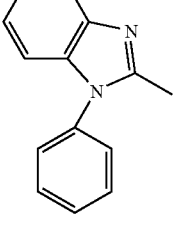 | 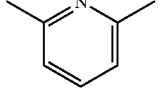 | 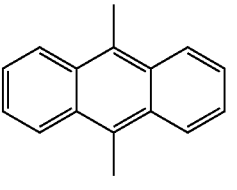 | 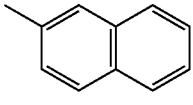 |
| (2)-36 | 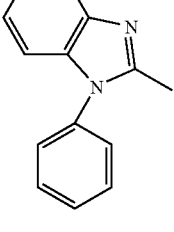 | 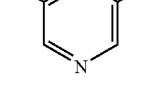 | 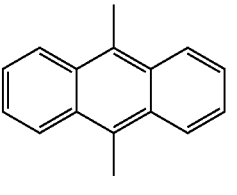 | 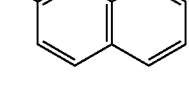 |

TABLE 6-continued
| Structural formula No. | HAr | L | Ar¹ | Ar² |
|---|---|---|---|---|
| (2)-37 | 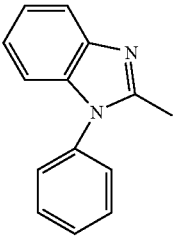 | 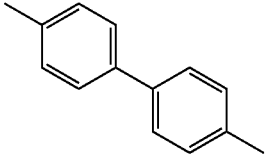 | 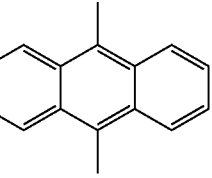 | 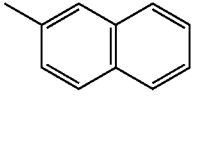 |
| (2)-38 | 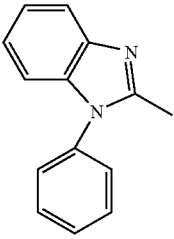 | 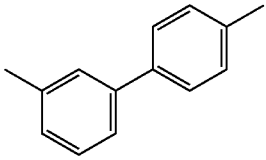 | 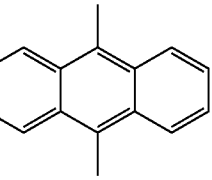 | 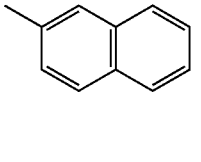 |
| (2)-39 | 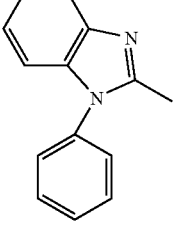 | 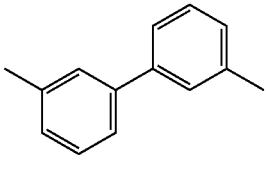 | 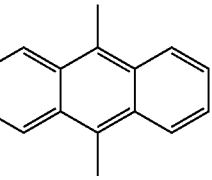 | 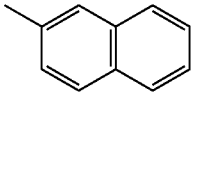 |
| (2)-40 | 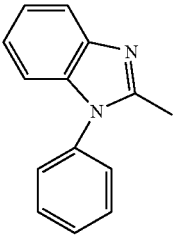 | 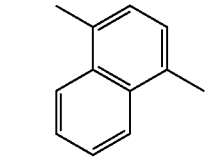 | 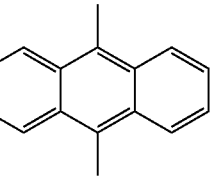 | 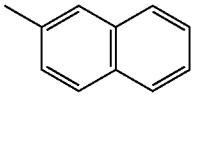 |
| (2)-41 | 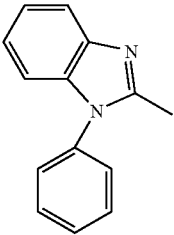 | 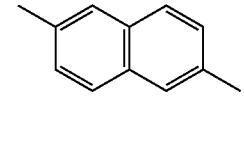 | 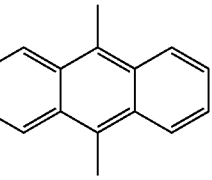 | 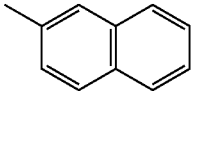 |
| (2)-42 | 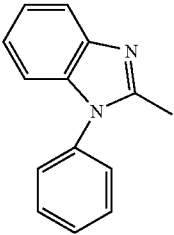 | 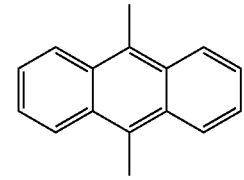 | 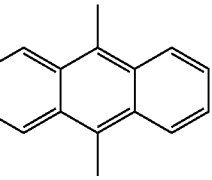 | 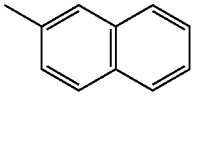 |

TABLE 7

| Structural formula No. | HAr—L—Ar¹—Ar² | | | |
|---|---|---|---|---|
| | HAr | L | Ar¹ | Ar² |
| (2)-43 | 1-phenyl-2-methyl-benzimidazole | p-phenylene | 9,10-dimethyl-2-methylanthracene | 2-naphthyl |
| (2)-44 | 1-phenyl-2-methyl-benzimidazole | p-phenylene | 9,10-dimethyl-2-tert-butylanthracene | 2-naphthyl |
| (2)-45 | 1-phenyl-2-methyl-benzimidazole | p-phenylene | 9,10-dimethyl-2-phenylanthracene | 2-naphthyl |
| (2)-46 | 1-phenyl-2-methyl-benzimidazole | p-phenylene | 9,10-dimethyl-2,6-dimethylanthracene | 2-naphthyl |
| (2)-47 | 1-phenyl-2-methyl-benzimidazole | p-phenylene | 9,10-dimethyl-2,6-di-tert-butylanthracene | 2-naphthyl |
| (2)-48 | 1-phenyl-2-methyl-benzimidazole | p-phenylene | 9,10-dimethyl-2,6-diphenylanthracene | 2-naphthyl |

TABLE 8
| Structural formula No. | HAr | L | Ar¹ | Ar² |
|---|---|---|---|---|
| (2)-49 | 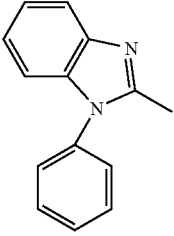 | 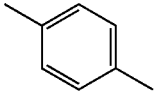 | 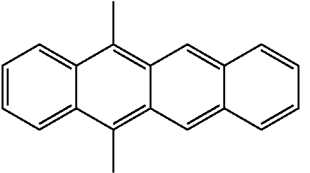 | 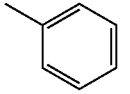 |
| (2)-50 | 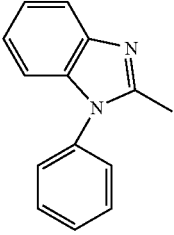 | 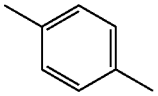 | 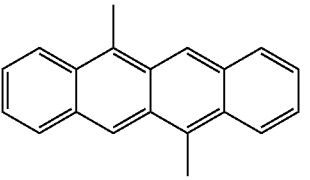 | 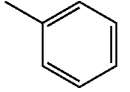 |
| (2)-51 | 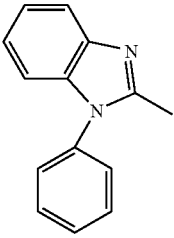 | 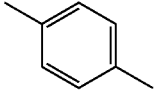 | 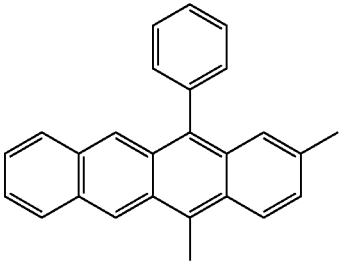 | 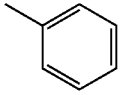 |
| (2)-52 | 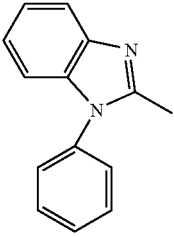 | 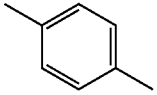 | 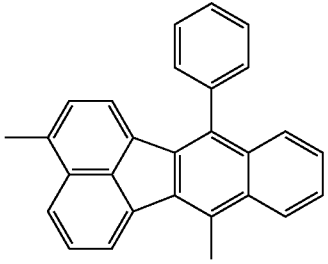 | 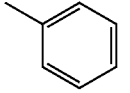 |
| (2)-53 | 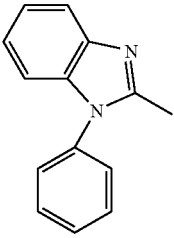 | 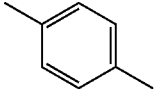 | 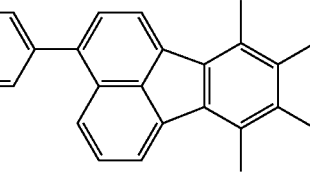 | 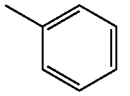 |

TABLE 9
| Structural formula No. | HAr | HAr—L—Ar¹—Ar² | | |
|---|---|---|---|---|
| | | L | Ar¹ | Ar² |
| (2)-54 | 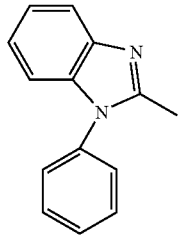 | 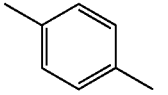 | 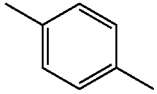 | 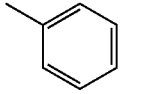 |
| (2)-55 | 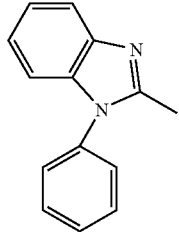 | 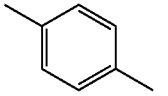 | 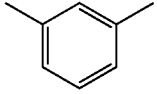 | 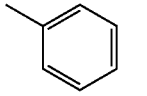 |
| (2)-56 | 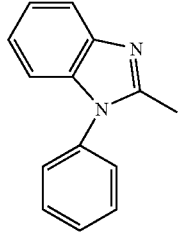 | 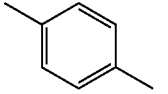 | 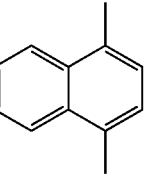 | 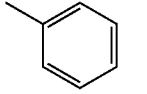 |
| (2)-57 | 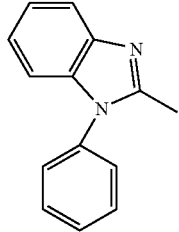 | 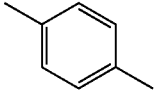 | 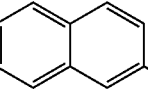 | 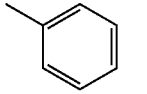 |
| (2)-58 | 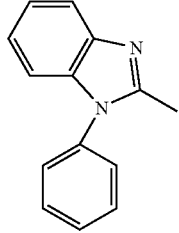 | 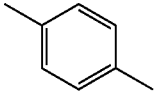 | 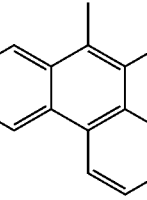 | 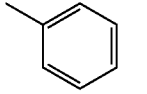 |
| (2)-59 | 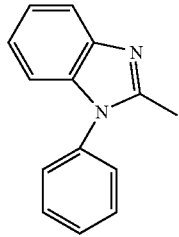 | 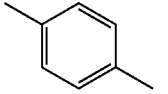 | 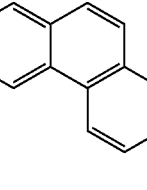 | 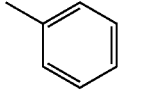 |

TABLE 9-continued
| Structural formula No. | HAr | L | Ar¹ | Ar² |
|---|---|---|---|---|
| (2)-60 | 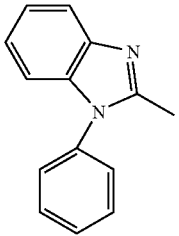 | 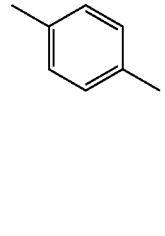 | 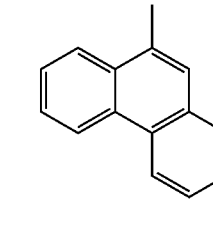 | —H |
| (2)-61 |  | 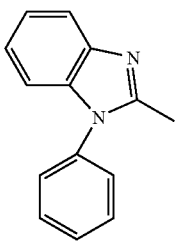 | 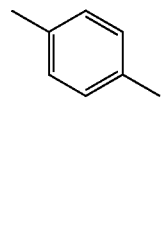 | 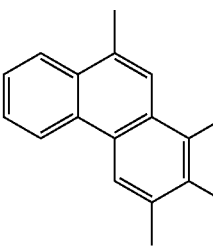 |
| (2)-62 | 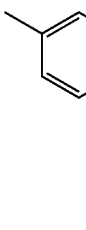 | 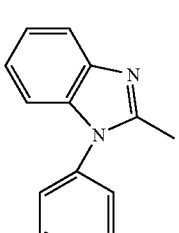 | 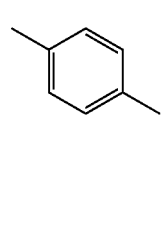 | 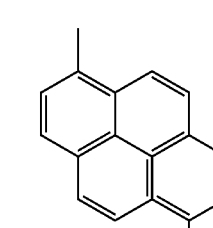 |
TABLE 10
| Structural formula No. | HAr | L | Ar¹ | Ar² |
|---|---|---|---|---|
| (2)-63 | 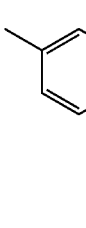 | 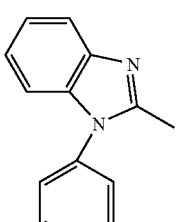 | 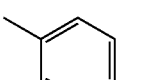 | 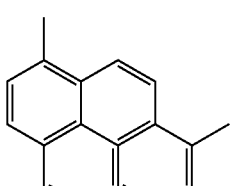 |
| (2)-64 | 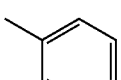 | 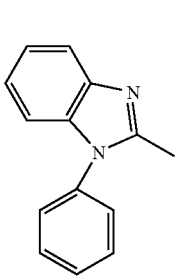 | 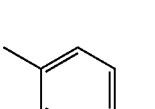 | —H |

TABLE 10-continued
| Structural formula No. | HAr | L | Ar¹ | Ar² |
|---|---|---|---|---|
| (2)-65 | | | | |
| (2)-66 | | | | |
(2)-67
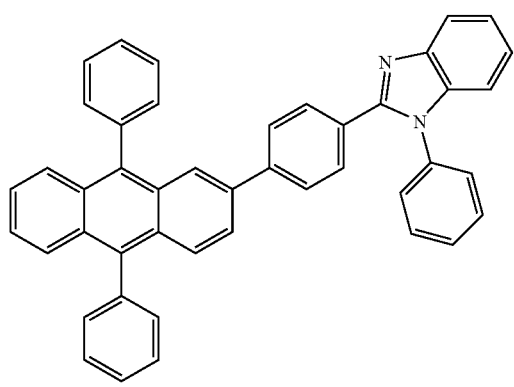
(2)-68
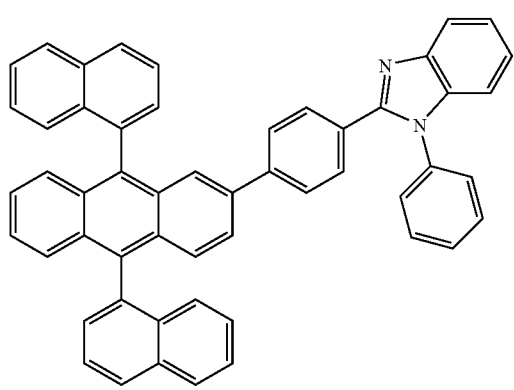

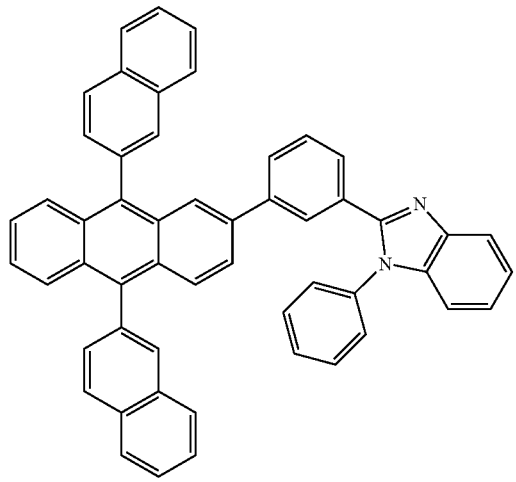
(2)-69
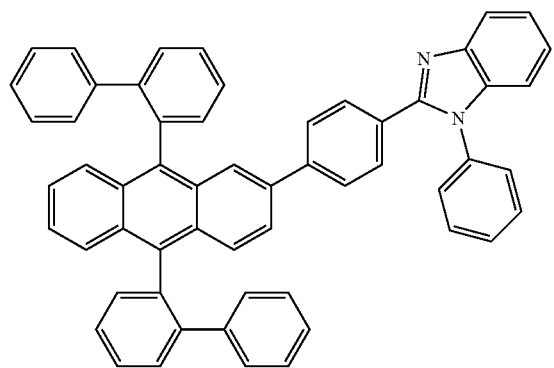
(2)-70
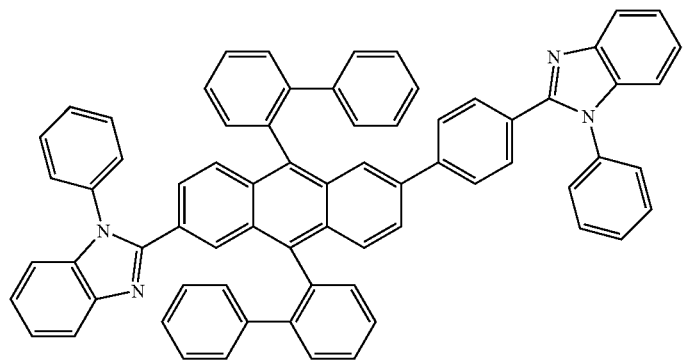
(2)-71

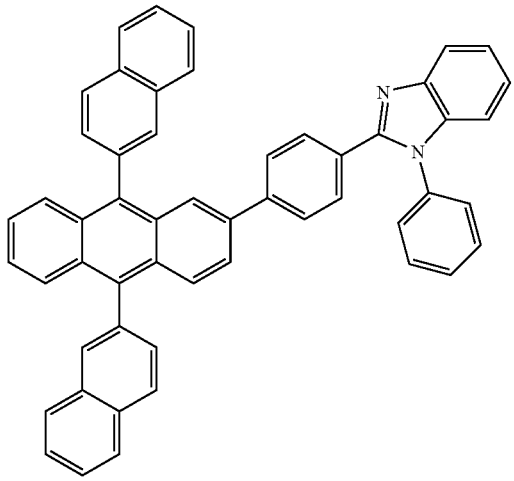
(2)-72
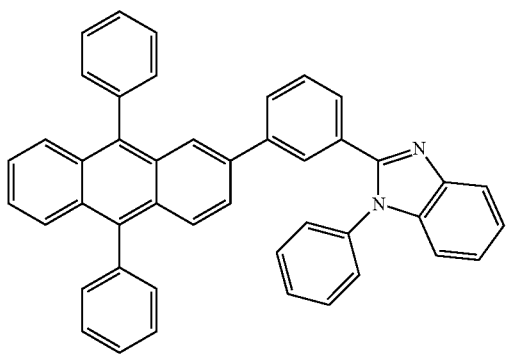
(2)-73
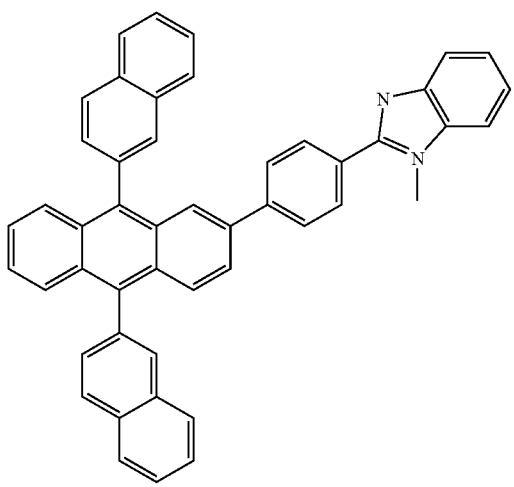
(2)-74

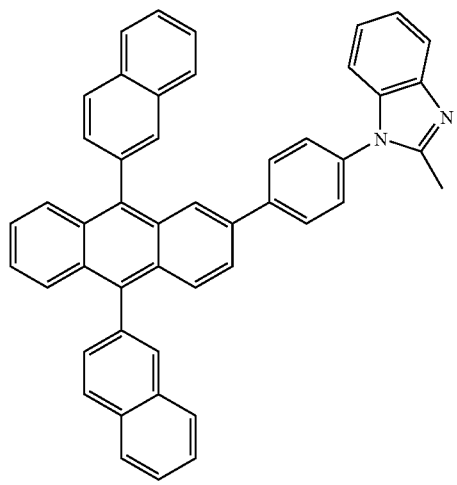
(2)-75
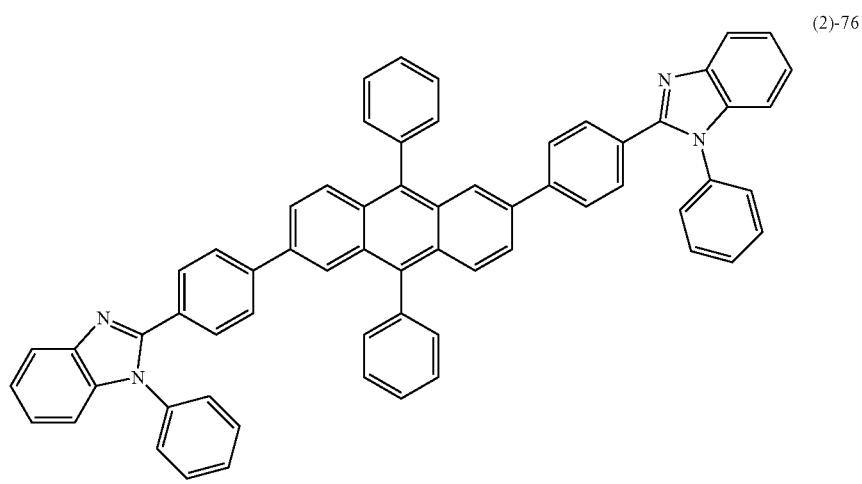
(2)-76
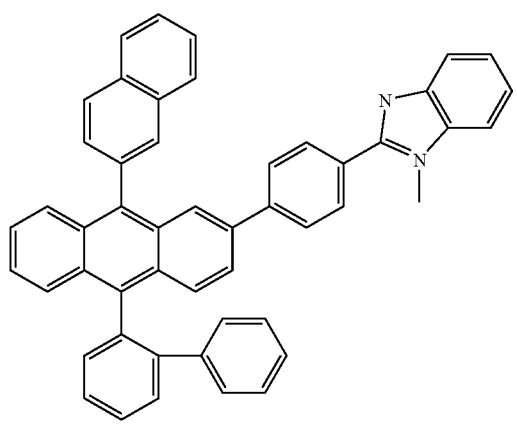
(2)-77

-continued
(2)-78
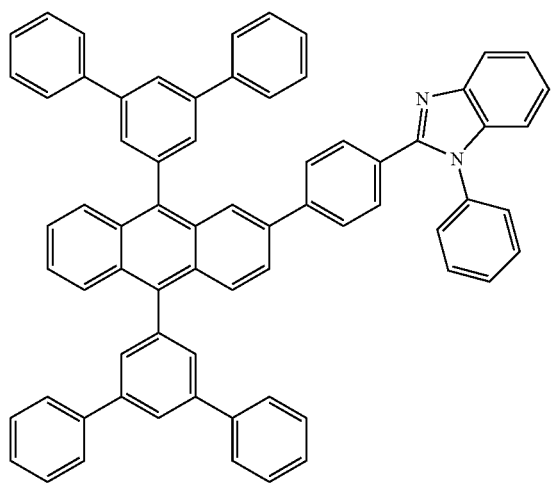
(2)-79
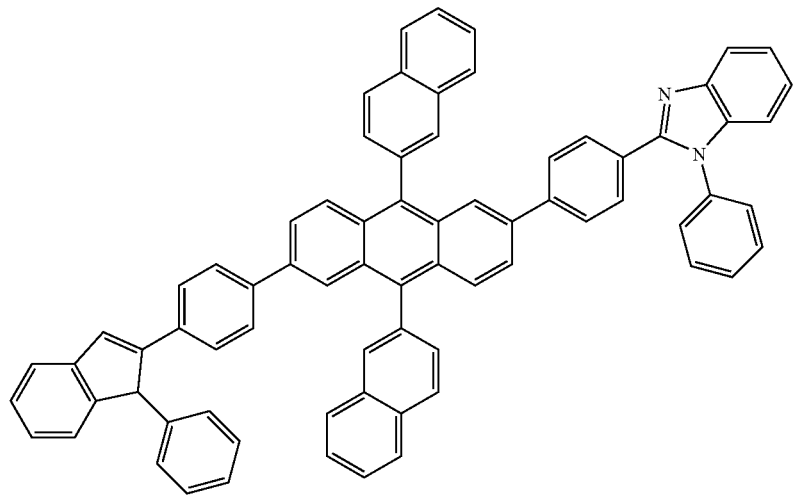
Specific examples of the benzimidazole derivative represented by general formula (3) include compounds represented by structural formulae (3)-1 to (3)-58 below. Note that, in Tables 11 to 17, HAr represents [benzimidazole structure+ R, $R^2$] in general formula (3).
TABLE 11
| Structural formula No. | HAr | L | Ar³ | |
|---|---|---|---|---|
| | | | Ar¹ | Ar² |
| (3)-1 | | | | |

TABLE 11-continued
| Structural formula No. | HAr | L | Ar³ | |
|---|---|---|---|---|
| | | | Ar¹ | Ar² |
| (3)-2 | 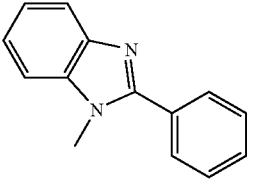 | 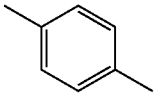 | 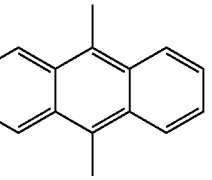 | 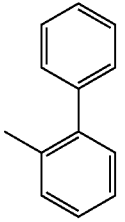 |
| (3)-3 | 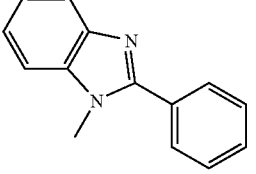 | 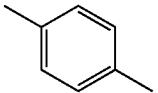 | 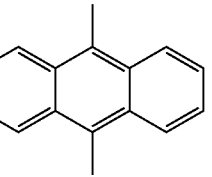 | 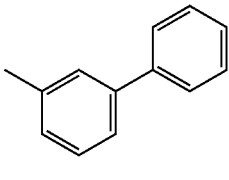 |
| (3)-4 | 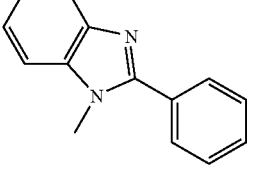 | 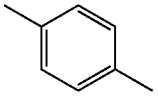 | 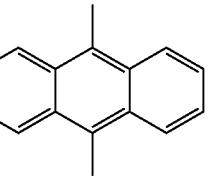 | 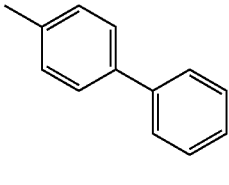 |
| (3)-5 | 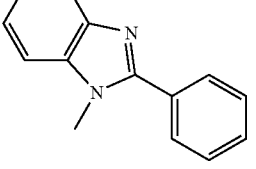 | 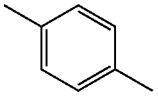 | 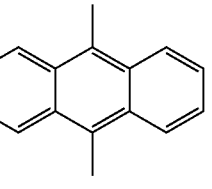 | 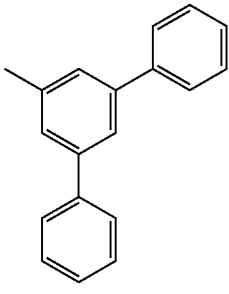 |
| (3)-6 | 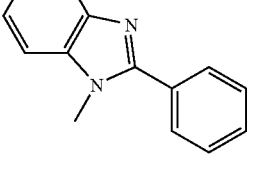 | 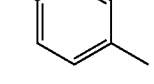 | 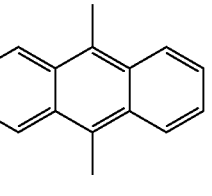 | 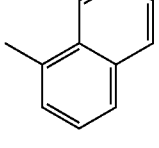 |
| (3)-7 | 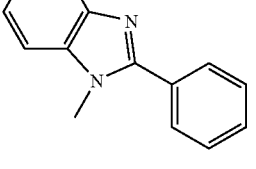 | 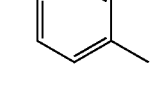 | 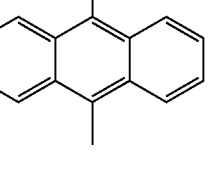 | 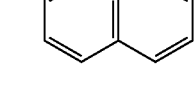 |
| (3)-8 | 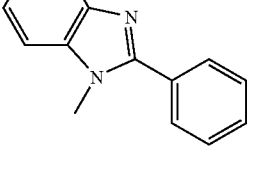 | 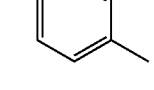 | 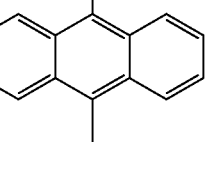 | 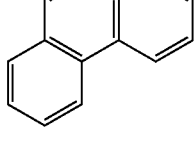 |

TABLE 11-continued
| Structural formula No. | HAr | L | Ar³ Ar¹ | Ar² |
|---|---|---|---|---|
| (3)-9 | 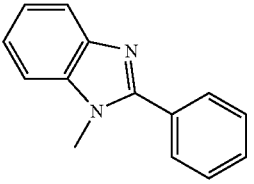 | 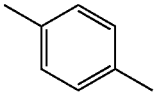 | 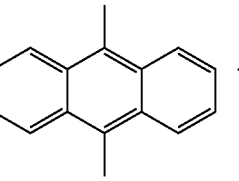 | 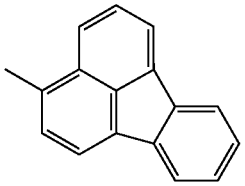 |
TABLE 12
| Structural formula No. | HAr | L | Ar³ Ar¹ | Ar² |
|---|---|---|---|---|
| (3)-10 | 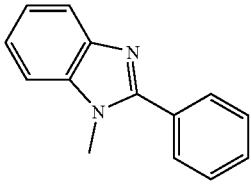 | 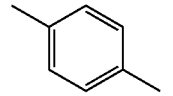 | 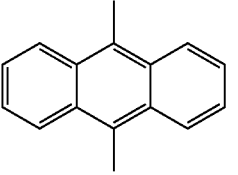 | 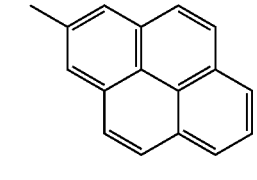 |
| (3)-11 | 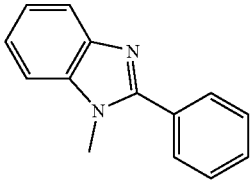 | 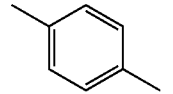 | 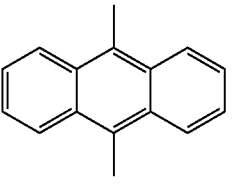 | 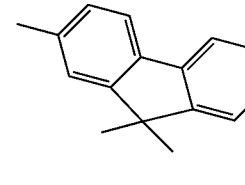 |
| (3)-12 | 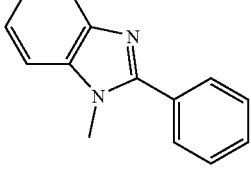 | 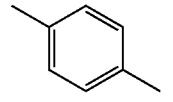 | 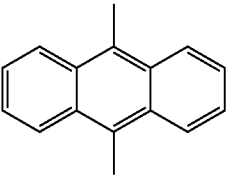 | 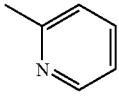 |
| (3)-13 | 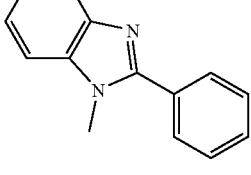 | 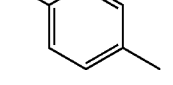 | 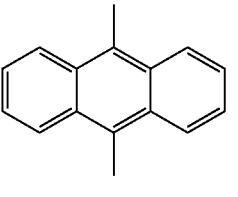 | 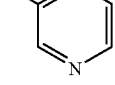 |
| (3)-14 | 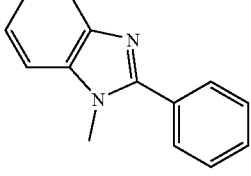 | 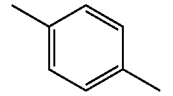 | 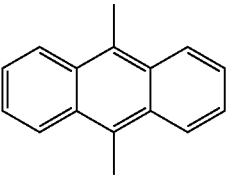 | 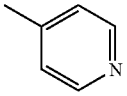 |

TABLE 12-continued
| Structural formula No. | HAr | L | Ar¹ (Ar³) | Ar² (Ar³) |
|---|---|---|---|---|
| (3)-15 | 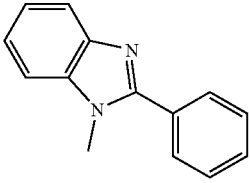 | 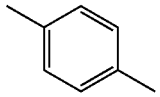 | 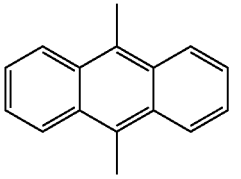 | 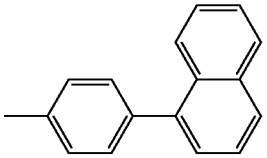 |
| (3)-16 | 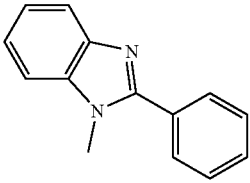 | 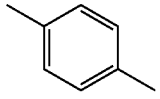 | 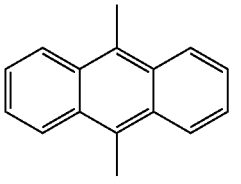 | 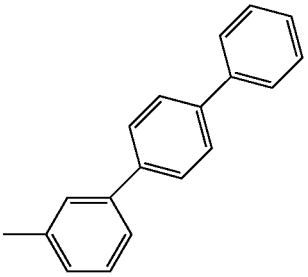 |
TABLE 13
| Structural formula No. | HAr | L | Ar¹ (Ar³) | Ar² (Ar³) |
|---|---|---|---|---|
| (3)-17 | 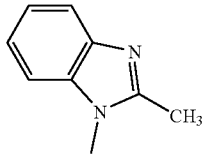 | 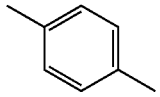 | 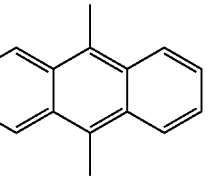 | 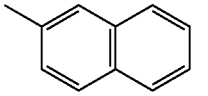 |
| (3)-18 | 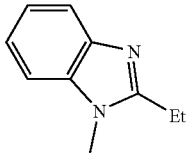 | 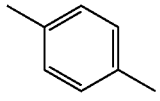 | 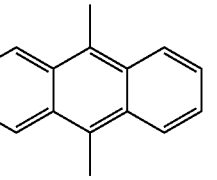 | 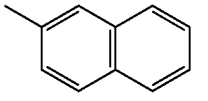 |
| (3)-19 | 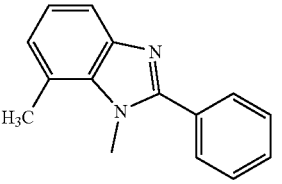 | 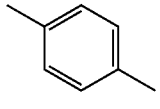 | 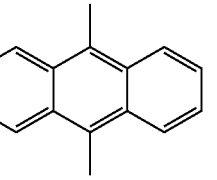 | 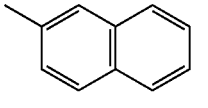 |
| (3)-20 | 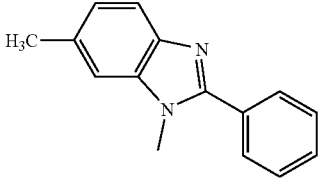 | 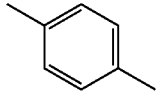 | 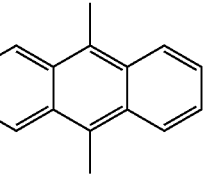 | 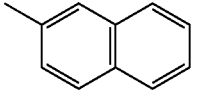 |

TABLE 13-continued
| Structural formula No. | HAr | L | Ar¹ | Ar² |
|---|---|---|---|---|
| (3)-21 | 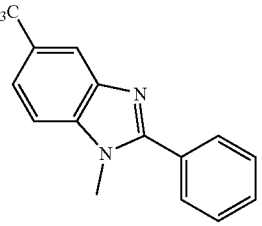 | 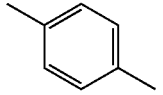 | 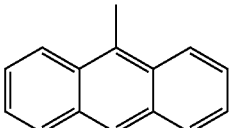 | 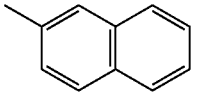 |
| (3)-22 | 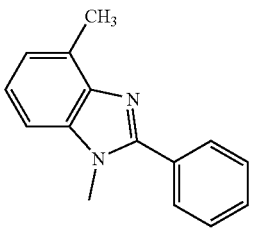 | 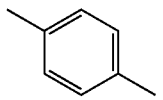 | 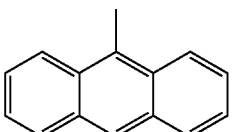 | 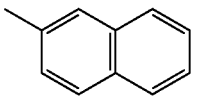 |
| (3)-23 | 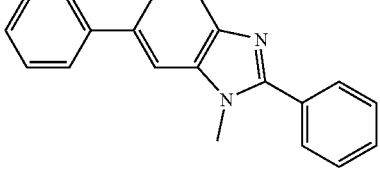 | 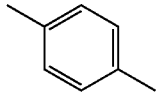 | 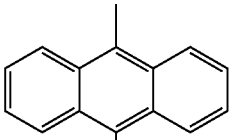 | 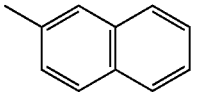 |
| (3)-24 | 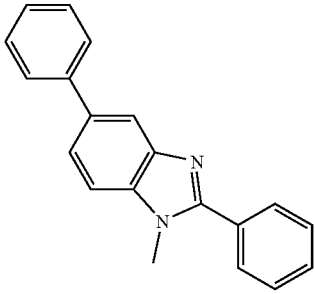 | 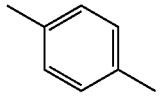 | 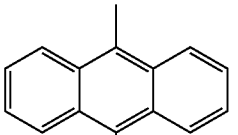 | 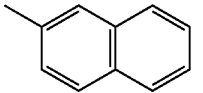 |
| (3)-25 | 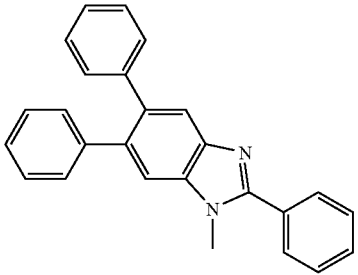 | 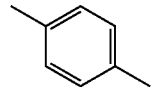 | 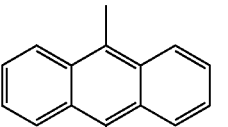 | 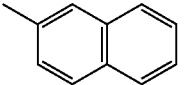 |
| (3)-26 | 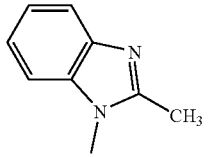 | 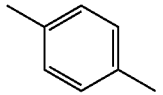 | 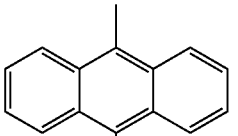 | 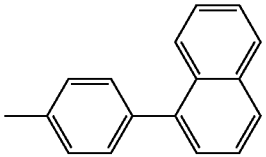 |

TABLE 13-continued

| Structural formula No. | HAr—L—Ar³ | | Ar³ | |
|---|---|---|---|---|
| | HAr | L | Ar¹ | Ar² |
| (3)-27 | 1-methyl-2-methyl-benzimidazole | 1,4-phenylene | 9,10-anthracenyl | 2'-methyl-biphenyl-4-yl |
| (3)-28 | 1-methyl-2-methyl-benzimidazole | 1,4-phenylene | 9,10-anthracenyl | 4'-methylbiphenyl-4-yl |

TABLE 14

| Structural formula No. | HAr—L—Ar³ | | Ar³ | |
|---|---|---|---|---|
| | HAr | L | Ar¹ | Ar² |
| (3)-29 | 1-methyl-2-(pyridin-2-yl)-benzimidazole | 1,4-phenylene | 9,10-anthracenyl | 6-methylnaphthalen-2-yl |
| (3)-30 | 1-methyl-2-(pyridin-3-yl)-benzimidazole | 1,4-phenylene | 9,10-anthracenyl | 6-methylnaphthalen-2-yl |
| (3)-31 | 1-methyl-2-(pyridin-4-yl)-benzimidazole | 1,4-phenylene | 9,10-anthracenyl | 6-methylnaphthalen-2-yl |
| (3)-32 | 1-methyl-2-(quinolin-8-yl)-benzimidazole | 1,4-phenylene | 9,10-anthracenyl | 6-methylnaphthalen-2-yl |

TABLE 14-continued

| Structural formula No. | HAr—L—Ar³ | | Ar³ | |
|---|---|---|---|---|
| | HAr | L | Ar¹ | Ar² |
| (3)-33 | 1-methyl-2-(quinolin-2-yl)benzimidazole | 1,4-phenylene | 9,10-dimethylanthracenyl | 2-methylnaphthyl |
| (3)-34 | 1-methyl-2-(quinolin-3-yl)benzimidazole | 1,4-phenylene | 9,10-dimethylanthracenyl | 2-methylnaphthyl |

TABLE 15

| Structural formula No. | HAr—L—Ar³ | | Ar³ | |
|---|---|---|---|---|
| | HAr | L | Ar¹ | Ar² |
| (3)-35 | 1-methyl-2-phenylbenzimidazole | — | 9,10-dimethylanthracenyl | 2-methylnaphthyl |
| (3)-36 | 1-methyl-2-phenylbenzimidazole | 1,3-phenylene | 9,10-dimethylanthracenyl | 2-methylnaphthyl |
| (3)-37 | 1-methyl-2-phenylbenzimidazole | 1,2-phenylene | 9,10-dimethylanthracenyl | 2-methylnaphthyl |
| (3)-38 | 1-methyl-2-phenylbenzimidazole | 2,5-pyridinediyl | 9,10-dimethylanthracenyl | 2-methylnaphthyl |

TABLE 15-continued
| Structural formula No. | HAr | L | Ar¹ | Ar² |
|---|---|---|---|---|
| (3)-39 | 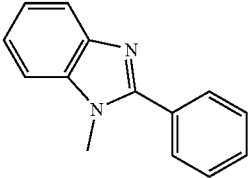 | 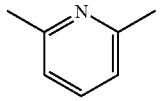 | 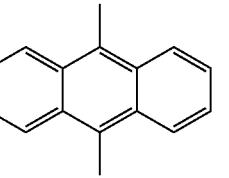 | 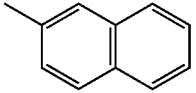 |
| (3)-40 | 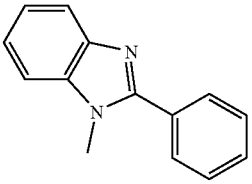 | 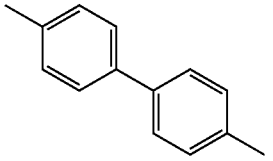 | 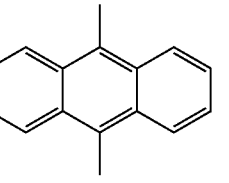 | 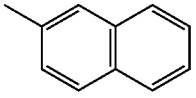 |
| (3)-41 | 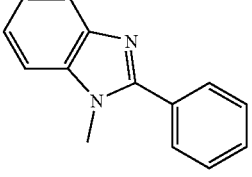 | 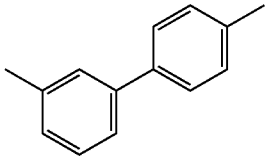 | 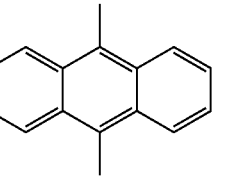 | 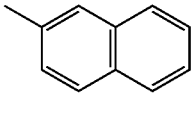 |
| (3)-42 | 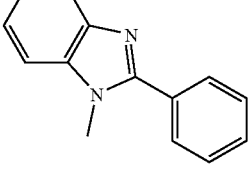 | 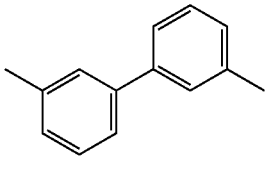 | 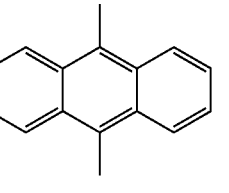 | 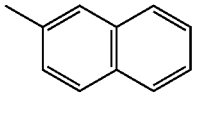 |
| (3)-43 | 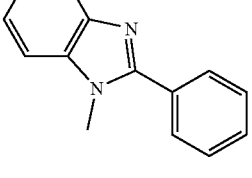 | 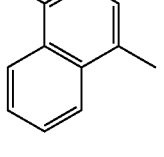 | 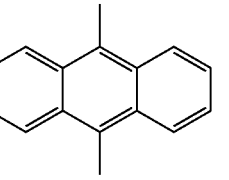 | 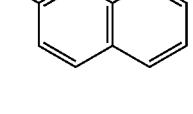 |
| (3)-44 | 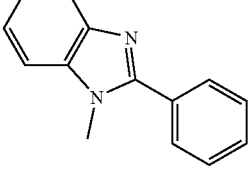 | 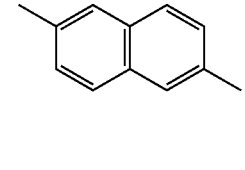 | 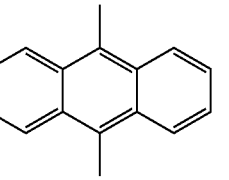 | 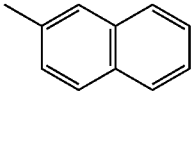 |
| (3)-45 | 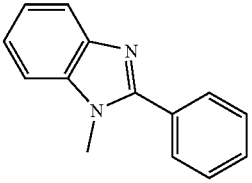 | 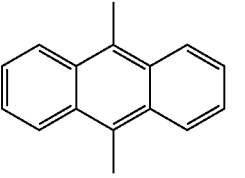 | 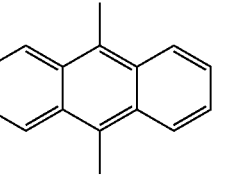 | 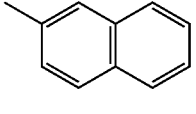 |

TABLE 16

| Structural formula No. | HAr | L | Ar³ Ar¹ | Ar² |
|---|---|---|---|---|
| (3)-46 | 1-methyl-2-phenylbenzimidazole | 1,4-phenylene | 9,10-dimethyl-2-methylanthracene | 2-naphthyl |
| (3)-47 | 1-methyl-2-phenylbenzimidazole | 1,4-phenylene | 9,10-dimethyl-2-tert-butylanthracene | 2-naphthyl |
| (3)-48 | 1-methyl-2-phenylbenzimidazole | 1,4-phenylene | 9,10-dimethyl-2-phenylanthracene | 2-naphthyl |
| (3)-49 | 1-methyl-2-phenylbenzimidazole | 1,4-phenylene | 9,10-dimethyl-2,6-dimethylanthracene | 2-naphthyl |
| (3)-50 | 1-methyl-2-phenylbenzimidazole | 1,4-phenylene | 9,10-dimethyl-2,6-di-tert-butylanthracene | 2-naphthyl |
| (3)-51 | 1-methyl-2-phenylbenzimidazole | 1,4-phenylene | 9,10-dimethyl-2,6-diphenylanthracene | 2-naphthyl |

TABLE 17

| Structural formula No. | HAr | L | Ar³ Ar¹ | Ar² |
|---|---|---|---|---|
| (3)-52 | | | | |
| (3)-53 | | | | |
| (3)-54 | | | | |
| (3)-55 | | | | |
| (3)-56 | | | | |

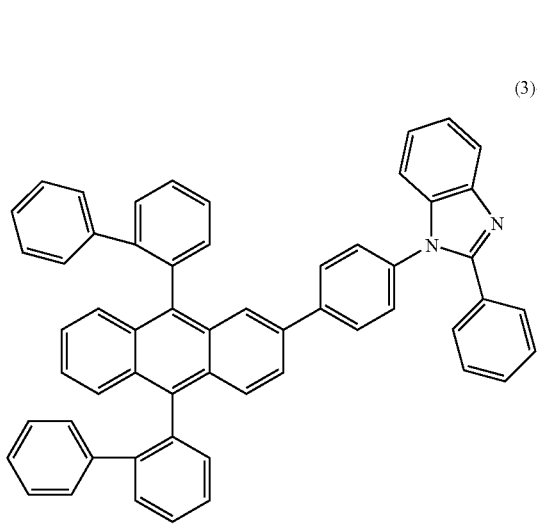
(3)-57
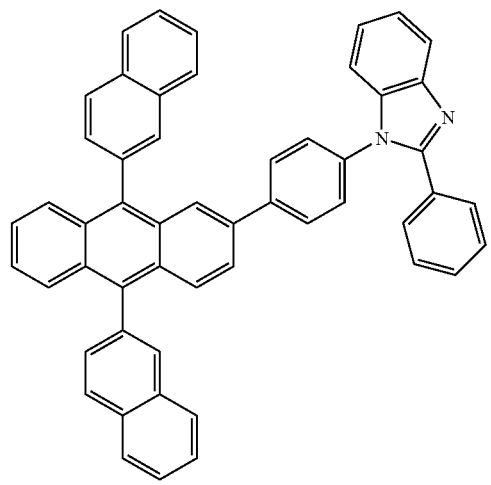
(3)-58
Specific examples of the benzimidazole derivative represented by general formula (4) include compounds represented by structural formulae (4)-1 to (4)-34 below. Note that, in Tables 18 to 21, HAr represents [benzimidazole structure+ $R^2$, $R^3$] in general formula (4).
TABLE 18
| Structural formula No. | HAr—L—Ar³ |||| 
| | HAr | L | Ar³ ||
| | | | Ar¹ | Ar² |
|---|---|---|---|---|
| (4)-1 | | | | |
| (4)-2 | | | | |
| (4)-3 | | | | |

TABLE 18-continued

TABLE 19

| Structural formula No. | HAr | L | Ar³ Ar¹ | Ar² |
|---|---|---|---|---|
| (4)-9 | | | | |
| (4)-10 | | | | |
| (4)-11 | | | | |
| (4)-12 | | | | |
| (4)-13 | | | | |
| (4)-14 | | | | |

TABLE 19-continued

| Structural formula No. | HAr | L | Ar³ Ar¹ | Ar² |
|---|---|---|---|---|
| (4)-15 | 5-methyl-2-methyl-1-phenyl-benzimidazole | – | 9,10-disubstituted anthracene | 2-naphthyl |
| (4)-16 | 5-methyl-1-methyl-2-phenyl-benzimidazole | – | 9,10-disubstituted anthracene | 2-naphthyl |
| (4)-17 | 1-methyl-2-phenyl-benzimidazole | – | 9,10-disubstituted anthracene | 2-naphthyl |
| (4)-18 | 1-methyl-2-methyl-benzimidazole | – | 9,10-disubstituted anthracene | 2-naphthyl |

TABLE 20

| Structural formula No. | HAr | L | Ar³ Ar¹ | Ar² |
|---|---|---|---|---|
| (4)-19 | 6-methyl-1-phenyl-2-(pyridin-2-yl)-benzimidazole | – | 9,10-disubstituted anthracene | 2-naphthyl |

TABLE 20-continued

| Structural formula No. | HAr | L | Ar¹ | Ar² |
|---|---|---|---|---|
| (4)-20 | | | | |
| (4)-21 | | | | |
| (4)-22 | | | | |
| (4)-23 | | | | |
| (4)-24 | | | | |

TABLE 20-continued

| Structural formula No. | HAr | L | Ar³ Ar¹ | Ar² |
|---|---|---|---|---|
| (4)-25 | 5,6-dimethyl-1,2-dimethyl-benzimidazole | — | 9,10-disubstituted anthracene | 2-naphthyl |
| (4)-26 | 5-methyl-1,2-dimethyl-benzimidazole | — | 9,10-disubstituted anthracene | 2-naphthyl |

TABLE 21

| Structural formula No. | HAr | L | Ar³ Ar¹ | Ar² |
|---|---|---|---|---|
| (4)-27 | 6-methyl-2-phenyl-1-(2-pyridyl)-benzimidazole | — | 9,10-disubstituted anthracene | 2-naphthyl |
| (4)-28 | 5-methyl-2-phenyl-1-(2-pyridyl)-benzimidazole | — | 9,10-disubstituted anthracene | 2-naphthyl |
| (4)-29 | 5-methyl-2-phenyl-1-(3-pyridyl)-benzimidazole | — | 9,10-disubstituted anthracene | 2-naphthyl |

TABLE 21-continued

| Structural formula No. | HAr | L | HAr—L—Ar³ Ar¹ | Ar³ Ar² |
|---|---|---|---|---|
| (4)-30 | | | | |
| (4)-31 | | | | |
| (4)-32 | | | | |
| (4)-33 | | | | |
| (4)-34 | | | | |

The second electron transport layer 14d-2 containing the benzimidazole derivative described above may be a mixed layer containing another compound. In such a case, the other compound may be at least one selected from alkali metals, alkaline earth metals, rare earth metals, oxides thereof, composite oxides thereof, fluorides thereof, and carbonates thereof.

The benzimidazole derivative described above is preferably contained in the second electron transport layer 14d-2 disposed on the cathode 15 side. In this case, by forming a second electron transport layer 14d-2 having a stacked structure including two or more types of the above materials, excellent electron supply stability is exhibited, and both high-efficiency light emission and stable light emission can be realized.

Light-Emitting Layer

The light-emitting layer 14c is a layer that provides a site of recombination of electrons and holes and that has a function to induce light emission, and contains at least a material having a light-emitting function. In addition, the light-emitting layer 14c is preferably composed of a material having an injection function and a transport function of electric charges. The injection function of electric charges refers to a function that enables holes to be injected from the anode 13 or the hole supply layers 14a and 14b while enabling electrons to be injected from the cathode 15 or the electron transport layers 14d-1 and 14d-2 during application of an electric field. The transport function refers to a function that causes the injected holes and electrons to move with the force of an electric field.

The light-emitting layer 14c may be constituted by incorporating a light-emitting material (dopant) in a host material.

Examples of the host material include styryl derivatives, anthracene derivatives, naphthacene derivatives, and aromatic amines. The styryl derivatives are particularly preferably at least one styryl derivative selected from distyryl derivatives, tristyryl derivatives, tetrastyryl derivatives and styrylamine derivatives.

The carrier balance of the device according to an embodiment of the present invention is particularly good when the light-emitting layer contains an anthracene derivative, and an asymmetric anthracene compound is preferred. The aromatic amine is preferably a compound having 2 to 4 nitrogen atoms substituted with an aromatic group.

Fluorescent materials are used as the light-emitting material. Examples of the fluorescent materials include laser dyes such as styrylbenzene dyes, oxazole dyes, perylene dyes, coumarine dyes, and acridine dyes; polyaromatic hydrocarbon materials such as anthracene derivatives, naphthacene derivatives, pentacene derivatives and chrysene derivatives; pyrromethene skeleton compounds and pyrromethene metal complexes; quinacridone derivatives; dicyanomethylene pyran derivatives (DCM, DCJTB); benzothiazole compounds; benzimidazole compounds; and metal-chelated oxynoid compounds. These fluorescent materials can be appropriately selected and used. The dope concentrations of these fluorescent materials are each preferably 0.5% or more and 15% or less in terms of the film thickness ratio.

The light-emitting material is not limited to a fluorescent material. Alternatively, the light-emitting material may be a phosphorescent material.

Hole Injection Layer 14a and Hole Transport Layer 14b

The hole injection layer 14a and the hole transport layer 14b constituting a hole supply layer are composed of a commonly used hole injection material and hole transport material. More preferably, an azatriphenylene derivative represented by general formula (5) below, an amine derivative represented by general formula (6) below, a diamine derivative represented by general formula (7) below, and a triarylamine multimer represented by general formula (8) above may be used. When the hole injection layer 14a and the hole transport layer 14b are formed with these compounds, the hole supply from the hole injection layer 14a and the hole transport layer 14b to the light-emitting layer 14c can be optimized to the electron supply through the electron transport layers 14d.

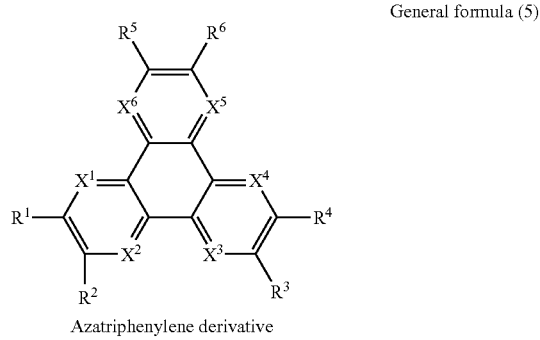

Azatriphenylene derivative

General formula (5)

Amine derivative

General formula (6)

Diamine derivative

General formula (7)

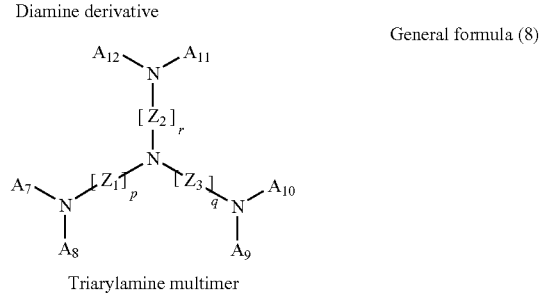

Triarylamine multimer

General formula (8)

The materials represented by general formulae (5) to (8) may be used in either the hole injection layer 14a or the hole transport layer 14b. However, the hole injection barrier from the anode 13 can be decreased by using, as the hole injection layer 14a, a compound having a composition having a high nitrogen (N) content. In the embodiment of the present invention, electron injection is enhanced. Accordingly, in order to achieve a good carrier balance, an azatriphenylene derivative [general formula (5)] having a high hole injection property is further preferably used at the interface with the anode 13.

In the azatriphenylene derivative represented by general formula (5), $R^1$ to $R^6$ in general formula (5) each independently represent a substituent selected from a hydrogen atom, halogen atoms, a hydroxyl group, an amino group, arylamino groups, substituted or unsubstituted carbonyl groups having 20 or less carbon atoms, substituted or unsubstituted carbonyl ester groups having 20 or less carbon atoms, substituted or unsubstituted alkyl groups having 20 or less carbon atoms, substituted or unsubstituted alkenyl groups having 20 or less carbon atoms, substituted or unsubstituted alkoxy groups having 20 or less carbon atoms, substituted or unsubstituted aryl groups having 30 or less carbon atoms, substituted or unsubstituted heterocyclic groups having 30 or less carbon atoms, a nitrile group, a cyano group, a nitro group, and silyl groups, and adjacent $R^m$s (m=1 to 6) may be bonded to each other through a ring structure. Furthermore, $X^1$ to $X^6$ in general formula (5) each independently represent a carbon (C) atom or a nitrogen (N) atom. In particular, when Xs are N atoms, these compounds have high nitrogen contents, and thus can be suitably used as the hole injection layer 14a.

A specific example of the azatriphenylene derivative is hexanitrile azatriphenylene represented by structural formula (5)-1 below.

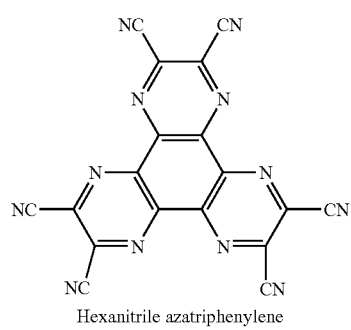

(5)-1

Hexanitrile azatriphenylene

In the amine derivative represented by general formula (6), $A_0$ to $A_2$ in general formula (6) each independently represent an aromatic hydrocarbon having 6 to 30 carbon atoms. Each of the aromatic hydrocarbons represented by $A_0$ to $A_2$ may be unsubstituted or may have a substituent. In this case, the substituent is selected from a hydrogen atom, halogen atoms, a hydroxyl group, an aldehyde group, a carbonyl group, a carbonyl ester group, alkyl groups, alkenyl groups, cyclic alkyl groups, alkoxy groups, aryl groups, an amino group, heterocyclic groups, a cyano group, a nitrile group, a nitro group, and silyl groups. The number of these substituents substituting the aromatic hydrocarbons represented by $A_0$ to $A_2$ is not particularly limited.

Specific examples of the amine derivative include compounds represented by structural formulae (6)-1 to (6)-9 below.

(6)-1

(6)-2

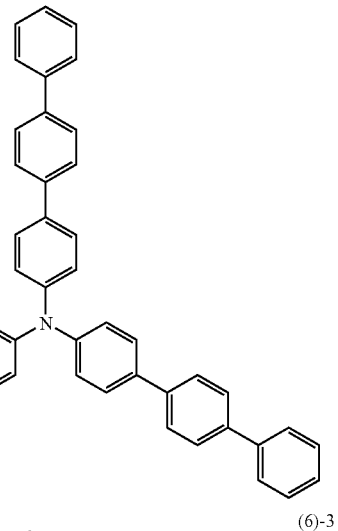

(6)-3

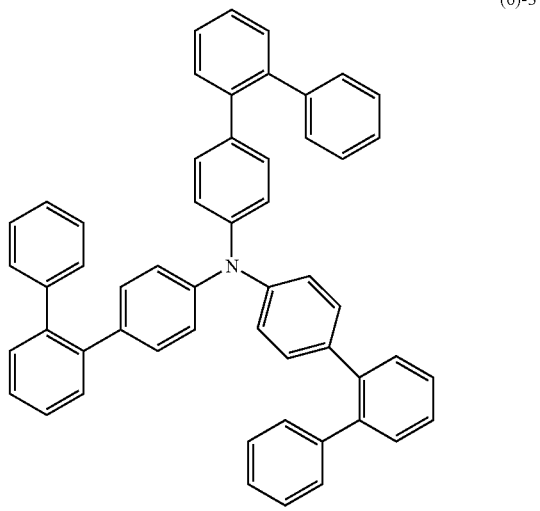

(6)-4

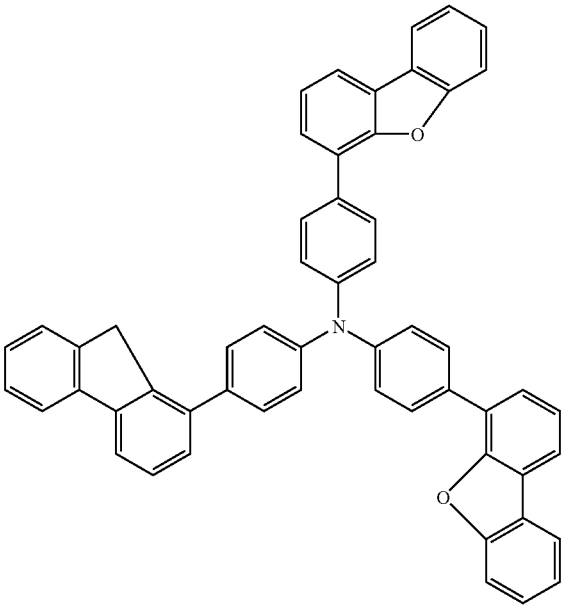

(6)-5

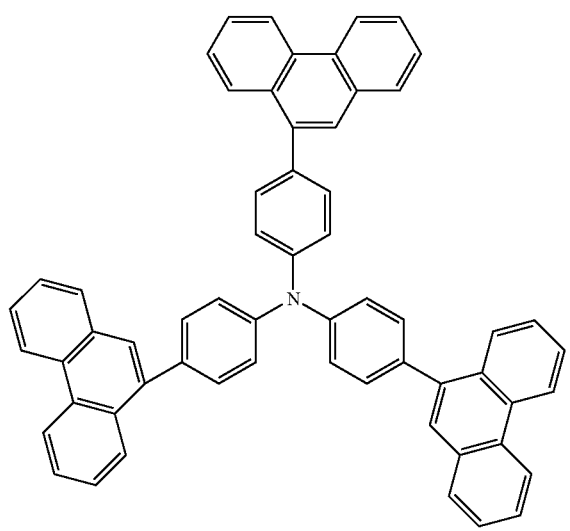

(6)-6

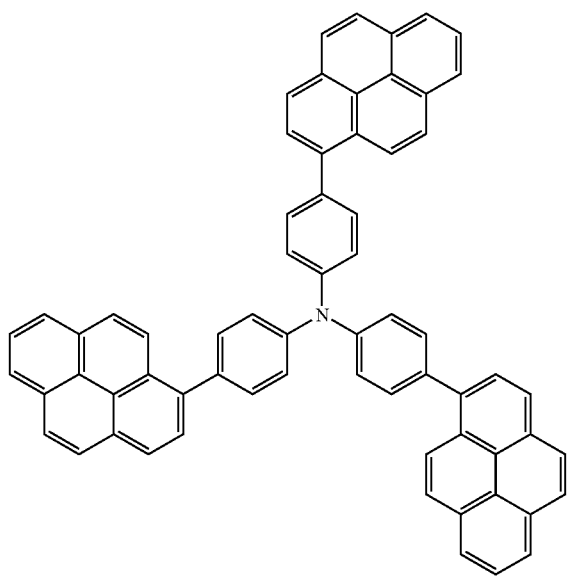

(6)-7

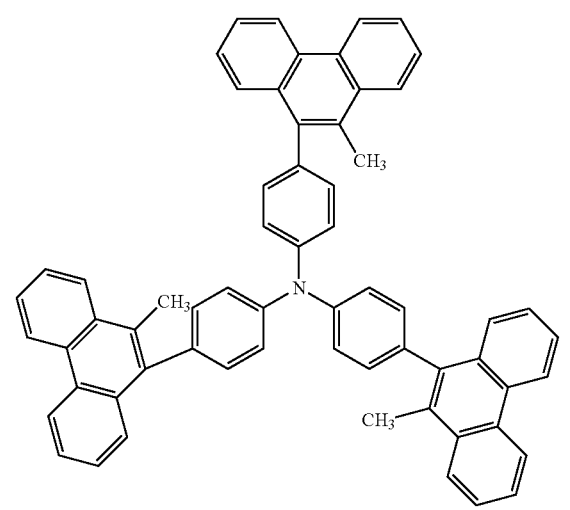

(6)-8

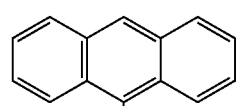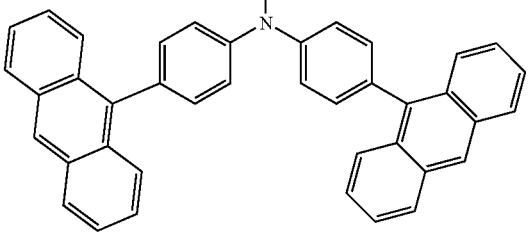

(6)-9

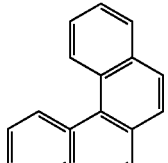

In the diamine derivative represented by general formula (7), $A_3$ to $A_6$ in general formula (7) each independently represent an aromatic hydrocarbon having 6 to 20 carbon atoms. Each of the aromatic hydrocarbons represented by $A_3$ to $A_6$ may be unsubstituted or may have a substituent. In this case, the substituent is selected from a hydrogen atom, halogen atoms, a hydroxyl group, an aldehyde group, a carbonyl group, a carbonyl ester group, alkyl groups, alkenyl groups, cyclic alkyl groups, alkoxy groups, aryl groups, an amino group, heterocyclic groups, a cyano group, a nitrile group, a nitro group, and silyl groups. The number of these substituents substituting the aromatic hydrocarbons represented by $A_3$ to $A_6$ is not particularly limited. Each pair of $A_3$ and $A_4$, and $A_5$ and $A_6$ may be bonded to each other through a linking group. In general formula (7), Y represents an aromatic hydrocarbon selected from benzene, naphthalene, anthracene, phenanthrene, naphthacene, fluoranthene, and perylene, and m represents an integer of 1 or more. Furthermore, Y may have a substituent at a site other than the sites each of which is bonded to nitrogen (N). This substituent is selected from a hydrogen atom, halogen atoms, a hydroxyl group, an aldehyde group, a carbonyl group, a carbonyl ester group, alkyl groups, alkenyl groups, cyclic alkyl groups, alkoxy groups, aryl groups, an amino group, heterocyclic groups, a cyano group, a nitrile group, a nitro group, and silyl groups.
Specific examples of the diamine derivative include compounds represented by structural formulae (7)-1 to (7)-84 below.
TABLE 22
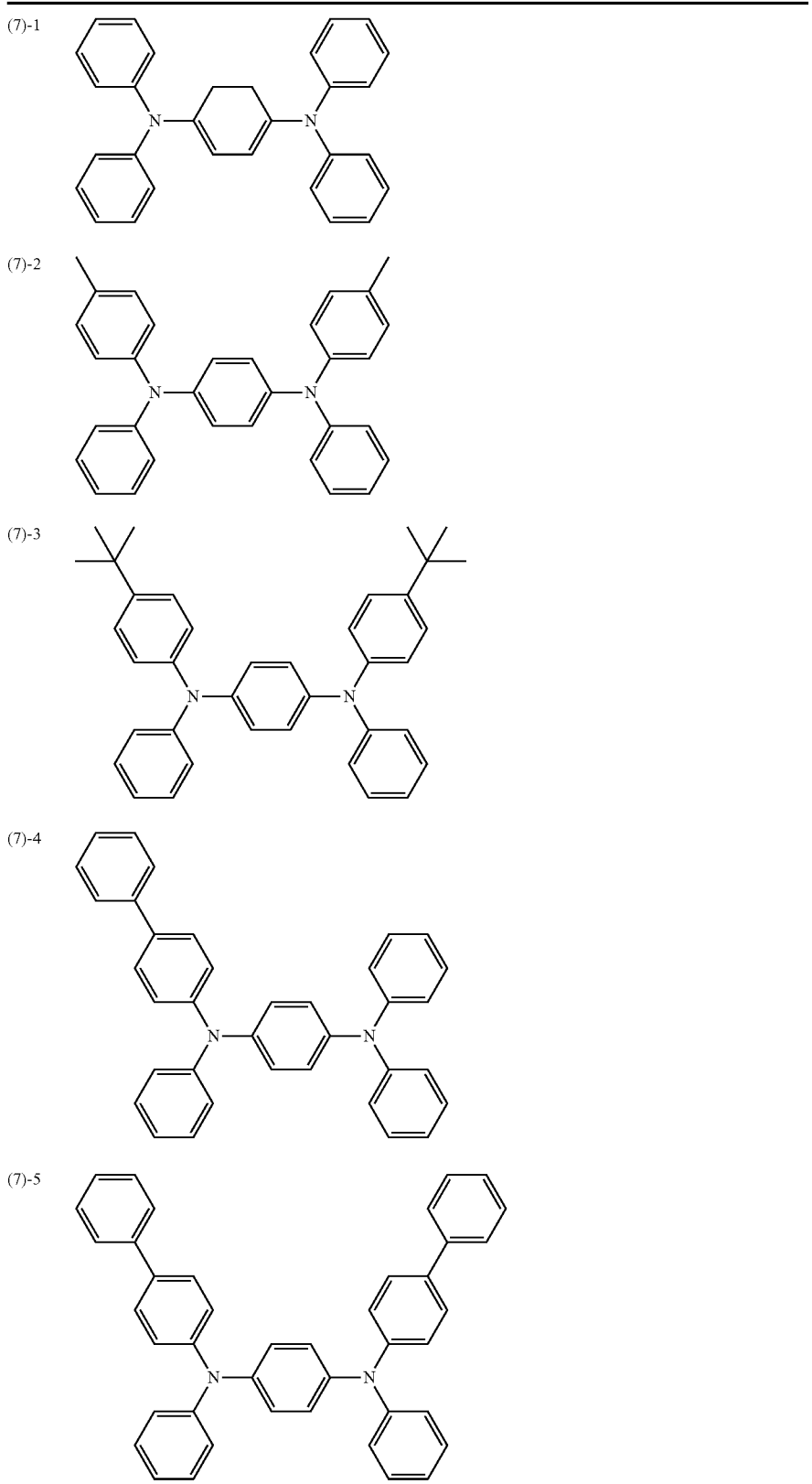

TABLE 22-continued
(7)-6
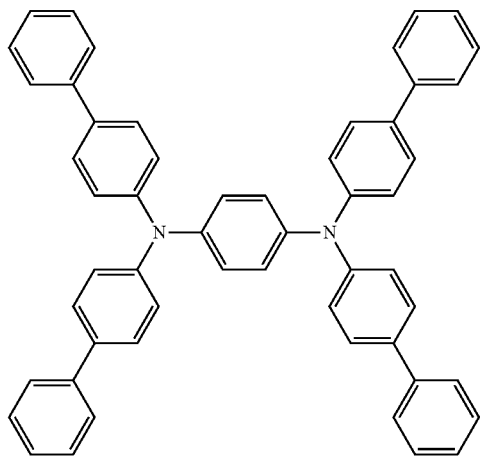 [SMILES: c1ccc(-c2ccc(N(c3ccc(-c4ccccc4)cc3)c3ccc(N(c4ccc(-c5ccccc5)cc4)c4ccc(-c5ccccc5)cc4)cc3)cc2)cc1]
(7)-7
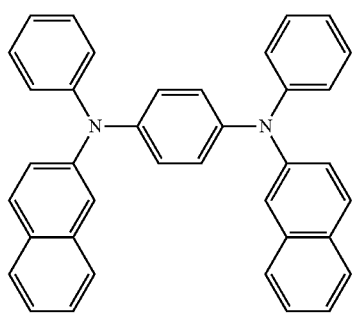 [SMILES: c1ccc(N(c2ccc(N(c3ccccc3)c3ccc4ccccc4c3)cc2)c2ccc3ccccc3c2)cc1]
(7)-8
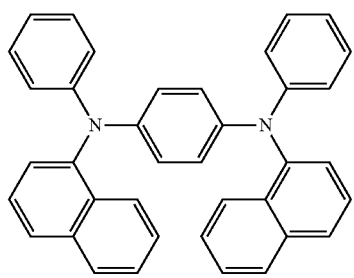 [SMILES: c1ccc(N(c2ccc(N(c3ccccc3)c3cccc4ccccc34)cc2)c2cccc3ccccc23)cc1]
(7)-9
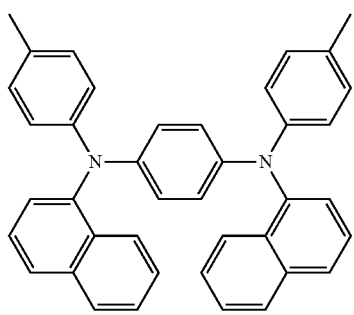 [SMILES: Cc1ccc(N(c2ccc(N(c3ccc(C)cc3)c3cccc4ccccc34)cc2)c2cccc3ccccc23)cc1]

TABLE 22-continued
(7)-10
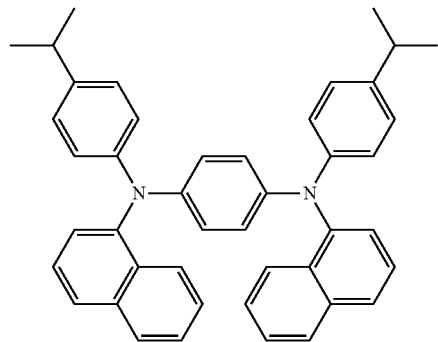 [SMILES: CC(C)c1ccc(N(c2ccc(N(c3ccc(C(C)C)cc3)c3cccc4ccccc34)cc2)c2cccc3ccccc23)cc1]
(7)-11
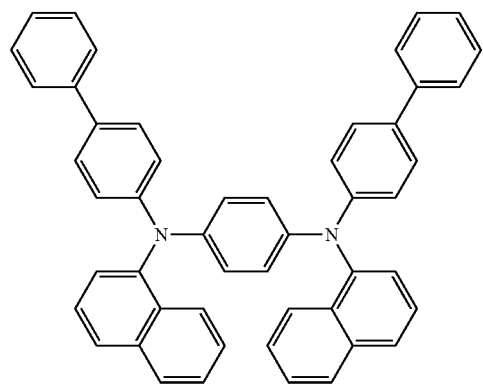 [SMILES: c1ccc(-c2ccc(N(c3ccc(N(c4ccc(-c5ccccc5)cc4)c4cccc5ccccc45)cc3)c3cccc4ccccc34)cc2)cc1]
(7)-12
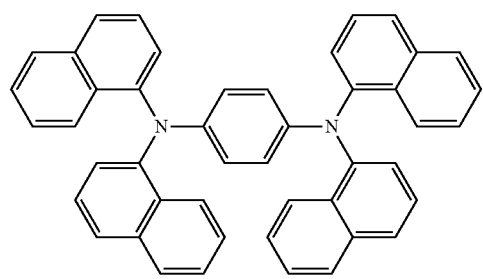 [SMILES: c1ccc2c(N(c3ccc(N(c4cccc5ccccc45)c4cccc5ccccc45)cc3)c3cccc4ccccc34)cccc2c1]
(7)-13
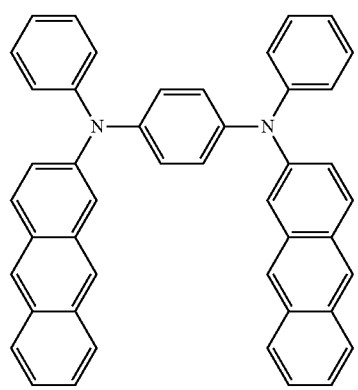 [SMILES: c1ccc(N(c2ccc(N(c3ccccc3)c3ccc4cc5ccccc5cc4c3)cc2)c2ccc3cc4ccccc4cc3c2)cc1]

TABLE 22-continued
(7)-14 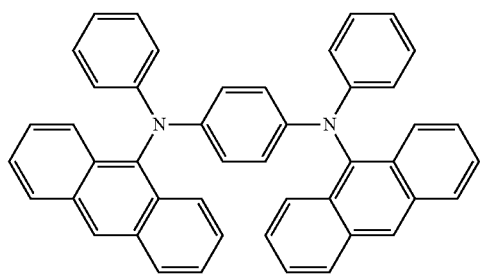 [SMILES: c1ccc(N(c2ccc(N(c3ccccc3)c3c4ccccc4cc4ccccc34)cc2)c2c3ccccc3cc3ccccc23)cc1]
(7)-15 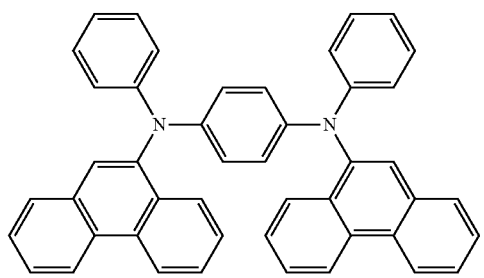 [SMILES: c1ccc(N(c2ccc(N(c3ccccc3)c3cc4ccccc4c4ccccc34)cc2)c2cc3ccccc3c3ccccc23)cc1]
(7)-16 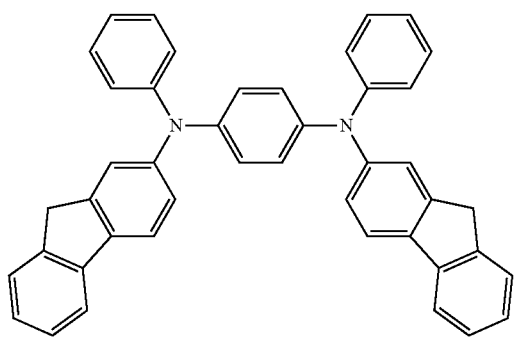 [SMILES: c1ccc(N(c2ccc(N(c3ccccc3)c3ccc4c(c3)Cc3ccccc3-4)cc2)c2ccc3c(c2)Cc2ccccc2-3)cc1]
(7)-17 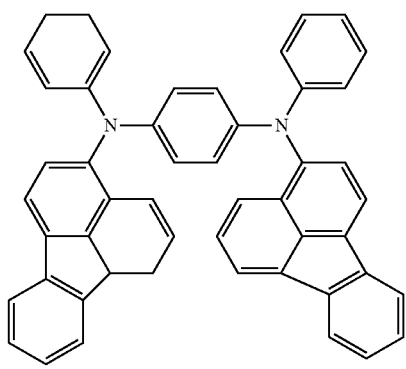 [SMILES: C1=CC(N(c2ccc(N(c3ccccc3)c3ccc4c5c(cccc35)-c3ccccc3-4)cc2)c2ccc3c4c2C=CCC4c2ccccc2-3)=CCC1]
(7)-18 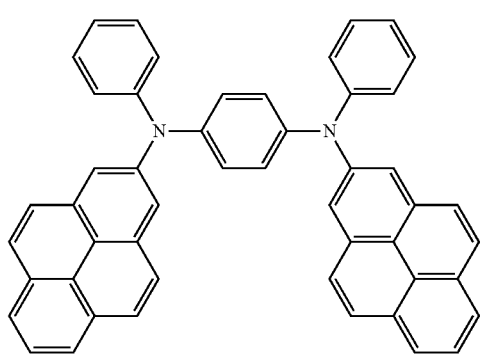 [SMILES: c1ccc(N(c2ccc(N(c3ccccc3)c3cc4ccc5cccc6ccc(c3)c4c56)cc2)c2cc3ccc4cccc5ccc(c2)c3c45)cc1]

TABLE 22-continued
(7)-19 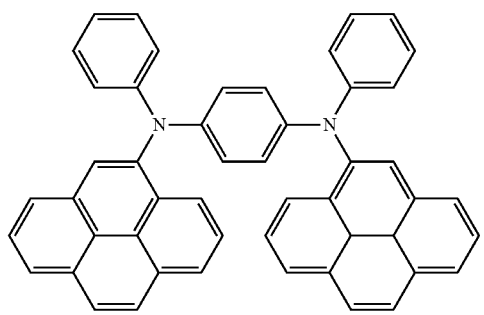 [SMILES: C1=CC2=CC(N(c3ccccc3)c3ccc(N(c4ccccc4)c4cc5cccc6ccc7cccc4c7c65)cc3)=C3C=CC=C4C=CC(=C1)C2C43]
(7)-20 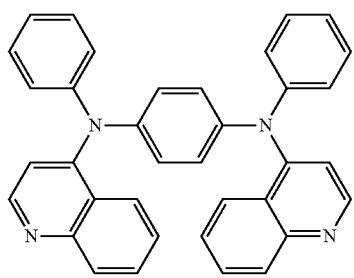 [SMILES: c1ccc(N(c2ccc(N(c3ccccc3)c3ccnc4ccccc34)cc2)c2ccnc3ccccc23)cc1]
(7)-21 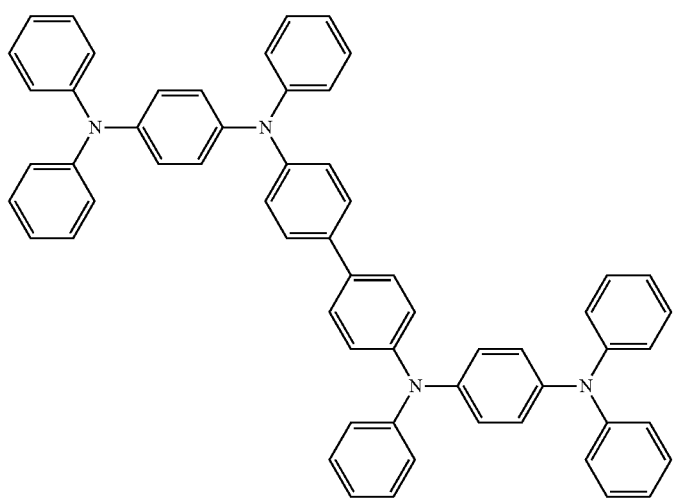 [SMILES: c1ccc(N(c2ccccc2)c2ccc(N(c3ccccc3)c3ccc(-c4ccc(N(c5ccccc5)c5ccc(N(c6ccccc6)c6ccccc6)cc5)cc4)cc3)cc2)cc1]
(7)-22 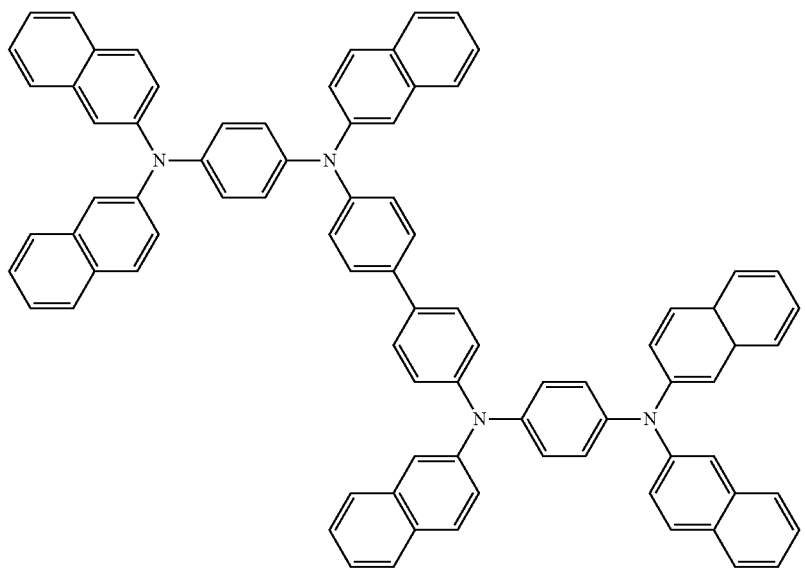 [SMILES: C1=CC2C=CC(N(c3ccc(N(c4ccc(-c5ccc(N(c6ccc(N(c7ccc8ccccc8c7)c7ccc8ccccc8c7)cc6)c6ccc7ccccc7c6)cc5)cc4)c4ccc5ccccc5c4)cc3)c3ccc4ccccc4c3)=CC2C=C1]

TABLE 22-continued
(7)-23
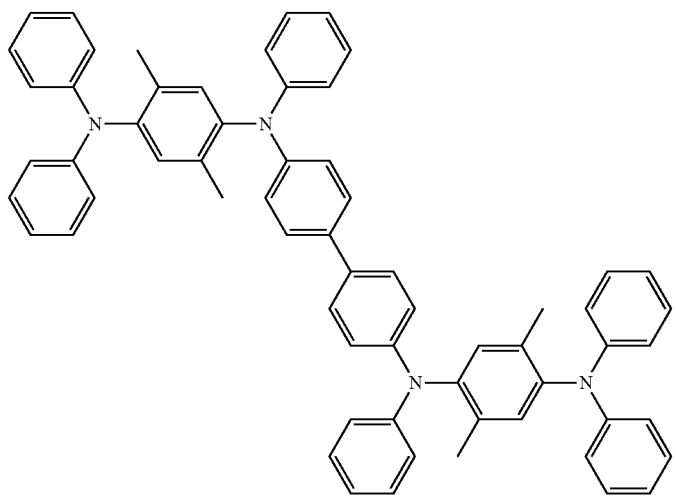 [SMILES: Cc1cc(N(c2ccccc2)c2ccc(-c3ccc(N(c4ccccc4)c4cc(C)c(N(c5ccccc5)c5ccccc5)cc4C)cc3)cc2)c(C)cc1N(c1ccccc1)c1ccccc1]
(7)-24
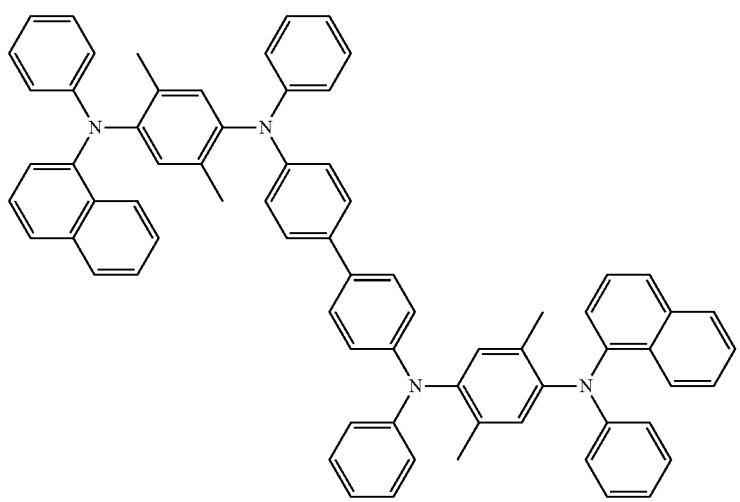 [SMILES: Cc1cc(N(c2ccccc2)c2cccc3ccccc23)c(C)cc1N(c1ccccc1)c1ccc(-c2ccc(N(c3ccccc3)c3cc(C)c(N(c4ccccc4)c4cccc5ccccc45)cc3C)cc2)cc1]
TABLE 23
(7)-25
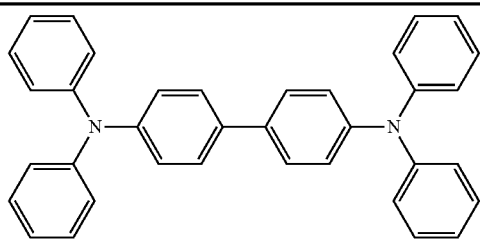
(7)-26
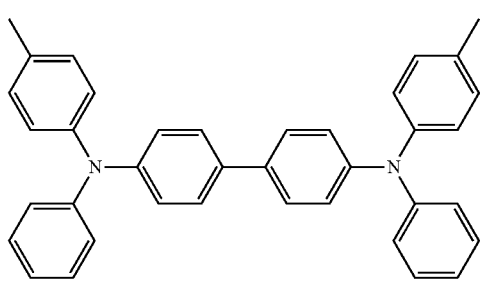 [SMILES: Cc1ccc(N(c2ccccc2)c2ccc(-c3ccc(N(c4ccccc4)c4ccc(C)cc4)cc3)cc2)cc1]

TABLE 23-continued
(7)-27
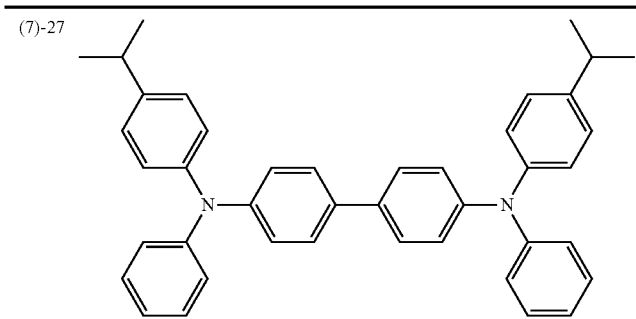
(7)-28
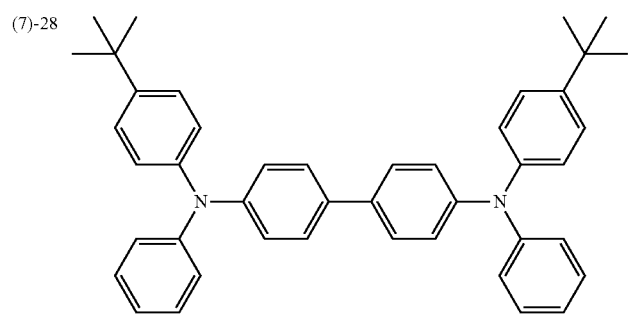
(7)-29
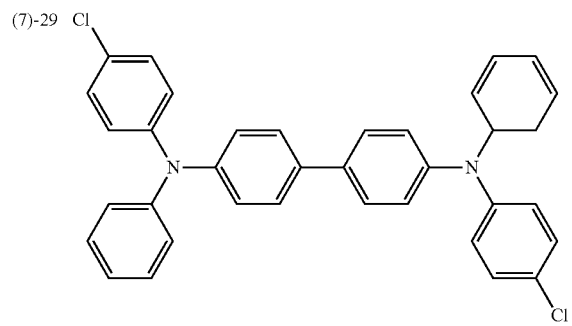
(7)-30
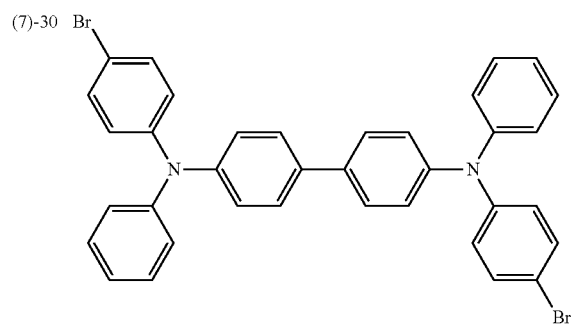
(7)-31
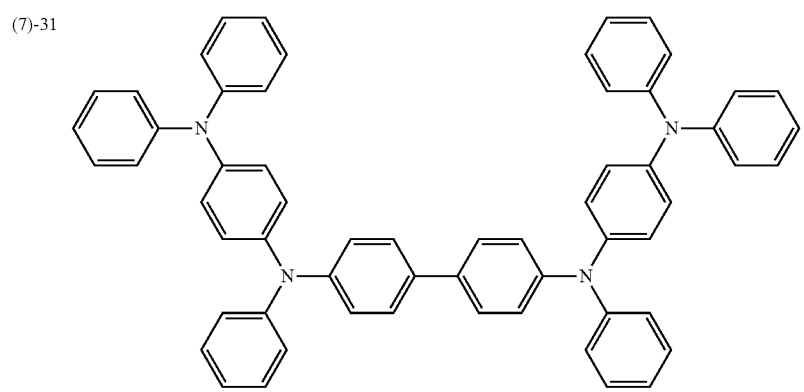

TABLE 23-continued
(7)-32
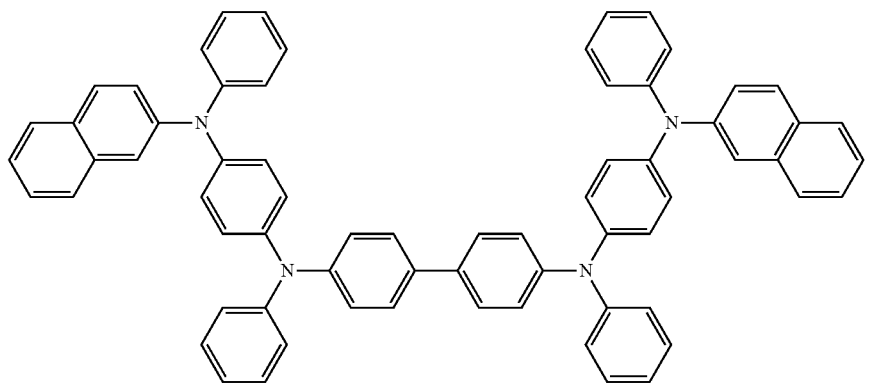 [SMILES: c1ccc(N(c2ccc(-c3ccc(N(c4ccccc4)c4ccc(N(c5ccccc5)c5ccc6ccccc6c5)cc4)cc3)cc2)c2ccc(N(c3ccccc3)c3ccc4ccccc4c3)cc2)cc1]
(7)-33
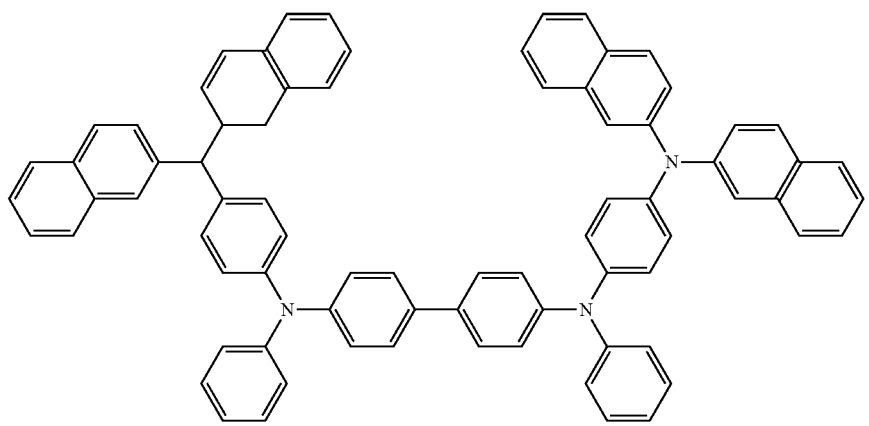 [SMILES: C1=CC(C(c2ccc(N(c3ccccc3)c3ccc(-c4ccc(N(c5ccccc5)c5ccc(N(c6ccc7ccccc7c6)c6ccc7ccccc7c6)cc5)cc4)cc3)cc2)c2ccc3ccccc3c2)Cc2ccccc21]
(7)-34
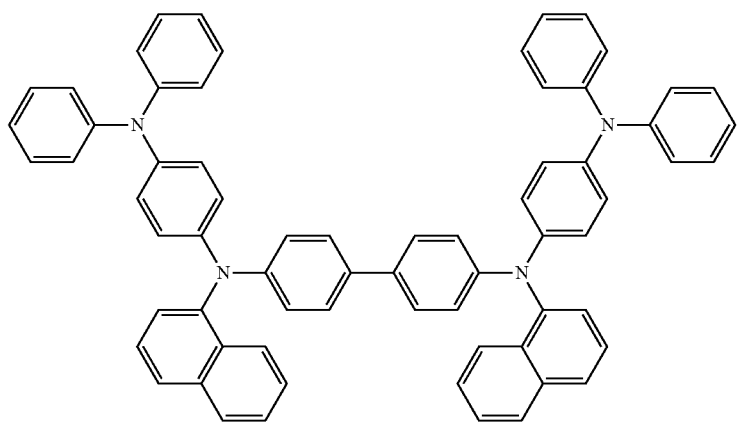 [SMILES: c1ccc(N(c2ccccc2)c2ccc(N(c3ccc(-c4ccc(N(c5ccc(N(c6ccccc6)c6ccccc6)cc5)c5cccc6ccccc56)cc4)cc3)c3cccc4ccccc34)cc2)cc1]
(7)-35
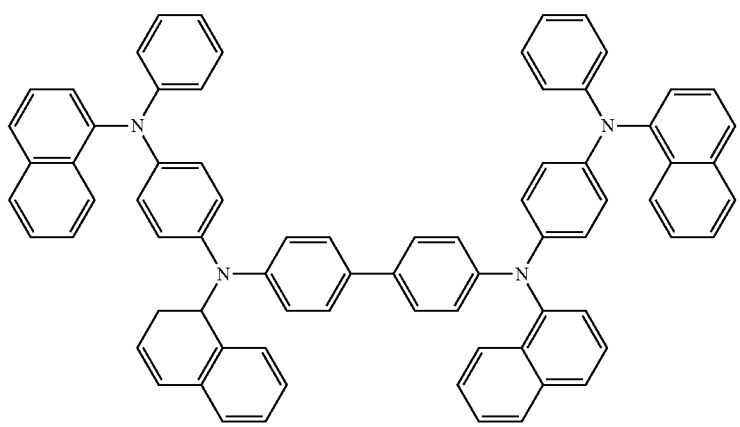 [SMILES: C1=Cc2ccccc2C(N(c2ccc(-c3ccc(N(c4ccc(N(c5ccccc5)c5cccc6ccccc56)cc4)c4cccc5ccccc45)cc3)cc2)c2ccc(N(c3ccccc3)c3cccc4ccccc34)cc2)C1]

TABLE 23-continued
(7)-36
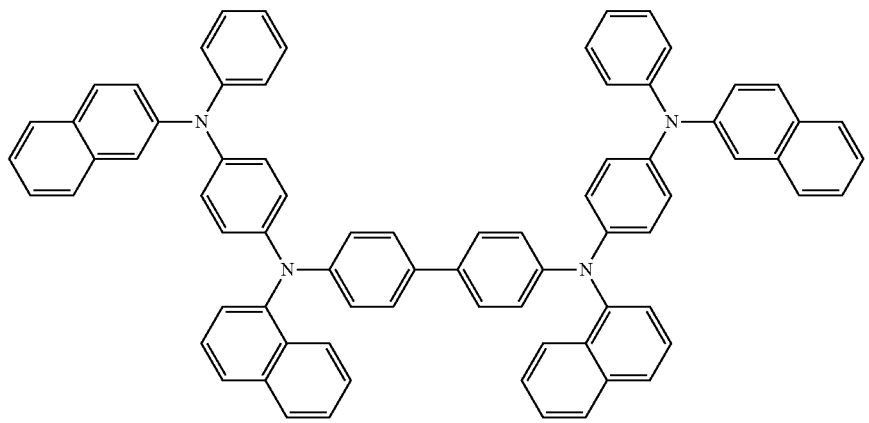 [SMILES: c1ccc(N(c2ccc(N(c3ccc(-c4ccc(N(c5ccc(N(c6ccccc6)c6ccc7ccccc7c6)cc5)c5cccc6ccccc56)cc4)cc3)c3cccc4ccccc34)cc2)c2ccc3ccccc3c2)cc1]
(7)-37
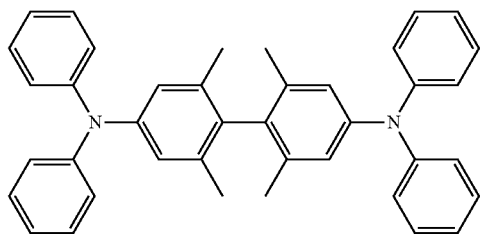 [SMILES: Cc1cc(N(c2ccccc2)c2ccccc2)cc(C)c1-c1c(C)cc(N(c2ccccc2)c2ccccc2)cc1C]
(7)-38
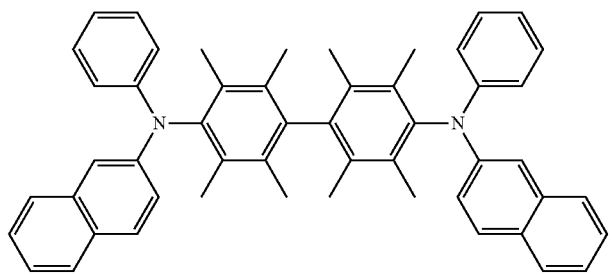 [SMILES: Cc1c(C)c(N(c2ccccc2)c2ccc3ccccc3c2)c(C)c(C)c1-c1c(C)c(C)c(N(c2ccccc2)c2ccc3ccccc3c2)c(C)c1C]
(7)-39
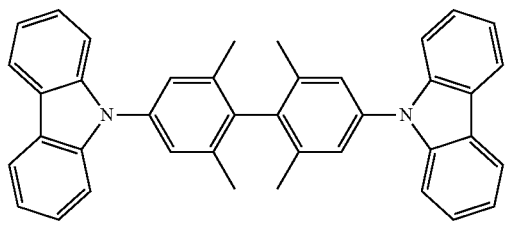 [SMILES: Cc1cc(-n2c3ccccc3c3ccccc32)cc(C)c1-c1c(C)cc(-n2c3ccccc3c3ccccc32)cc1C]
(7)-40
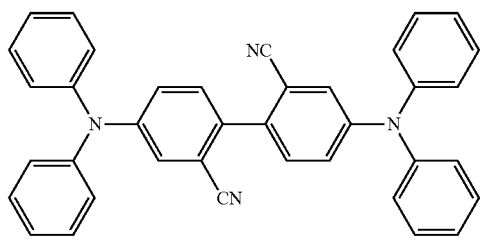 [SMILES: N#Cc1cc(N(c2ccccc2)c2ccccc2)ccc1-c1ccc(N(c2ccccc2)c2ccccc2)cc1C#N]

TABLE 23-continued
(7)-41
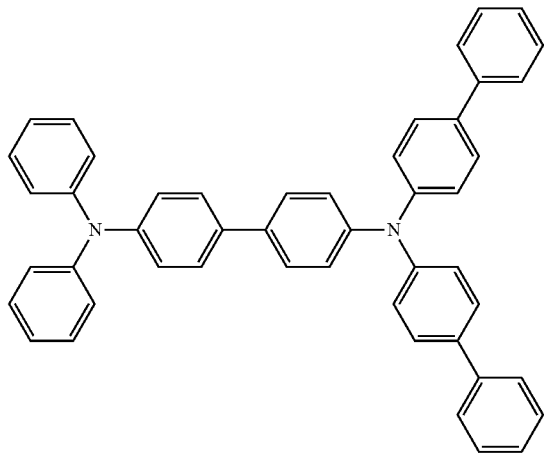 [SMILES: c1ccc(-c2ccc(N(c3ccc(-c4ccccc4)cc3)c3ccc(-c4ccc(N(c5ccccc5)c5ccccc5)cc4)cc3)cc2)cc1]
(7)-42
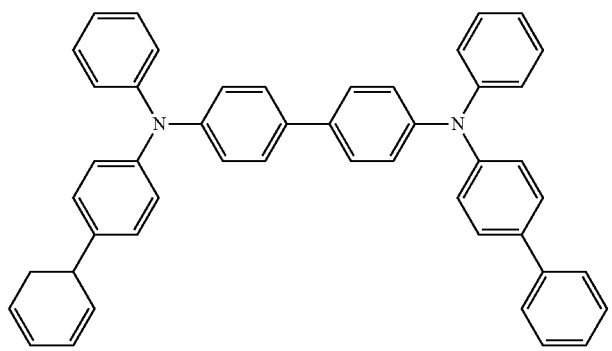 [SMILES: C1=CCC(c2ccc(N(c3ccccc3)c3ccc(-c4ccc(N(c5ccccc5)c5ccc(-c6ccccc6)cc5)cc4)cc3)cc2)C=C1]
(7)-43
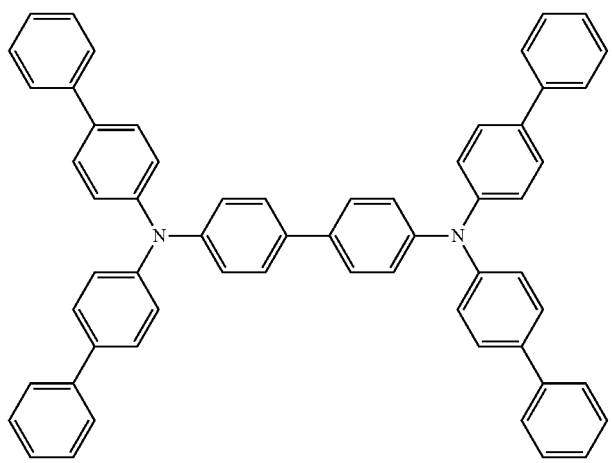 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]

TABLE 23-continued
(7)-44
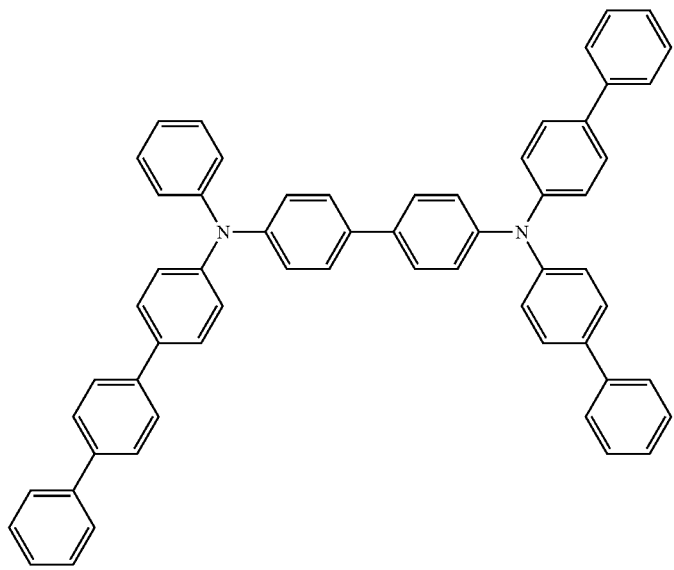 [SMILES: c1ccc(-c2ccc(-c3ccc(N(c4ccccc4)c4ccc(-c5ccc(N(c6ccc(-c7ccccc7)cc6)c6ccc(-c7ccccc7)cc6)cc5)cc4)cc3)cc2)cc1]
(7)-45
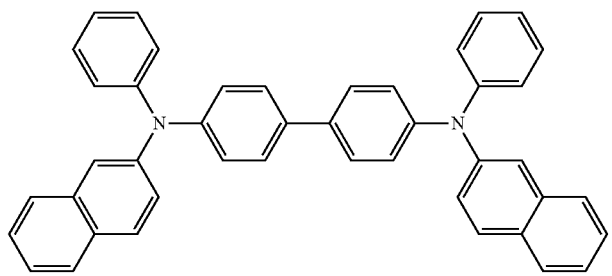 [SMILES: c1ccc(N(c2ccc(-c3ccc(N(c4ccccc4)c4ccc5ccccc5c4)cc3)cc2)c2ccc3ccccc3c2)cc1]
(7)-46
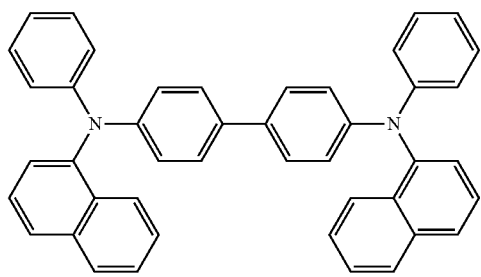 [SMILES: c1ccc(N(c2ccc(-c3ccc(N(c4ccccc4)c4cccc5ccccc45)cc3)cc2)c2cccc3ccccc23)cc1]
(7)-47
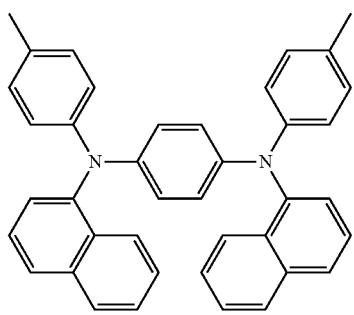 [SMILES: Cc1ccc(N(c2ccc(N(c3ccc(C)cc3)c3cccc4ccccc34)cc2)c2cccc3ccccc23)cc1]

TABLE 23-continued
(7)-48
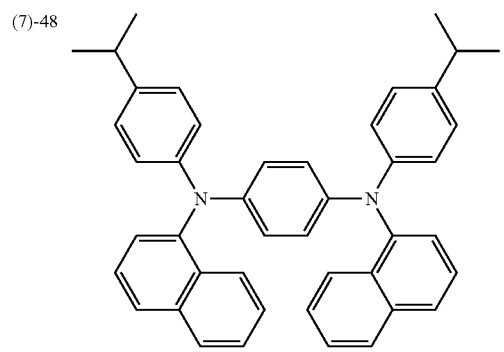
(7)-49
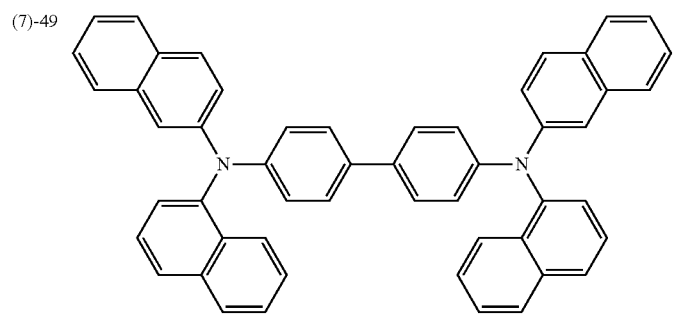
(7)-50
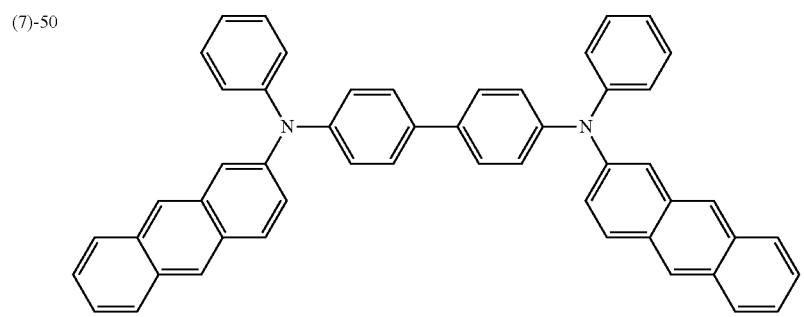
(7)-51
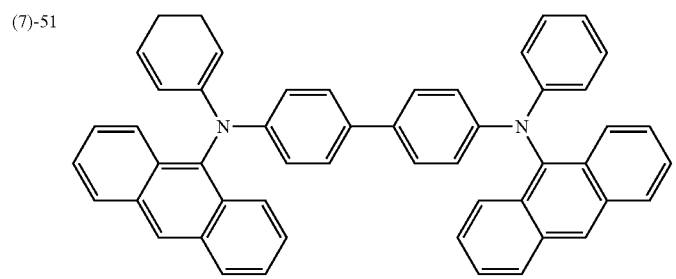
(7)-52
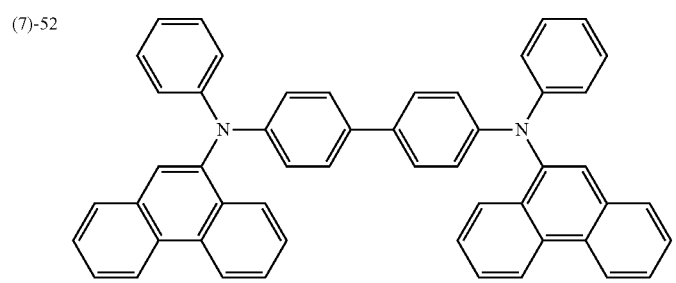

TABLE 24
(7)-53
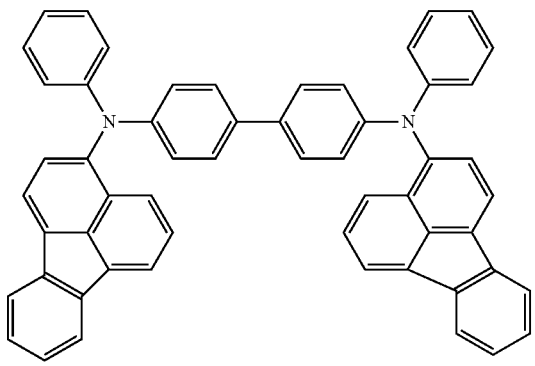 [SMILES: c1ccc(N(c2ccc(-c3ccc(N(c4ccccc4)c4ccc5c6c(cccc46)-c4ccccc4-5)cc3)cc2)c2ccc3c4c(cccc24)-c2ccccc2-3)cc1]
(7)-54
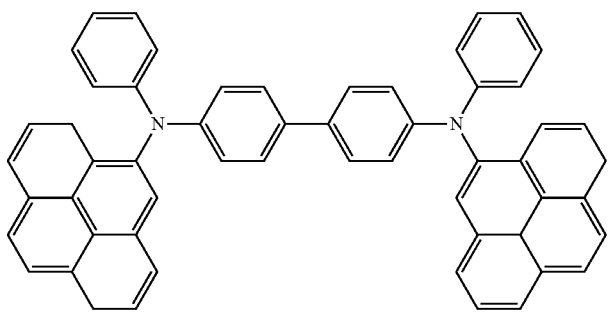 [SMILES: C1=CC2=CC=C3CC=CC4=C3C2C(=C1)C=C4N(c1ccccc1)c1ccc(-c2ccc(N(c3ccccc3)c3cc4c5c(ccc6c5c3CC=C6)CC=C4)cc2)cc1]
(7)-55
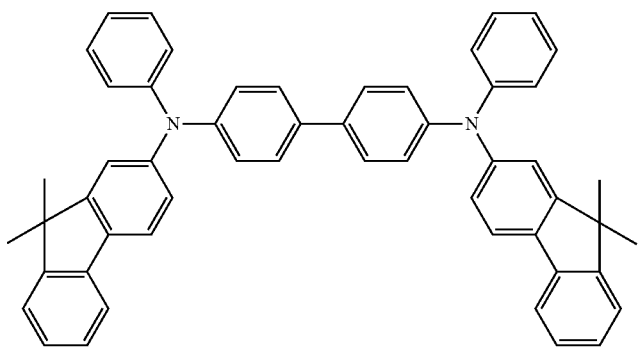
(7)-56
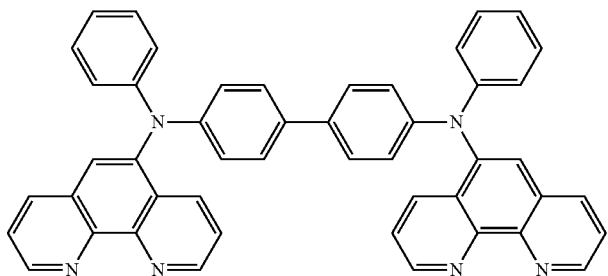 [SMILES: c1ccc(N(c2ccc(-c3ccc(N(c4ccccc4)c4cc5cccnc5c5ncccc45)cc3)cc2)c2cc3cccnc3c3ncccc23)cc1]

TABLE 24-continued
(7)-57
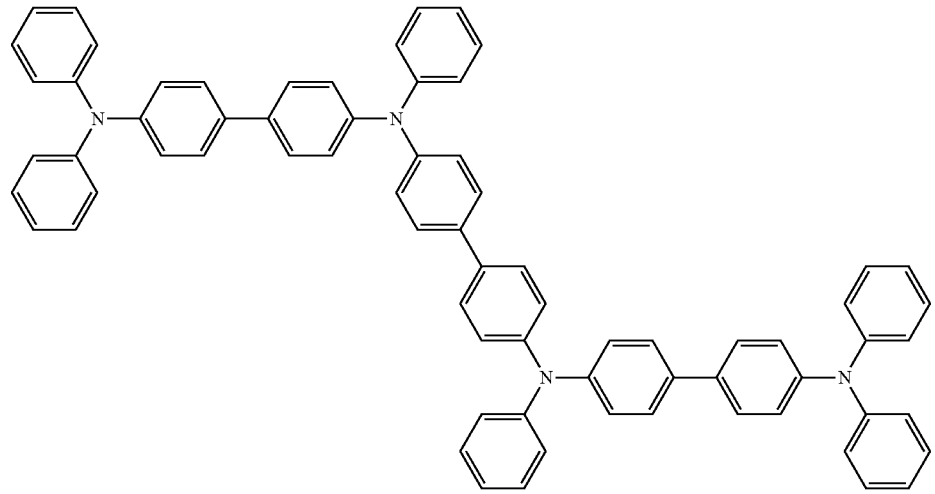 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1]
(7)-58
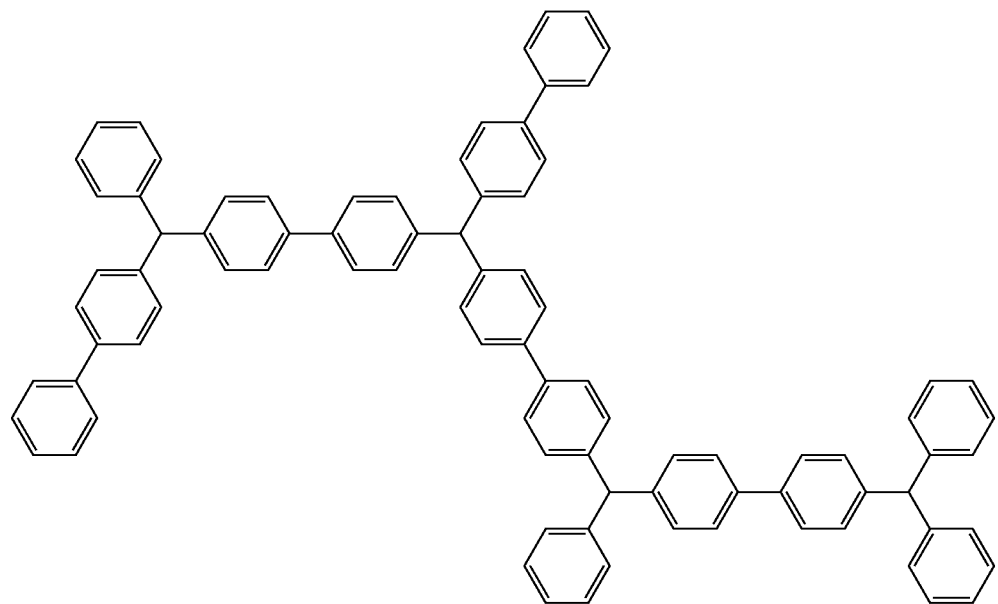 [SMILES: c1ccc(-c2ccc(C(c3ccccc3)c3ccc(-c4ccc(C(c5ccc(-c6ccccc6)cc5)c5ccc(-c6ccc(C(c7ccccc7)c7ccc(-c8ccc(C(c9ccccc9)c9ccccc9)cc8)cc7)cc6)cc5)cc4)cc3)cc2)cc1]

TABLE 24-continued
(7)-59
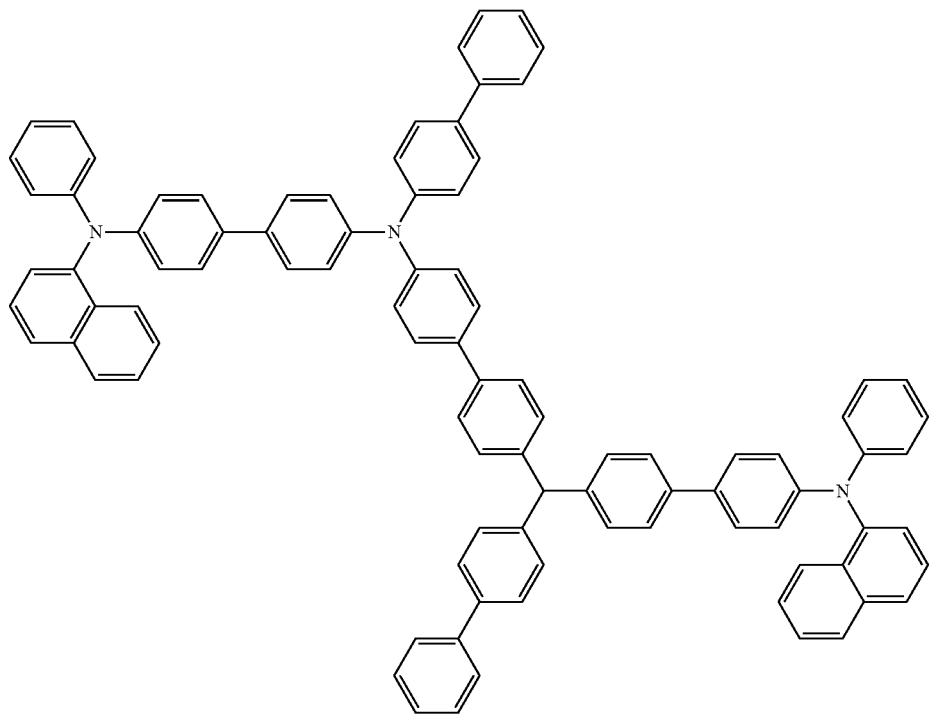 [SMILES: c1ccc(-c2ccc(C(c3ccc(-c4ccc(N(c5ccc(-c6ccccc6)cc5)c5ccc(-c6ccc(N(c7ccccc7)c7cccc8ccccc78)cc6)cc5)cc4)cc3)c3ccc(-c4ccc(N(c5ccccc5)c5cccc6ccccc56)cc4)cc3)cc2)cc1]
(7)-60
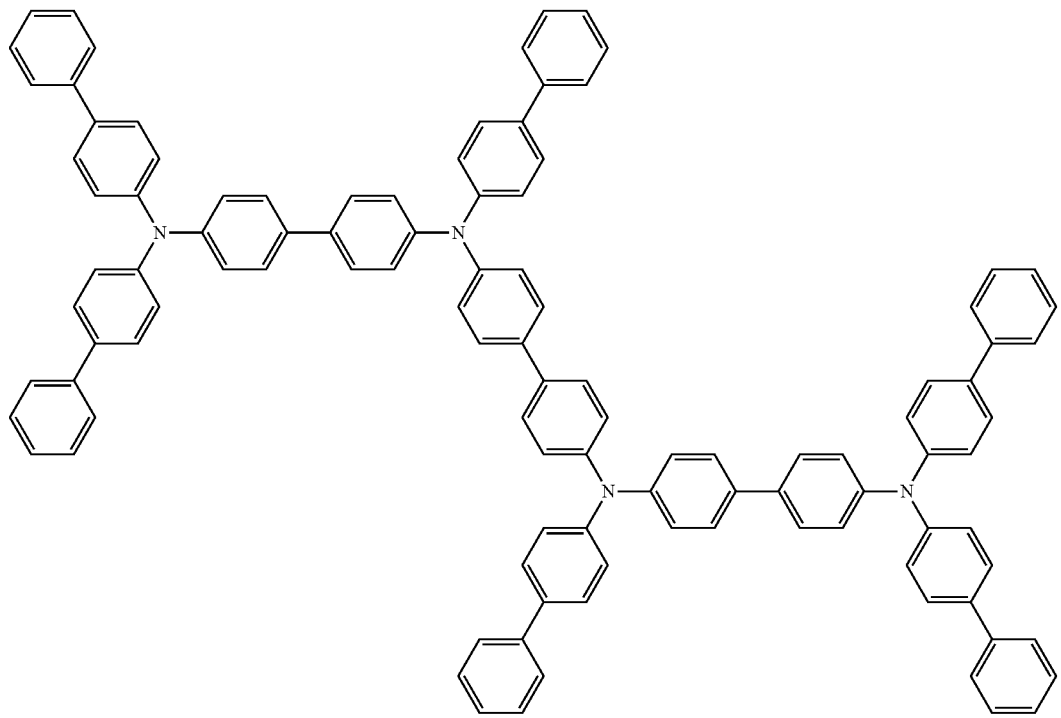 [SMILES: c1ccc(-c2ccc(N(c3ccc(-c4ccccc4)cc3)c3ccc(-c4ccc(N(c5ccc(-c6ccccc6)cc5)c5ccc(-c6ccc(N(c7ccc(-c8ccccc8)cc7)c7ccc(-c8ccc(N(c9ccc(-c%10ccccc%10)cc9)c9ccc(-c%10ccccc%10)cc9)cc8)cc7)cc6)cc5)cc4)cc3)cc2)cc1]

TABLE 24-continued
(7)-61
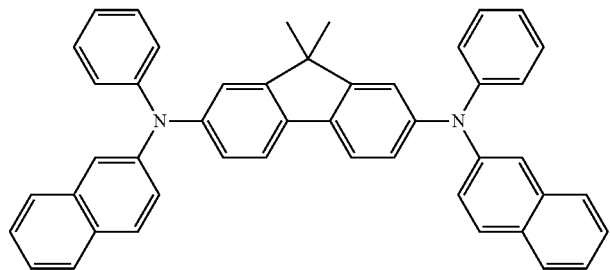
(7)-62
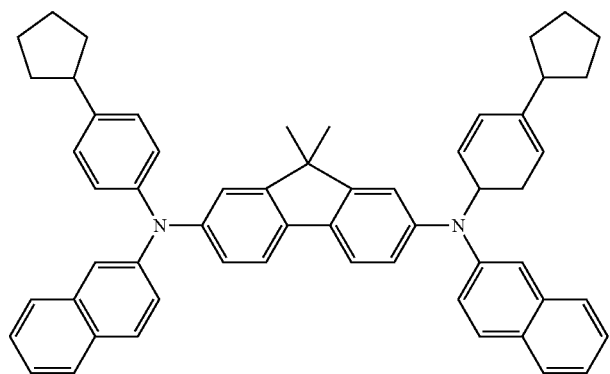 [SMILES: CC1(C)c2cc(N(c3ccc(C4CCCC4)cc3)c3ccc4ccccc4c3)ccc2-c2ccc(N(c3ccc4ccccc4c3)C3C=CC(C4CCCC4)=CC3)cc21]
(7)-63
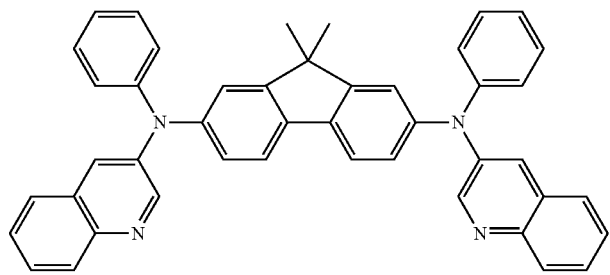 [SMILES: CC1(C)c2cc(N(c3ccccc3)c3cnc4ccccc4c3)ccc2-c2ccc(N(c3ccccc3)c3cnc4ccccc4c3)cc21]
(7)-64
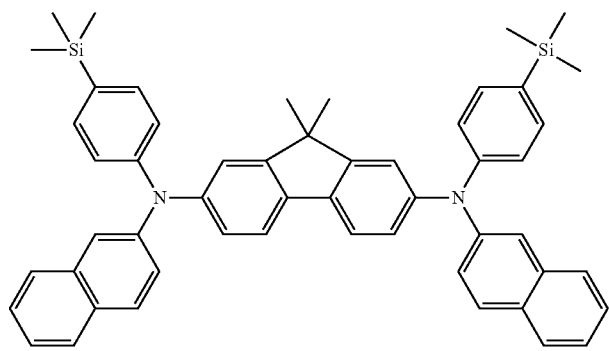 [SMILES: CC1(C)c2cc(N(c3ccc([Si](C)(C)C)cc3)c3ccc4ccccc4c3)ccc2-c2ccc(N(c3ccc([Si](C)(C)C)cc3)c3ccc4ccccc4c3)cc21]
(7)-65
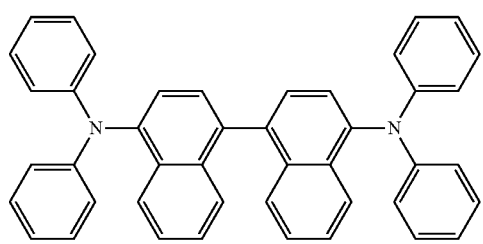 [SMILES: c1ccc(N(c2ccccc2)c2ccc(-c3ccc(N(c4ccccc4)c4ccccc4)c4ccccc34)c3ccccc23)cc1]

TABLE 24-continued
(7)-66
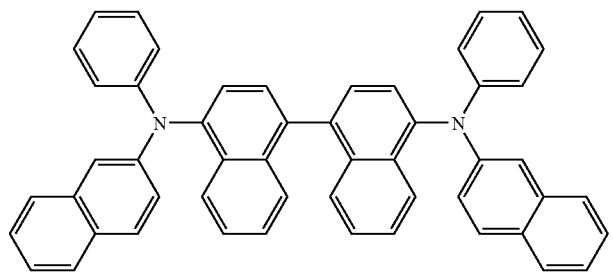 [SMILES: c1ccc(N(c2ccc3ccccc3c2)c2ccc(-c3ccc(N(c4ccccc4)c4ccc5ccccc5c4)c4ccccc34)c3ccccc23)cc1]
(7)-67
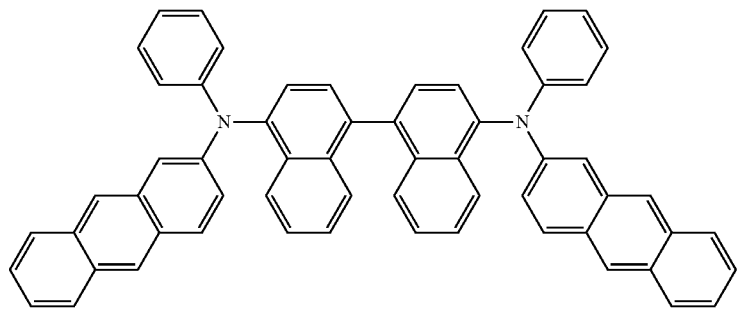 [SMILES: c1ccc(N(c2ccc3cc4ccccc4cc3c2)c2ccc(-c3ccc(N(c4ccccc4)c4ccc5cc6ccccc6cc5c4)c4ccccc34)c3ccccc23)cc1]
(7)-68
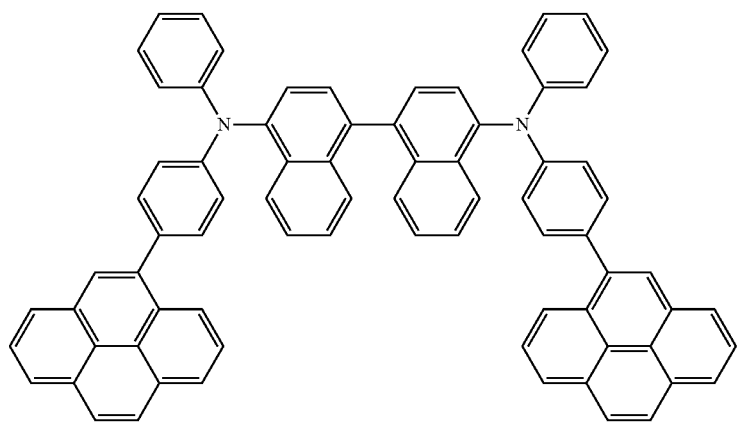 [SMILES: c1ccc(N(c2ccc(-c3cc4cccc5ccc6cccc3c6c54)cc2)c2ccc(-c3ccc(N(c4ccccc4)c4ccc(-c5cc6cccc7ccc8cccc5c8c76)cc4)c4ccccc34)c3ccccc23)cc1]
(7)-69
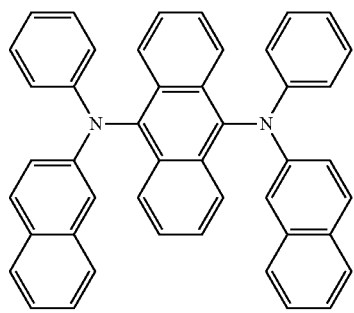 [SMILES: c1ccc(N(c2ccc3ccccc3c2)c2c3ccccc3c(N(c3ccccc3)c3ccc4ccccc4c3)c3ccccc23)cc1]
(7)-70
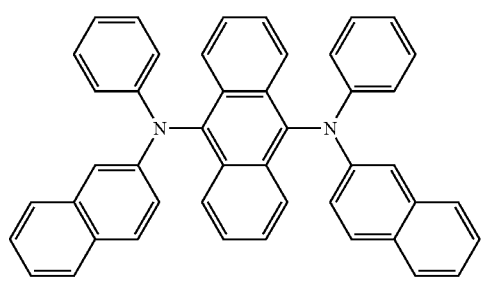 [SMILES: c1ccc(N(c2ccc3ccccc3c2)c2c3ccccc3c(N(c3ccccc3)c3ccc4ccccc4c3)c3ccccc23)cc1]

TABLE 24-continued
(7)-71
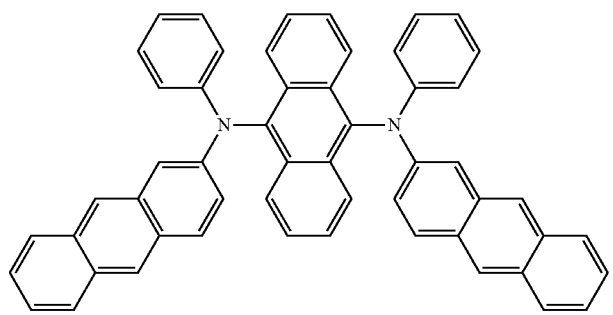 [SMILES: c1ccc(N(c2ccc3cc4ccccc4cc3c2)c2c3ccccc3c(N(c3ccccc3)c3ccc4cc5ccccc5cc4c3)c3ccccc23)cc1]
(7)-72
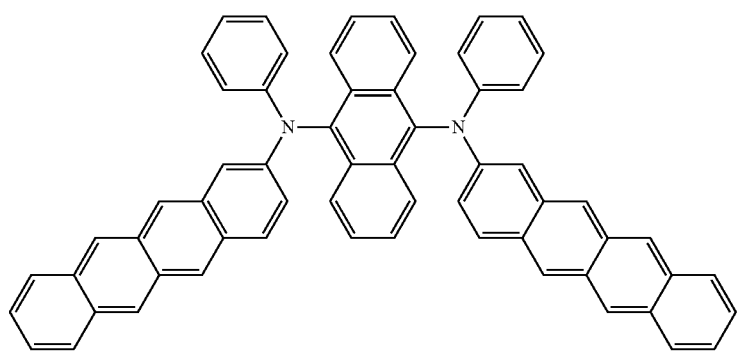 [SMILES: c1ccc(N(c2ccc3cc4cc5ccccc5cc4cc3c2)c2c3ccccc3c(N(c3ccccc3)c3ccc4cc5cc6ccccc6cc5cc4c3)c3ccccc23)cc1]
(7)-73
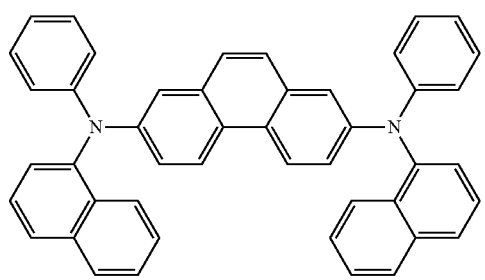 [SMILES: c1ccc(N(c2ccc3c(ccc4cc(N(c5ccccc5)c5cccc6ccccc56)ccc43)c2)c2cccc3ccccc23)cc1]
(7)-74
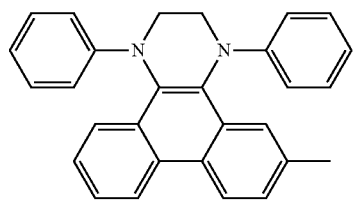 [SMILES: Cc1ccc2c(c1)c1c(c3ccccc32)N(c2ccccc2)CCN1c1ccccc1]
(7)-75
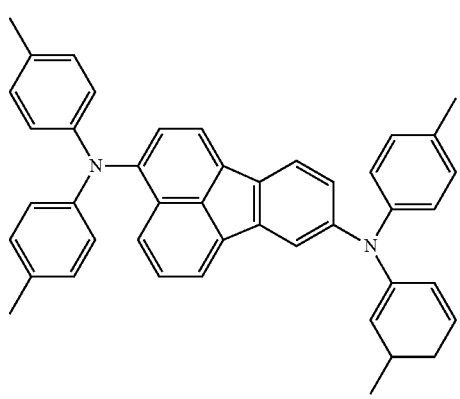 [SMILES: Cc1ccc(N(C2=CC(C)CC=C2)c2ccc3c(c2)-c2cccc4c(N(c5ccc(C)cc5)c5ccc(C)cc5)ccc-3c24)cc1]

TABLE 24-continued
(7)-76
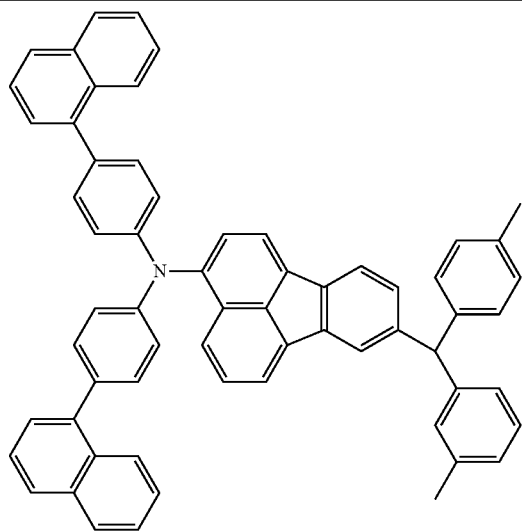
TABLE 25
(7)-77
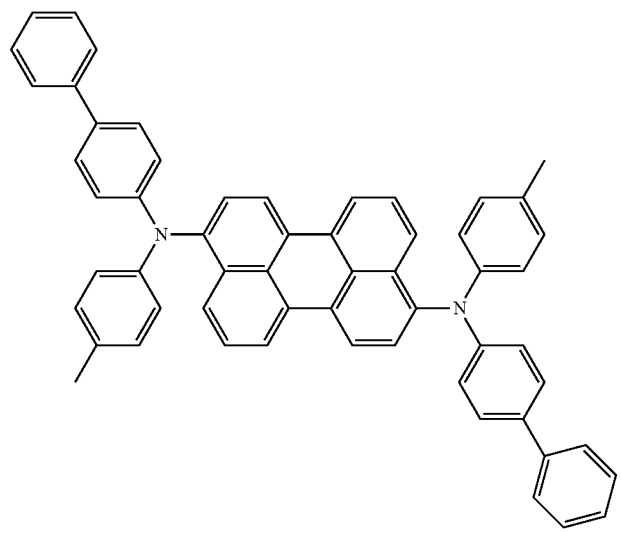 [SMILES: Cc1ccc(N(c2ccc(-c3ccccc3)cc2)c2ccc3c4cccc5c(N(c6ccc(C)cc6)c6ccc(-c7ccccc7)cc6)ccc(c6cccc2c63)c54)cc1]
(7)-78
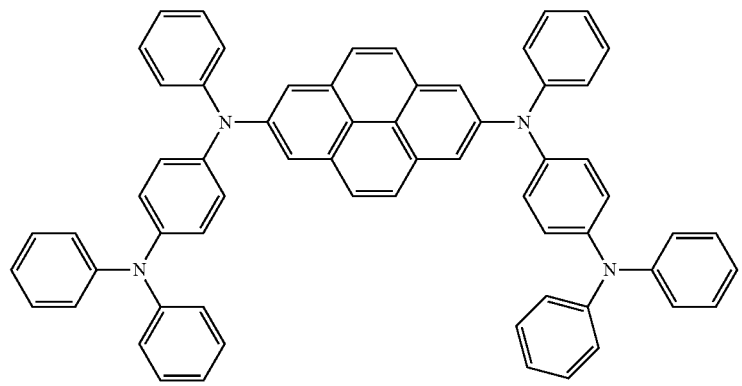 [SMILES: c1ccc(N(c2ccccc2)c2ccc(N(c3ccccc3)c3cc4ccc5cc(N(c6ccccc6)c6ccc(N(c7ccccc7)c7ccccc7)cc6)cc6ccc(c3)c4c56)cc2)cc1]

TABLE 25-continued
(7)-79
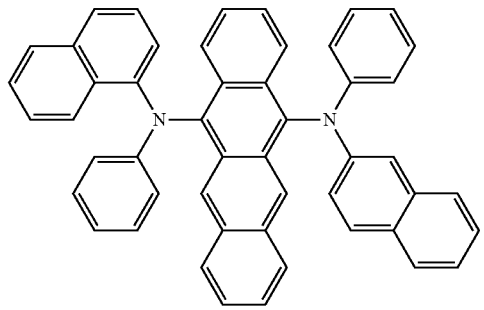 [SMILES: c1ccc(N(c2ccc3ccccc3c2)c2c3ccccc3c(N(c3ccccc3)c3cccc4ccccc34)c3cc4ccccc4cc23)cc1]
(7)-80
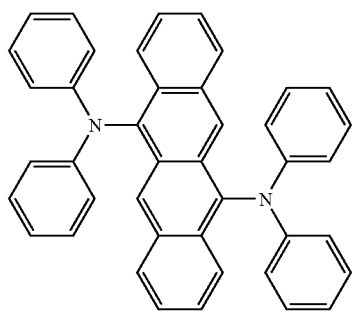 [SMILES: c1ccc(N(c2ccccc2)c2c3ccccc3cc3c(N(c4ccccc4)c4ccccc4)c4ccccc4cc23)cc1]
(7)-81
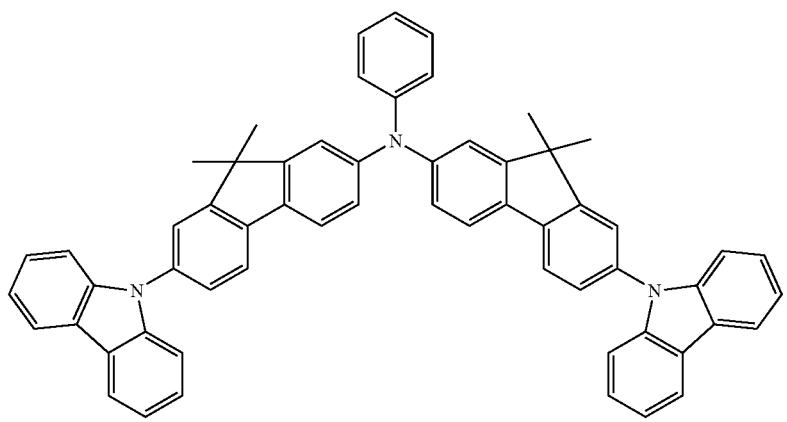 [SMILES: CC1(C)c2cc(N(c3ccccc3)c3ccc4c(c3)C(C)(C)c3cc(-n5c6ccccc6c6ccccc65)ccc3-4)ccc2-c2ccc(-n3c4ccccc4c4ccccc43)cc21]
(7)-82
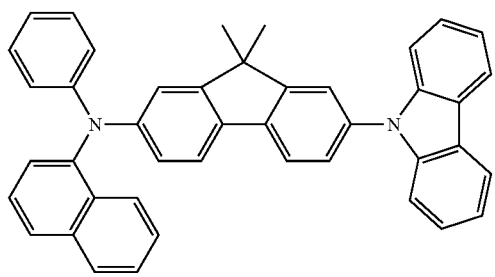 [SMILES: CC1(C)c2cc(N(c3ccccc3)c3cccc4ccccc34)ccc2-c2ccc(-n3c4ccccc4c4ccccc43)cc21]

TABLE 25-continued (7)-83

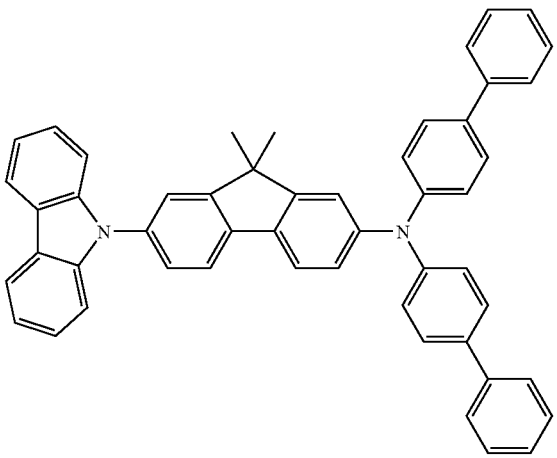 [SMILES: CC1(C)c2cc(N(c3ccc(-c4ccccc4)cc3)c3ccc(-c4ccccc4)cc3)ccc2-c2ccc(-n3c4ccccc4c4ccccc43)cc21]

(7)-84

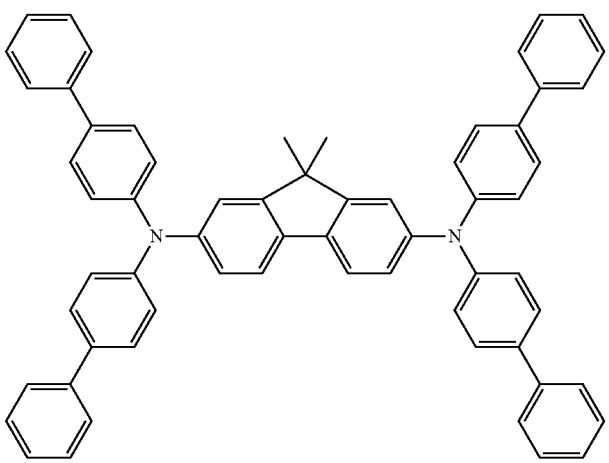 [SMILES: CC1(C)c2cc(N(c3ccc(-c4ccccc4)cc3)c3ccc(-c4ccccc4)cc3)ccc2-c2ccc(N(c3ccc(-c4ccccc4)cc3)c3ccc(-c4ccccc4)cc3)cc21]

In the triarylamine multimer represented by general formula (8), $A_7$ to $A_{12}$ in general formula (8) each independently represent an aromatic hydrocarbon having 6 to 20 carbon atoms. Each of the aromatic hydrocarbon represented by $A_7$ to $A_{12}$ may be unsubstituted or may have a substituent. In this case, the substituent is selected from a hydrogen atom, halogen atoms, a hydroxyl group, an aldehyde group, a carbonyl group, a carbonyl ester group, alkyl groups, alkenyl groups, cyclic alkyl groups, alkoxy groups, aryl groups, an amino group, heterocyclic groups, a cyano group, a nitrile group, a nitro group, and silyl groups. The number of these substituents substituting the aromatic hydrocarbons represented by $A_7$ to $A_{12}$ is not particularly limited. In general formula (8), $Z_1$ to $Z_3$ each represent an aromatic hydrocarbon selected from benzene, naphthalene, anthracene, phenanthrene, naphthacene, fluoranthene, and perylene, and p, q and r each represent an integer of 1 or more. In general formula (8), each pair of $A_7$ and $A_8$, $A_9$ and $A_{10}$, and $A_{11}$ and $A_{12}$ may be bonded to each other through a linking group.

Specific examples of the triarylamine multimer include compounds represented by structural formulae (8)-1 to (8)-15 below.

TABLE 26
(8)-1
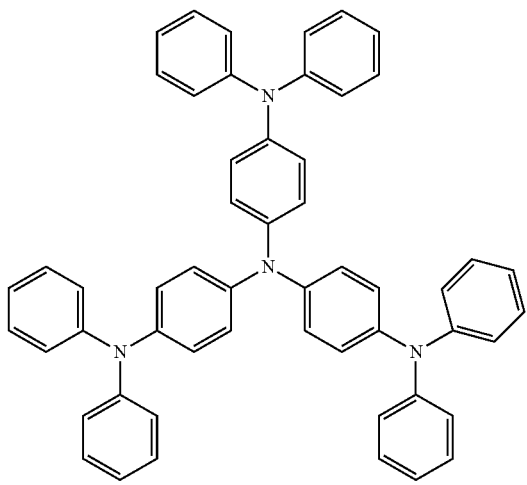 [SMILES: c1ccc(N(c2ccccc2)c2ccc(N(c3ccc(N(c4ccccc4)c4ccccc4)cc3)c3ccc(N(c4ccccc4)c4ccccc4)cc3)cc2)cc1]
(8)-2
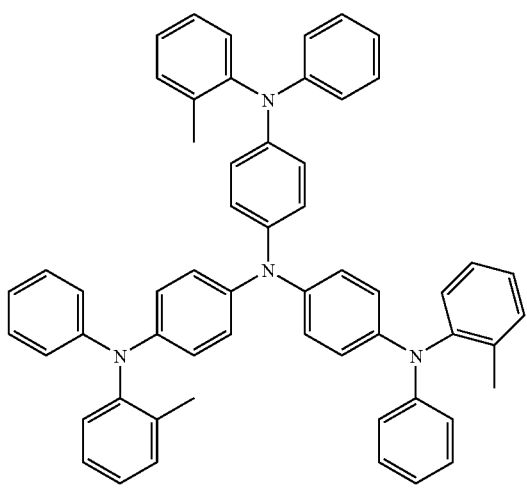 [SMILES: Cc1ccccc1N(c1ccccc1)c1ccc(N(c2ccc(N(c3ccccc3)c3ccccc3C)cc2)c2ccc(N(c3ccccc3)c3ccccc3C)cc2)cc1]
(8)-3
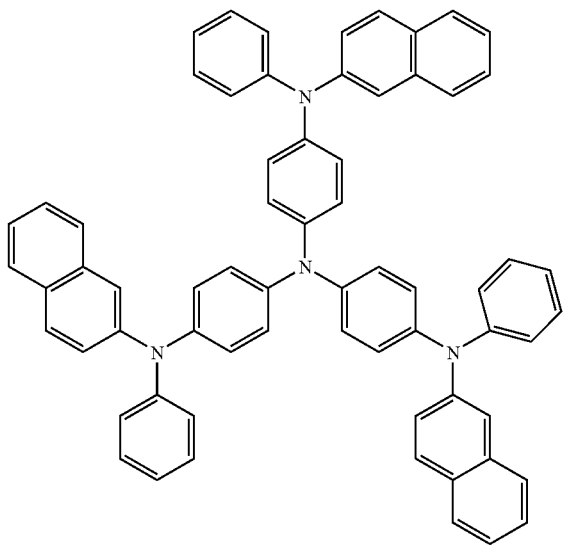 [SMILES: c1ccc(N(c2ccc(N(c3ccc(N(c4ccccc4)c4ccc5ccccc5c4)cc3)c3ccc(N(c4ccccc4)c4ccc5ccccc5c4)cc3)cc2)c2ccc3ccccc3c2)cc1]

TABLE 26-continued
(8)-4
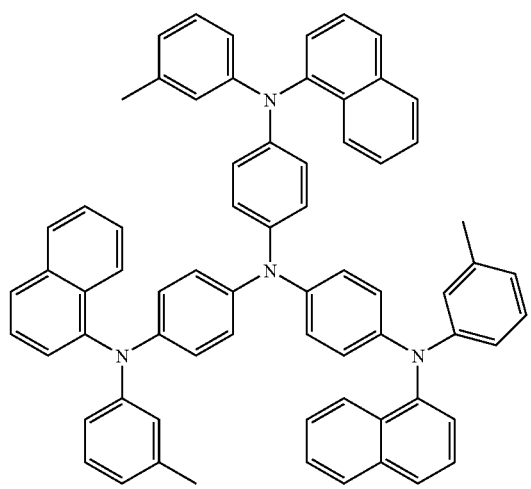 [SMILES: Cc1cccc(N(c2ccc(N(c3ccc(N(c4cccc(C)c4)c4cccc5ccccc45)cc3)c3ccc(N(c4cccc(C)c4)c4cccc5ccccc45)cc3)cc2)c2cccc3ccccc23)c1]
(8)-5
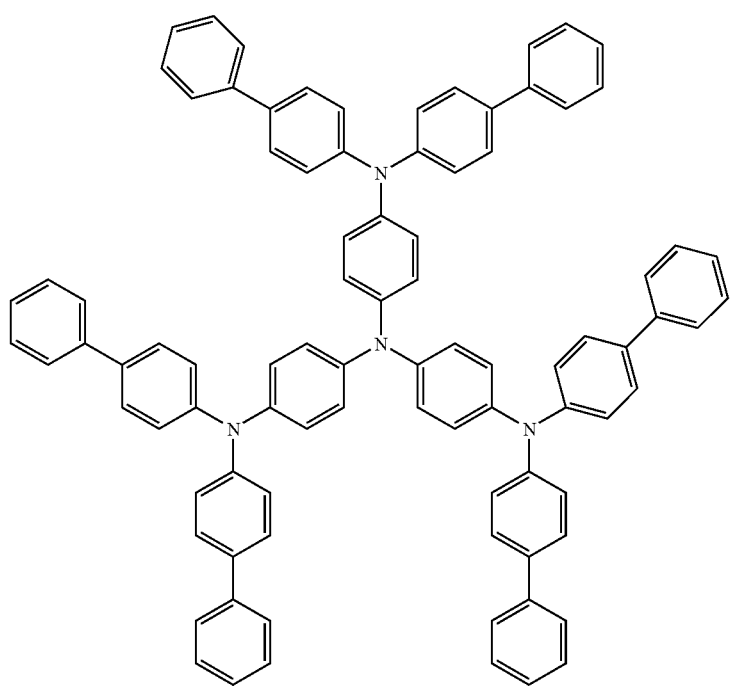 [SMILES: c1ccc(-c2ccc(N(c3ccc(-c4ccccc4)cc3)c3ccc(N(c4ccc(N(c5ccc(-c6ccccc6)cc5)c5ccc(-c6ccccc6)cc5)cc4)c4ccc(N(c5ccc(-c6ccccc6)cc5)c5ccc(-c6ccccc6)cc5)cc4)cc3)cc2)cc1]
(8)-6
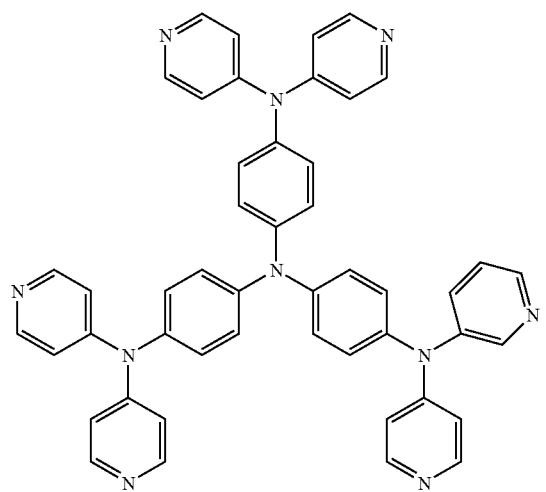 [SMILES: c1cncc(N(c2ccncc2)c2ccc(N(c3ccc(N(c4ccncc4)c4ccncc4)cc3)c3ccc(N(c4ccncc4)c4ccncc4)cc3)cc2)c1]

TABLE 26-continued
(8)-7
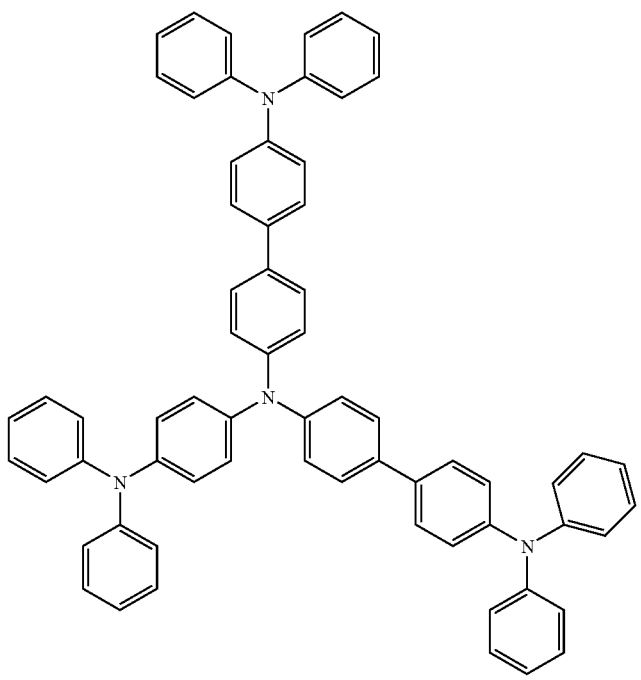 [SMILES: c1ccc(N(c2ccccc2)c2ccc(-c3ccc(N(c4ccc(-c5ccc(N(c6ccccc6)c6ccccc6)cc5)cc4)c4ccc(N(c5ccccc5)c5ccccc5)cc4)cc3)cc2)cc1]
(8)-8
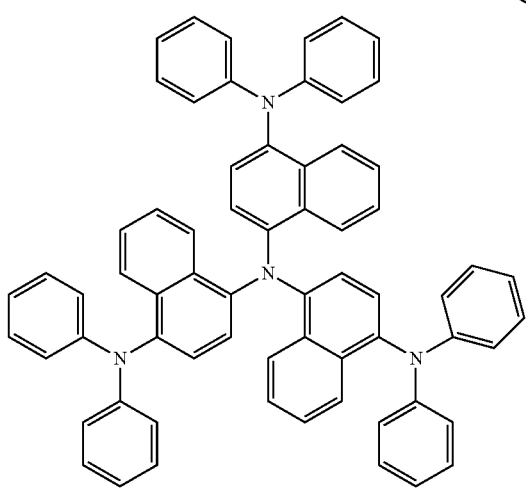
(8)-9
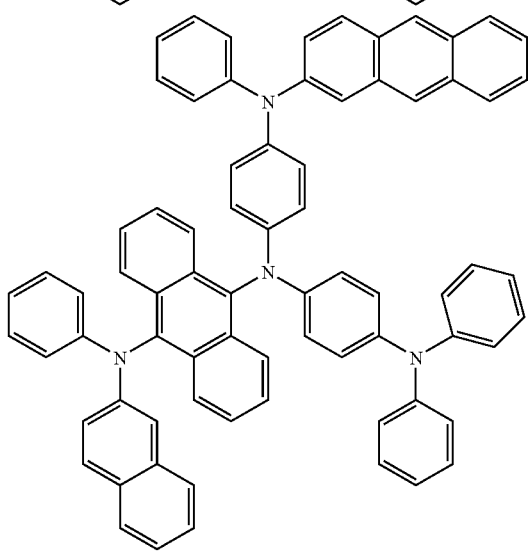

(8)-10
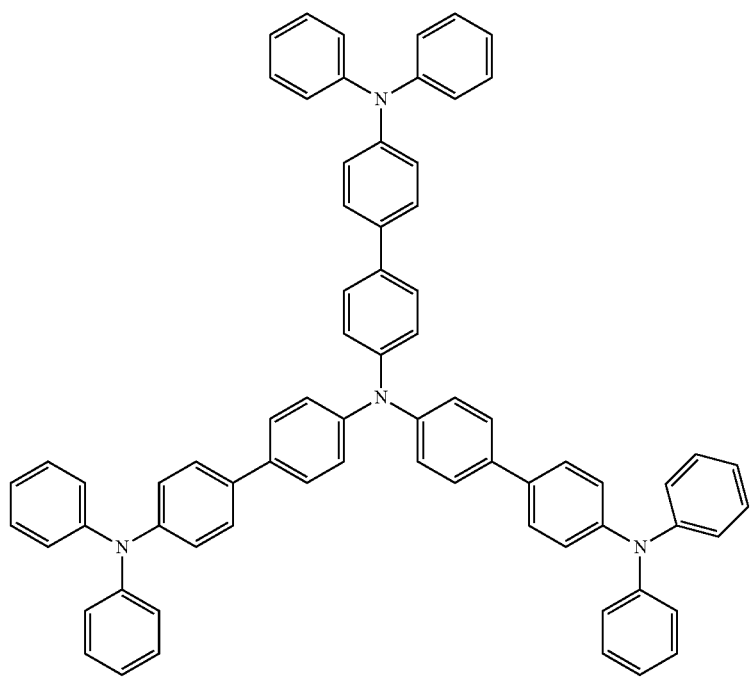 [SMILES: c1ccc(N(c2ccccc2)c2ccc(-c3ccc(N(c4ccc(-c5ccc(N(c6ccccc6)c6ccccc6)cc5)cc4)c4ccc(-c5ccc(N(c6ccccc6)c6ccccc6)cc5)cc4)cc3)cc2)cc1]
(8)-11
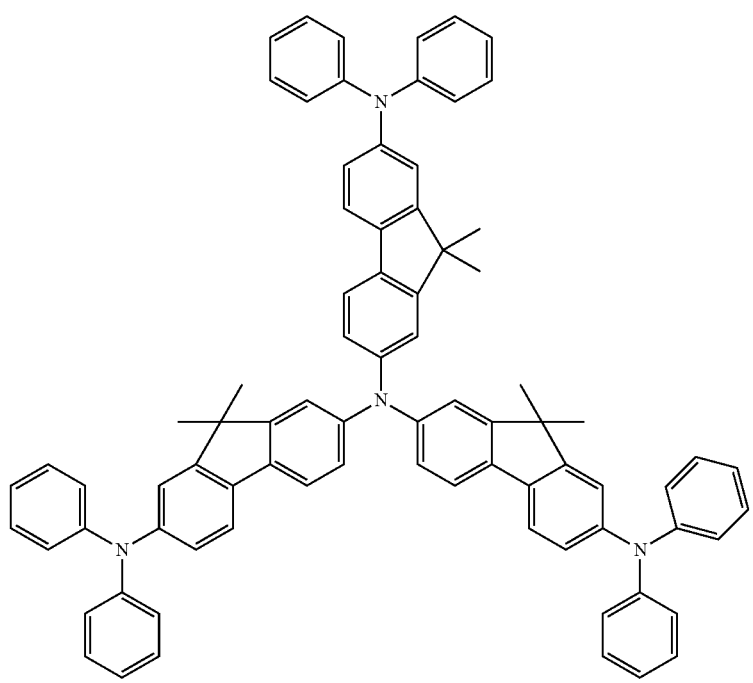 [SMILES: CC1(C)c2cc(N(c3ccccc3)c3ccccc3)ccc2-c2ccc(N(c3ccc4c(c3)C(C)(C)c3cc(N(c5ccccc5)c5ccccc5)ccc3-4)c3ccc4c(c3)C(C)(C)c3cc(N(c5ccccc5)c5ccccc5)ccc3-4)cc21]

TABLE 26-continued
(8)-12
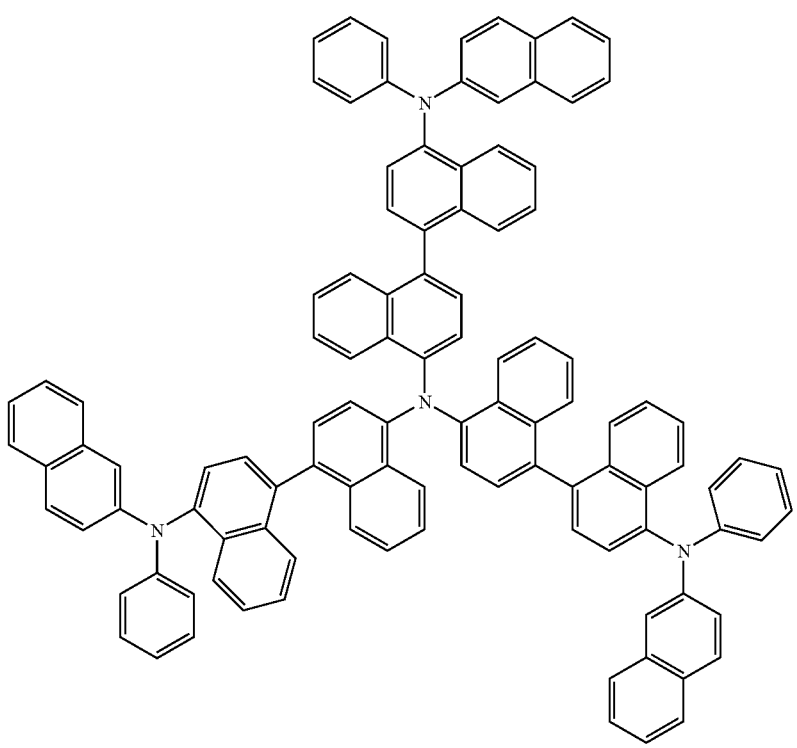 [SMILES: c1ccc(N(c2ccc3ccccc3c2)c2ccc(-c3ccc(N(c4ccc(-c5ccc(N(c6ccccc6)c6ccc7ccccc7c6)c6ccccc56)c5ccccc45)c4ccc(-c5ccc(N(c6ccccc6)c6ccc7ccccc7c6)c6ccccc56)c5ccccc45)c4ccccc34)c3ccccc23)cc1]
(8)-13
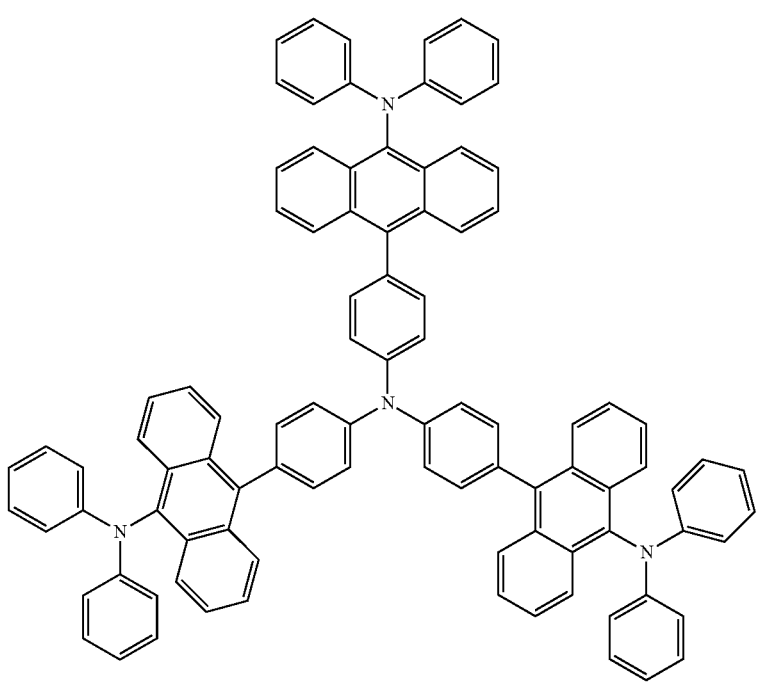 [SMILES: c1ccc(N(c2ccccc2)c2c3ccccc3c(-c3ccc(N(c4ccc(-c5c6ccccc6c(N(c6ccccc6)c6ccccc6)c6ccccc56)cc4)c4ccc(-c5c6ccccc6c(N(c6ccccc6)c6ccccc6)c6ccccc56)cc4)cc3)c3ccccc23)cc1]

TABLE 26-continued (8)-14

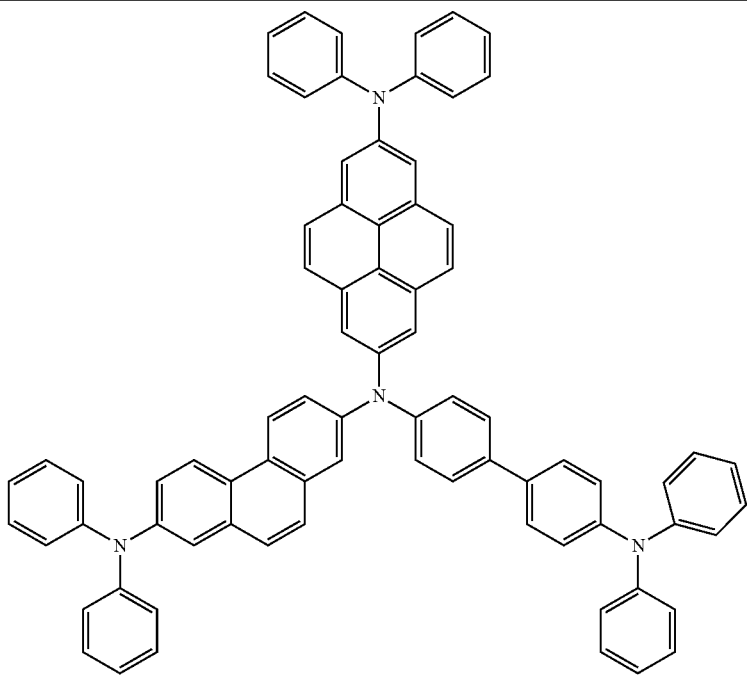

(8)-15

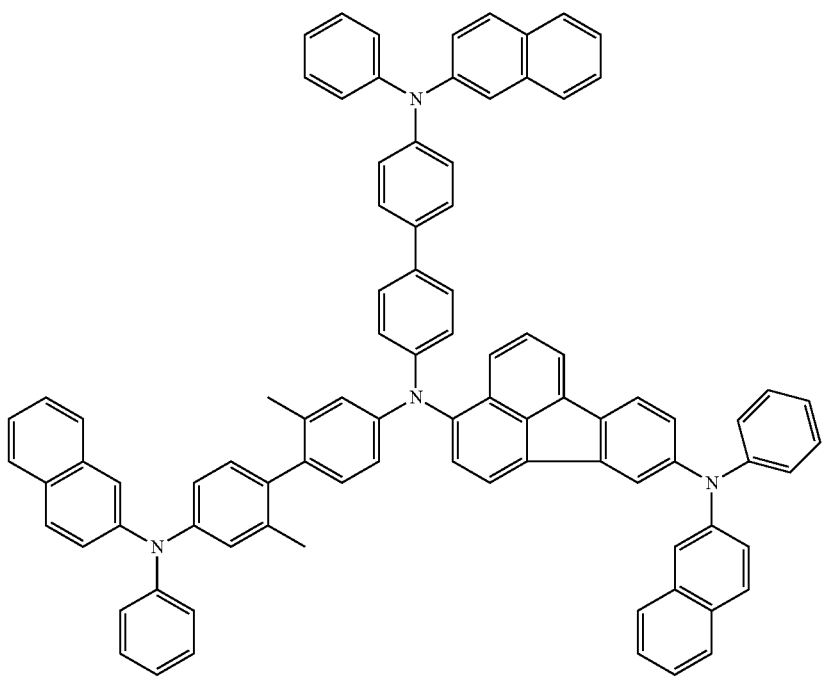 [SMILES: Cc1cc(N(c2ccccc2)c2ccc3ccccc3c2)ccc1-c1ccc(N(c2ccc(-c3ccc(N(c4ccccc4)c4ccc5ccccc5c4)cc3)cc2)c2ccc3c4c(cccc24)-c2ccc(N(c4ccccc4)c4ccc5ccccc5c4)cc2-3)cc1C]

Each of the above-described layers 14a to 14d constituting the organic layer 14 may be provided with other factors. Furthermore, each of the layers 14a to 14d may have a stacked structure. For example, the light-emitting layer 14c may have a stacked structure including a blue-light-emitting layer, a green-light-emitting layer, and a red-light-emitting layer to constitute an organic electroluminescent device that emits white light.

7. Thickness Configuration of Organic Layer

Next, a description will be made of a thickness configuration of the organic layer 14 formed by stacking the layers composed of the materials described above.

Referring to FIG. 1, in the organic layer 14, the total thickness of the entire electron transport layer including the first electron transport layer 14d-1 and the second electron transport layer 14$d$-2 is represented by [d1], and the total thickness of the hole supply layer including the hole injection layer 14$a$ and the hole transport layer 14$b$ is represented by [d2]. In this case, the total thickness [d1] of the electron transport layer is larger than the total thickness [d2] of the hole supply layer, that is, the relationship [d1]>[d2] is satisfied.

According to this structure, the amount of holes can be increased by reducing the film thickness and the amount of electrons can be limited by increasing the film thickness, thus improving the drive stability of light emission.

In order to achieve the balance with a hole-supply from the hole supply layer, the total thickness [d1] of the first electron transport layer 14$d$-1 and the second electron transport layer 14$d$-2 is preferably 70 nm or more in consideration of a carrier transport property of the benzimidazole and dibenzimidazole-containing device of an embodiment of the present invention and extraction of emitted light.

On the other hand, in order to achieve the balance between the capacity to supply electrons through the electron transport layers 14$d$-1 and 14$d$-2 and the capacity to supply holes, the total thickness [d2] of the hole injection layer 14$a$ and the hole transport layer 14$b$ is preferably 60 nm or less.

Furthermore, when the total thickness of the entire organic layer 14 is represented by [da], the total thickness [da] of the organic layer 14 and the total thickness [d1] of the electron transport layers 14$d$-1 and 14$d$-2 are designed so as to satisfy the relationship 0.90>[d1]/[da]>0.30. Accordingly, the balance between hole supply and electron supply to the light-emitting layer 14$c$ can be readily achieved to improve the current efficiency and the emission lifetime.

Furthermore, the organic electroluminescent device 11 may have a resonator structure in which emitted light is resonated between the anode 13 and the cathode 15 and is extracted, thus improving the color purity of the extracted light and increasing the intensity of the extracted light around the center wavelength of the resonance. In this case, for example, a reflection end surface at the light-emitting layer 14$c$ side of the anode 13 is defined as a first end surface P1, a reflection end surface at the light-emitting layer 14$c$ side of the cathode 15 is defined as a second end surface P2, and the organic layer 14 is defined as a resonating portion. In the case where the organic electroluminescent device 11 has a resonator structure in which light generated in the light-emitting layer 14$c$ is resonated and extracted from the second end surface P2 side, an optical distance L between the first end surface P1 and the second end surface P2 of the resonator is set so as to satisfy equation (1) below. In reality, the optical distance L is preferably selected to be the positive minimum value that satisfies equation (1).

$$(2L)/\lambda + \phi/(2\pi) = m \qquad \text{Equation (1)}$$

In equation (1), L represents the optical distance between the first end surface P1 and the second end surface P2, $\phi$ represents the sum of a phase shift $\phi_1$ of reflected light generated at the first end surface P1 and a phase shift $\phi_2$ of reflected light generated at the second end surface P2 ($\phi = \phi_1 + \phi_2$) (rad), $\lambda$ represents a peak wavelength of the spectrum of light to be extracted from the second end surface P2 side, and m is an integer to make L be a positive value. Note that, in equation (1), L and $\lambda$ are represented by a common unit, for example, represented in units of nm.

In addition, the organic electroluminescent device 11 is configured so that an optical distance $L_1$ between a maximum light-emitting position of the light-emitting layer 14$c$ and the first end surface P1 satisfies equation (2) below, and an optical distance $L_2$ between the maximum light-emitting position and the second end surface P2 satisfies equation (3) below.

Herein, the term "maximum light-emitting position" refers to a position at which the emission intensity is the highest in a light-emitting region. For example, when light emission occurs at both the interfaces on the anode 13 side and the cathode 15 side of the light-emitting layer 14$c$, the maximum light-emitting position is one of the interfaces, the one interface being higher in emission intensity than the other interface.

$$\left.\begin{array}{l} L_1 = tL_1 + a_1 \\ (2tL_1)/\lambda = -\Phi_1/(2\pi) + m_1 \end{array}\right\} \qquad \text{Equation (2)}$$

In equation (2), $tL_1$ represents a theoretical optical distance between the first end surface P1 and the maximum light-emitting position, $a_1$ represents a correction value based on the distribution of light emission in the light-emitting layer 14$c$, $\lambda$ represents a peak wavelength of the spectrum of light to be extracted, $\phi_1$ represents a phase shift (rad) of reflected light generated in the first end surface P1, and $m_1$ represents 0 or an integer.

$$\left.\begin{array}{l} L_2 = tL_2 + a_2 \\ (2tL_2)/\lambda = -\Phi_2/(2\pi) + m_2 \end{array}\right\} \qquad \text{Equation (3)}$$

In equation (3), $tL_2$ represents a theoretical optical distance between the second end surface P2 and the maximum light-emitting position, $a_2$ represents a correction value based on the distribution of light emission in the light-emitting layer 14$c$, $\lambda$ represents a peak wavelength of the spectrum of light to be extracted, $\phi_2$ represents a phase shift (rad) of reflected light generated in the second end surface P2, and $m_2$ represents 0 or an integer.

Equation (2) ensures that when a light component generated in the light-emitting layer 14$c$, the light component propagating toward the anode 13, is reflected at the first end surface P1 and returned, the returned light has the same phase as that of light at the time of the light emission and the light component is in such a relationship with another light component generated in the light-emitting layer 14$c$, the other component propagating toward the cathode 15, that these light components intensify each other. Equation (3) ensures that when a light component generated in the light-emitting layer 14$c$, the light component propagating toward the cathode 15, is reflected at the second end surface P2 and returned, the returned light has the same phase as that of light at the time of the light emission and the light component is in such a relationship with another light component generated in the light-emitting layer 14$c$, the other component propagating toward the anode 13, that these light components intensify each other.

The organic electroluminescent device 11 according to this embodiment can be designed so as to satisfy the relationship $m_1 > m_2$ in equations (2) and (3) by forming the first electron transport layer 14$d$-1, the second electron transport layer 14$d$-2, the hole injection layer 14$a$, and the hole transport layer 14$b$ so that the total thickness [d1] of the first electron transport layer 14$d$-1 and the second electron transport layer 14$d$-2 is larger than the total thickness [d2] of the hole injection layer 14$a$ and the hole transport layer 14$b$. Consequently, the extraction efficiency of light can be increased.

Note that the theoretical optical distance $tL_1$ in equation (2) and the theoretical optical distance $tL_2$ in equation (3) are theoretical values with which, when it is assumed that the light-emitting region has no spread, the amount of phase shift in the first end surface P1 or the second end surface P2 and the amount of phase shift as a result of propagation cancel each other out and the phase of the returned light becomes the same as the phase of the light at the time of light emission. In general, however, a light-emitting region has a spread. Accordingly, the correction values $a_1$ and $a_2$ based on the distribution of light emission are added in equations (2) and (3), respectively.

The correction values $a_1$ and $a_2$ vary depending on the distribution of light emission. However, the correction values $a_1$ and $a_2$ can be determined, for example, by equation (4) below when the maximum light-emitting position is located on the cathode 15 side of the light-emitting layer 14c and the distribution of light emission spreads from the maximum light-emitting position toward the anode 13 side or when the maximum light-emitting position is located on the anode 13 side of the light-emitting layer 14c and the distribution of light emission spreads from the maximum light-emitting position toward the cathode 15 side.

$$\left. \begin{array}{l} a_1 = b(\log_e(s)) \\ a_2 = -a_1 \end{array} \right\} \quad \text{Equation (4)}$$

In equation (4), b represents a value in the range of $2n \leq b \leq 6n$ when the distribution of light emission in the light-emitting layer 14c spreads from the maximum light-emitting position toward the anode 13 or a value in the range of $-6n \leq b \leq -2n$ when the distribution of light emission in the light-emitting layer 14c spreads from the maximum light-emitting position toward the cathode 15. In equation (4), s represents a physical property value (1/e attenuation distance) relating to the distribution of light emission in the light-emitting layer 14c, and n represents an average refractive index between the first end surface P1 and the second end surface P2 at a peak wavelength λ of the spectrum of light to be extracted.

8. Structure of Display Apparatus

Next, an example of an active matrix display apparatus in which the organic electroluminescent devices 11 having the above-described structure are arranged on the substrate 12 will be described with reference to the configuration diagram of a pixel circuit of FIG. 2.

Figure 2:
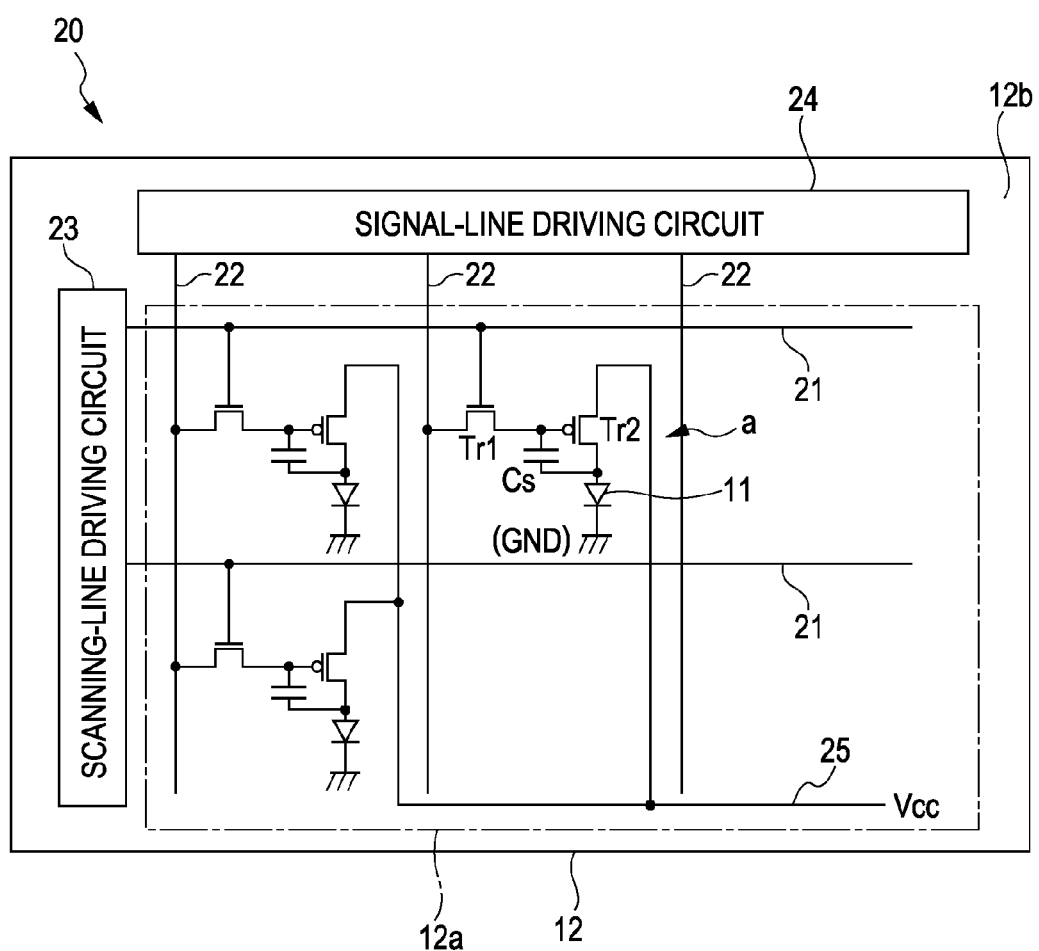
FIG. 2 is a circuit configuration diagram showing an example of a circuit configuration of a display apparatus according to an embodiment of the present invention.

As shown in FIG. 2, a display area 12a and a peripheral area 12b thereof are set on a substrate 12 of a display apparatus 20. In the display area 12a, a plurality of scanning lines 21 and a plurality of signal lines 22 are arranged horizontally and vertically, respectively. One pixel a is provided at a position corresponding to an intersection of the scanning lines 21 and the signal lines 22 so that the display area 12a constitutes a pixel array portion. Each of the pixels a is provided with an organic electroluminescent device. A scanning-line driving circuit 23 for scanning and driving the scanning lines 21 and a signal-line driving circuit 24 for providing the signal lines 22 with video signals (i.e., input signals) corresponding to luminance information are arranged in the peripheral area 12b.

The pixel circuit provided in each pixel a is composed of, for example, an organic electroluminescent device 11, a drive transistor Tr2, a write transistor (sampling transistor) Tr1, and a storage capacitor Cs. Each video signal, which has been written from the signal line 22 through the write transistor Tr1 on the basis of a drive by the scanning-line driving circuit 23, is stored in the storage capacitor Cs, a current corresponding to the amount of stored signal is supplied to the organic electroluminescent device 11, and the organic electroluminescent device 11 emits light at a luminance corresponding to the value of the current. The thin-film transistor Tr2 for driving and the storage capacitor Cs are connected to a common power supply line (Vcc) 25.

The configuration of the pixel circuit described above is merely an example. A capacitive element may be provided in the pixel circuit or a plurality of transistors may further be provided in the pixel circuit, if necessary. A drive circuit may be optionally added to the peripheral area 12b in accordance with a change in the configuration of the pixel circuit.

Figure 3:
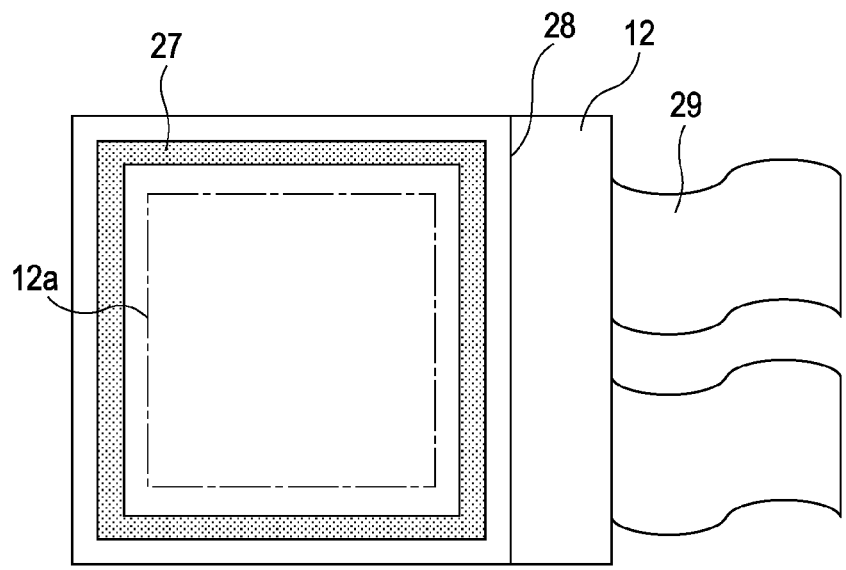
FIG. 3 is a structural view showing a display apparatus as a module having a sealed configuration to which an embodiment of the present invention is applied.

Note that the display apparatus according to an embodiment of the present invention also includes a module of a sealed configuration as shown in FIG. 3. For example, a sealing portion 27 is arranged so as to surround the display area 12a serving as the pixel array portion, and the substrate 12 is bonded to a facing component (sealing substrate 28) composed of transparent glass or the like by using the sealing portion 27 as an adhesive, thus constituting a display module. This transparent sealing substrate 28 may be provided with a color filter, a protective film, a light-shielding film, and the like. The substrate 12 serving as a display module having the display area 12a thereon may be provided with flexible printed substrates 29 for inputting and outputting signals or the like from the outside to the display area 12a (pixel array portion).

According to the above-described organic electroluminescent device 11 and display apparatus 20 of embodiments of the present invention, the electron transport layer 14d has a stacked structure including the first electron transport layer 14d-1 containing a dibenzimidazole derivative and the second electron transport layer 14d-2 containing a benzimidazole derivative. Accordingly, as described in Examples below, the current efficiency and lifetime characteristics can be improved even at substantially the same drive voltage, as compared with structures including an electron transport layer having a single-layer structure composed of a layer containing a dibenzimidazole derivative or a layer containing a benzimidazole derivative.

The electron transport layers 14d-1 and 14d-2 are each composed of a nitrogen-containing heterocyclic derivative, such as a benzimidazole derivative or a dibenzimidazole derivative, having a high electron supply capacity. Such a stacked layer can exhibit a high electron transport capacity. In order to realize light emission with high efficiency, the total thickness [d2] of the hole injection layer 14a and the hole transport layer 14b is controlled to be smaller than the total thickness [d1] of the electron transport layers 14d-1 and 14d-2. Thus, holes can be efficiently supplied to the light-emitting layer 14c so that a large number of excitons are generated in the light-emitting layer 14c.

In particular, by stacking a layer containing a dibenzimidazole derivative represented by general formula (1) and a layer containing a benzimidazole derivative selected from general formulae (2), (3), and (4) in this order from the light-emitting layer 14c side, a large number of electrons transported from the benzimidazole derivative can be adjusted by the dibenzimidazole derivative so that an appropriate electron density is obtained. As a result, an excited state can be stably generated in the light-emitting layer while achieving a high electron supply capacity. Thus, both high-efficiency light emission and stable light emission can be realized.

Furthermore, by controlling the total thickness [d2] of the hole injection layer 14a and the hole transport layer 14b to be smaller than the total thickness [d1] of the first electron transport layer 14*d*-1 and the second electron transport layer 14*d*-2, the supply of holes can be increased. Consequently, in the light-emitting layer 14*c*, a carrier balance can be achieved in which there is no excess or deficiency of holes and electrons and the amount of carrier supplied is sufficiently large. Therefore, a high luminous efficiency can be obtained.

In addition, since there is no excess or deficiency of holes and electrons, the carrier balance does not tend to be disrupted, degradation in the luminance can be suppressed, and the emission lifetime can be extended. Accordingly, a display having low electric power consumption and good long-term reliability can be realized.

Furthermore, according to the organic electroluminescent device and the display apparatus of the embodiments, since the first electron transport layer 14*d*-1 and the second electron transport layer 14*d*-2 are formed so as to have a large total thickness [d1], a recombination region of carriers in the light-emitting layer 14*c* can be arranged at a position away from the cathode 15. This structure can prevent the recombination region from being damaged during deposition of the cathode 15 by a sputtering method or the like.

Note that the application of the organic electroluminescent device 11 according to an embodiment of the present invention is not limited to an active matrix display apparatus 20 including a TFT substrate. Alternatively, the organic electroluminescent device 11 is applicable as an organic electroluminescent device used in a passive display apparatus and can achieve similar advantages. When the organic electroluminescent device 11 is applied to a passive display apparatus, one of the cathode 15 and anode 13 is configured as a signal line and the other is configured as a scanning line.

In the embodiment described above, a description has been made of a "top-emission type" device in which emitted light is extracted from the cathode 15 side, which is opposite to the substrate 12 side. However, the present invention can also be applied to a "bottom-emission-type" organic electroluminescent device in which emitted light is extracted from the substrate 12 side by forming the substrate 12 with a transparent material. In this case, in the stacked structure described with reference to FIG. 1, the anode 13 on the substrate 12 composed of a transparent material is formed of a transparent electrode material having a large work function, such as ITO. Thus, emitted light can be extracted from both the substrate 12 side and the opposite side of the substrate 12 side. In such a structure, by forming the cathode 15 with a reflective material, emitted light is extracted only from the substrate 12 side. In this case, a sealing electrode composed of Au—Ge, Au, Pt, or the like may be provided on the top layer of the cathode 15.

Furthermore, a "transmissive" organic electroluminescent device in which emitted light is extracted from the substrate 12 side can also be configured by modifying the stacked structure described with reference to FIG. 1 to a configuration that the respective layers are inversely stacked from the substrate 12 side composed of a transparent material and the anode 13 is provided as an upper electrode. Also in this case, emitted light can be extracted from both the substrate 12 side and the opposite side of the substrate 12 side by replacing the anode 13 functioning as the upper electrode with a transparent electrode.

The organic electroluminescent device 11 described in the above embodiment can also be applied to a stacked organic electroluminescent device produced by stacking units, each of which is composed of the organic layer 14 including the light-emitting layer 14*c*. Herein, the term "stacked organic electroluminescent device" means an organic electroluminescent tandem device. For example, Japanese Unexamined Patent Application Publication No. 11-329748 describes a device in which a plurality of organic electroluminescent devices are electrically connected in series, with intermediate conductive layers therebetween.

Furthermore, Japanese Unexamined Patent Application Publication Nos. 2003-45676 and 2003-272860 disclose device structures for realizing such tandem devices and describe Examples in detail. These patent documents describe that the current efficiency (cd/A) can be doubled ideally without changing the luminous efficiency (lm/W) when two units each including an organic layer are stacked and that the current efficiency (cd/A) can be trebled ideally without changing the luminous efficiency (lm/W) when three units each including an organic layer are stacked.

Accordingly, the application of an embodiment of the present invention to a tandem device can provide a device having a very long lifetime because of the synergistic effects including an effect of extending the lifetime due to an improvement in the efficiency inherently available from the configuration of the tandem device and an effect of extending the lifetime due to the configuration of the embodiment of the present invention.

9. Application Examples

The above-described display apparatus according to an embodiment of the present invention can be applied to a display apparatus of electronic equipment in various fields which display, as a picture image or video image, video signals input to the electronic equipment or video signals generated in the electronic equipment, such as various types of electronic equipment shown in FIGS. 4 to 8G, for example, digital cameras, notebook-type personal computers, mobile terminal apparatuses such as mobile phones, and video cameras. Examples of electronic equipment to which an embodiment of the present invention in applied will be described below.

Figure 4:
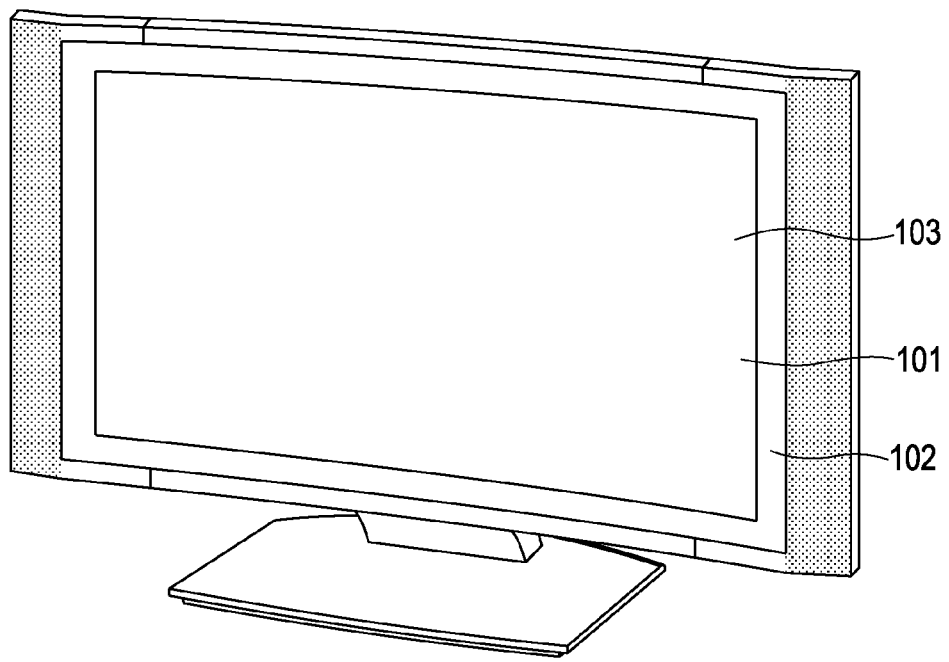
FIG. 4 is a perspective view showing a television to which an embodiment of the present invention is applied.

FIG. 4 is a perspective view showing a television to which an embodiment of the present invention is applied. The television according to this application example includes an image display screen 101 composed of a front panel 102, a filter glass 103, etc., and can be produced by using the display apparatus according to an embodiment of the present invention as the image display screen 101.

Figure 5A:
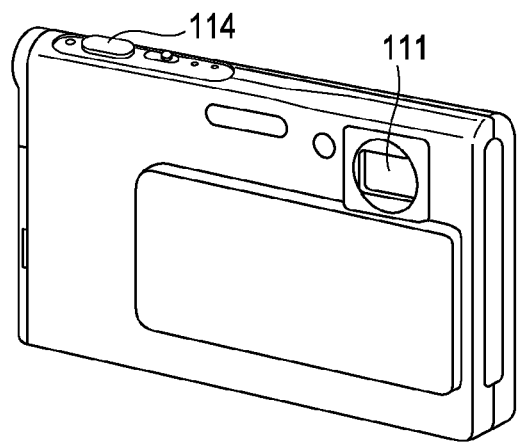
FIG. 5A is a perspective view of a digital camera to which an embodiment of the present invention is applied, viewed from the front side.
Figure 5B:
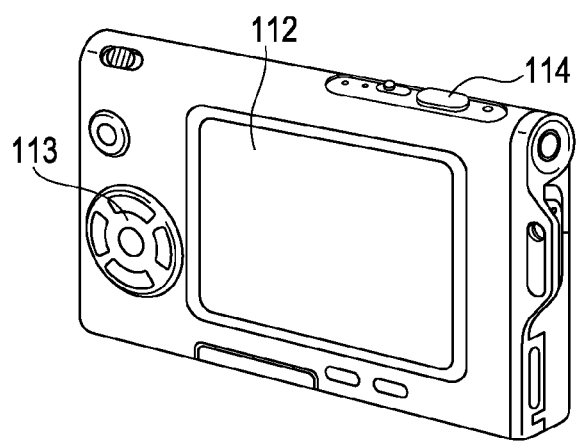
FIG. 5B is a perspective view of the digital camera to which an embodiment of the present invention is applied, viewed from the rear side.

FIGS. 5A and 5B are perspective views of a digital camera to which an embodiment of the present invention is applied. FIG. 5A is a perspective view, as viewed from the front side, and FIG. 5B is a perspective view, as viewed from the rear side. The digital camera according to this application example includes a light-emitting unit 111 for flashlight, a display 112, a menu switch 113, a shutter button 114, etc., and can be produced by using the display apparatus according to an embodiment of the present invention as the display 112.

Figure 6:
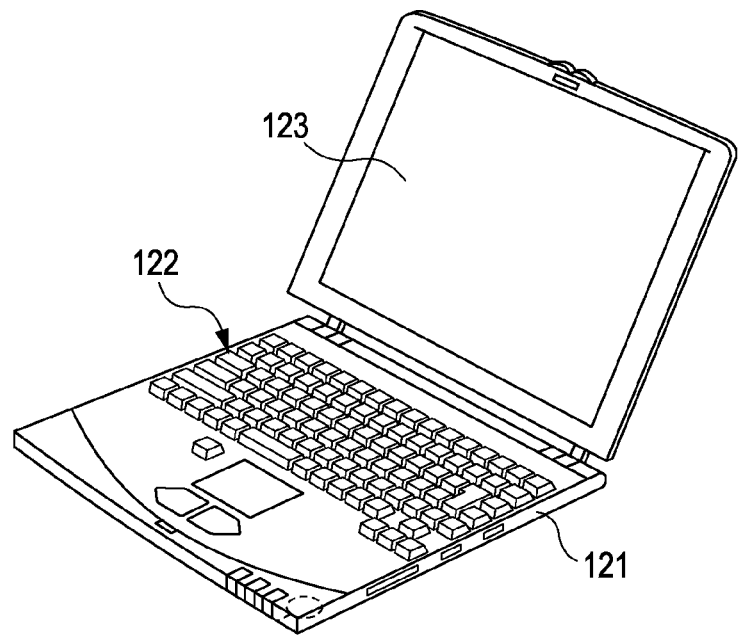
FIG. 6 is a perspective view showing a notebook-type personal computer to which an embodiment of the present invention is applied.

FIG. 6 is a perspective view showing a notebook-type personal computer to which an embodiment of the present invention is applied. The notebook-type personal computer according to this application example includes a main body 121 including a keyboard 122 that is operated when characters and the like are input, a display 123 configured to display images, etc., and can be produced by using the display apparatus according to an embodiment of the present invention as the display 123.

Figure 7:
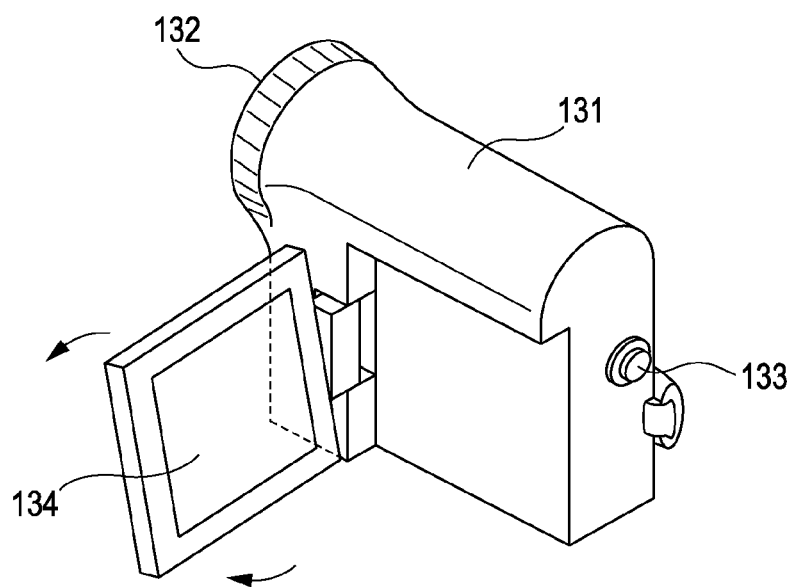
FIG. 7 is a perspective view showing a video camera to which an embodiment of the present invention is applied.

FIG. 7 is a perspective view showing a video camera to which an embodiment of the present invention is applied. The video camera according to this application example includes a main body 131, a lens 132 for shooting an object, the lens being provided on a front side face, a start/stop switch 133 used in shooting, a display 134, etc., and can be produced by using the display apparatus according to an embodiment of the present invention as the display 134.

FIGS. 8A to 8G are views showing a mobile terminal apparatus, for example, a mobile phone, to which an embodiment of the present invention is applied. FIG. 8A is a front view of the mobile phone in an opened state, FIG. 8B is a side view thereof, FIG. 8C is a front view of the mobile phone in a closed state, FIG. 8D is a left side view thereof, FIG. 8E is a right side view thereof, FIG. 8F is a top view thereof, and FIG. 8G is a bottom view thereof. The mobile phone according to this application example includes an upper casing 141, a lower casing 142, a connecting portion (hinge in this example) 143, a display 144, a sub-display 145, a picture light 146, a camera 147, etc., and can be produced by using the display apparatus according to an embodiment of the present invention as the display 144 or the sub-display 145.

EXAMPLES

Next, a description will be made of methods of producing organic electroluminescent devices of specific Examples of the present invention and Comparative Examples to these Examples and evaluation results of the organic electroluminescent devices.

Examples 1 to 8

The organic electroluminescent devices 11 having the structure described with reference to FIG. 1 in the above embodiment were prepared. Each of the organic electroluminescent devices 11 was formed as a top-emission type organic electroluminescent device 11 in which light emitted when holes injected from the anode 13 and electrons injected from the cathode 15 are recombined in the light-emitting layer 14c is extracted from the cathode 15 side. In addition, each of the organic electroluminescent devices 11 was formed as a resonator structure in which emitted light is resonated between the anode 13 and the cathode 15 and is extracted. Table 27 shows the layer structures of Examples 1 to 8 together with those of Comparative Examples 1 to 5. However, a description of structures common to the Examples and Comparative Examples is omitted. Methods of producing the organic electroluminescent devices 11 will be described below.

First, on a substrate 12, an Al—Nd alloy layer containing 10% by weight Nd and having a thickness of 120 nm was formed as an anode 13. In this case, the surface of the anode 13 composed of the Al—Nd alloy layer functions as a first end surface P1 of a resonator structure to be formed. Next, the surface of the anode 13 other than a light-emitting region having dimensions of 2 mm×2 mm was masked with an insulating film (not shown) by vacuum evaporation of $SiO_2$, thus preparing a cell for an organic electroluminescent device.

Next, on the anode 13, hexanitrile azatriphenylene represented by structural formula (5)-1 above was deposited as a hole injection layer 14a so as to have a thickness of 10 nm (evaporation rate: 0.2 to 0.4 nm/sec).

Next, as shown in Table 27, a hole transport layer 14b having a predetermined thickness was deposited for each of Examples 1 to 8 and Comparative Examples 1 to 5 by a vacuum evaporation method using a predetermined material (evaporation rate: 0.2 to 0.4 nm/sec). The material used in this step is the compound represented by structural formula 7-(42) or 7-(43) shown in Table 23 and has a hole-transporting property. Accordingly, in Examples 1 to 8 and Comparative Example 5, the total thickness [d2] of the hole injection layer 14a and the hole transport layer 14b was 40 nm. In contrast, in Comparative Examples 1 to 4, the total thickness [d2] of the hole injection layer 14a and the hole transport layer 14b was 140 nm.

Subsequently, on the hole transport layer 14b, 9-(2-naphthyl)-10-[4-(1-naphthyl)phenyl]anthracene (host A) and N,N,N',N'-tetra(2-naphthyl)-4,4'-diaminostilbene (dopant B), which is a blue-light emitting dopant were deposited as a light-emitting layer 14c having a thickness of 36 nm by a vacuum evaporation method such that the dopant concentration was 5% in terms of the film thickness ratio.

Next, as shown in Table 27, a first electron transport layer 14d-1 and a second electron transport layer 14d-2 each having a predetermined thickness were deposited for each of Examples 1 to 8 and Comparative Examples 1 to 5 by a vacuum evaporation method using a predetermined material.

Thus, in Example 1 to 7, a stacked structure having a thickness of 120 nm and including the first electron transport layer 14d-1 containing a dibenzimidazole derivative [represented by structural formula 1-(8) or the like] and the second electron transport layer 14d-2 disposed on the first electron transport layer 14d-1 and containing a benzimidazole deriva-

TABLE 27

|  | Hole injection layer 14a | Hole transport layer 14b | First electron transport layer 14d-1 | Second electron transport layer 14d-2 | Current efficiency (cd/A) | Voltage (V) | Time (hr) |
|---|---|---|---|---|---|---|---|
| Example 1 | (5)-1 10 nm | (7)-42 30 nm | (1)-8 20 nm | (3)-16 100 nm | 7.8 | 6.2 | 3,800 |
| Example 2 |  |  | (1)-12 60 nm | (3)-16 60 nm | 8.3 | 6.0 | 5,200 |
| Example 3 |  |  | (1)-8 20 nm | (2)-73 100 nm | 7.0 | 6.3 | 4,080 |
| Example 4 |  | (7)-43 30 nm | (1)-1 20 nm | (3)-3 100 nm | 6.3 | 6.4 | 3,300 |
| Example 5 |  |  | (1)-13 60 nm | (3)-7 60 nm | 9.2 | 7.3 | 5,500 |
| Example 6 |  |  | (1)-2 20 nm | (3)-16 100 nm | 9.1 | 6.2 | 5,800 |
| Example 7 |  |  | (1)-13 90 nm | (3)-16 30 nm | 9.1 | 6.2 | 5,200 |
| Example 8 |  |  | (3)-26 110 nm | (1)-13 10 nm | 7.0 | 8.3 | 2,400 |
| Comparative Example 1 | (5)-1 10 nm | (7)-42 130 nm | (1)-8 20 nm |  | 3.0 | 6.3 | 480 |
| Comparative Example 2 |  |  | (2)-6 20 nm |  | 2.7 | 5.2 | 350 |
| Comparative Example 3 |  |  | Alq3 20 nm |  | 2.3 | 6.5 | 950 |
| Comparative Example 4 |  |  | Alq3 10 nm | Bphen 10 nm | 2.7 | 5.0 | 300 |
| Comparative Example 5 |  | (7)-42 30 nm | (1)-8 120 nm |  | 4.0 | 13.2 | 1,000 | tive [represented by structural formula 3-(16) or the like] was formed. In Example 8, a stacked structure having a thickness of 120 nm was formed in which the layers were stacked in the order reverse to that in Examples 1 to 7.

In contrast, in Comparative Examples 1 to 3 and Comparative Example 5, an electron transport layer having a single-layer structure was formed. In Comparative Example 4, an electron transport layer in which a second electron transport layer (10 nm) composed of bathophenanthroline (Bphen) shown below was stacked on a first electron transport layer (10 nm) composed of tris(8-quinolinol)aluminum complex (Alq3) was formed.

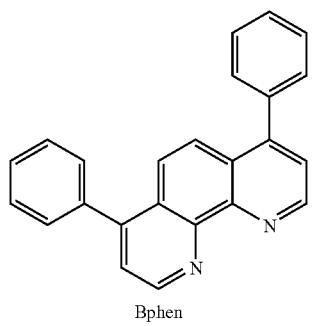 [SMILES: c1ccc(-c2ccnc3c2ccc2c(-c4ccccc4)ccnc23)cc1]

Bphen

After an organic layer 14 was formed as described above, LiF was deposited as a first layer 15a of a cathode 15 so as to have a thickness of about 0.3 nm by a vacuum evaporation method (evaporation rate: 0.01 nm/sec or less). Subsequently, Mg—Ag was deposited as a second layer 15b of the cathode 15 so as to have a thickness of 10 nm by a vacuum evaporation method. Thus, the cathode 15 having a two-layer structure was provided. In this case, a surface of the second layer 15b, the surface being disposed on the organic layer 14 side, functions as a second end surface P2 of the resonator structure.

As described above, the organic electroluminescent devices 11 of Examples 1 to 8 to which an embodiment of the present invention was applied and the organic electroluminescent devices of Comparative Examples 1 to 5 were prepared.

Evaluation Results 1

For each of the organic electroluminescent devices of Examples 1 to 8 and Comparative Examples 1 to 5 prepared as described above, the current efficiency (cd/A) and the drive voltage (V) were measured at a current density of 10 mAcm$^{-2}$. Furthermore, the time (hr) during which the relative luminance was decreased to 0.5 was measured as an emission lifetime when the initial luminance in a constant-current driving at 30° C. and 30 mAcm$^{-2}$ was assumed to be 1. The results are also shown in Table 27.

As shown in Table 27, in Examples 1 to 8 including an electron transport layer having a structure to which an embodiment of the present invention was applied, it was confirmed that the drive voltage could be reduced, and good current efficiency and emission lifetime could be achieved, as compared with Comparative Example 5, in which the structures other than the electron transport layer were the same as those of Examples 1 to 8 but to which an embodiment of the present invention was not applied. According to these results, it was confirmed that both an increase in the efficiency and an extension of the lifetime can be realized by applying an embodiment of the present invention.

In particular, in the organic electroluminescent devices 11 of Examples 5 and 6 including benzimidazole derivatives having different mobility, the current efficiency was as high as 9 cd/A or more and a higher luminous efficiency than that of other Examples could be achieved. In addition, the organic electroluminescent devices 11 of Examples 5 and 6 achieved emission lifetimes of 5,000 hours or more, and thus it was confirmed that the lifetime was significantly extended.

In Comparative Examples 1 to 4, the total thickness [d2] of the hole injection layer 14a and the hole transport layer 14b was larger than the total thickness [d1] of the electron transport layers 14d-1 and 14d-2. It was confirmed that, in the organic electroluminescent devices having such a structure, the efficiency was low and the carrier balance tended to be disrupted during driving, resulting in degradation in the luminance within a short time. The organic electroluminescent device of Comparative Example 5 included an electron transport layer having a single-layer structure containing a dibenzimidazole derivative. In the organic electroluminescent device having such a structure, a sufficient carrier balance could not be achieved, the efficiency was low, and the lifetime was shortened.

Examples 9 to 12

Organic electroluminescent devices 11 of Examples 9 to 12 and Comparative Example 6 were prepared by the same method as that used in Examples 1 to 8. However, the materials and the thicknesses of the hole injection layer 14a, the hole transport layer 14b, the first electron transport layer 14d-1, and the second electron transport layer 14d-2 were set as shown in Table 28 below.

TABLE 28

|  | Hole injection layer 14a (5)-1 [d2] (nm) | Hole transport layer 14b (7)-42 | First electron transport layer 14d-1 (1)-12 [d1] (nm) | Second electron transport layer 14d-2 (3)-26 | Organic layer 14 [da] (nm) | Film thickness ratio [d1]/[da] | Current efficiency (cd/A) | Voltage (V) | Time (hr) |
|---|---|---|---|---|---|---|---|---|---|
| Example 9 | 10 | 30 | 60 | 60 | 196 | 0.61 | 8.1 | 6.5 | 4,800 |
| Example 10 | 10 | 30 | 10 | 10 | 96 | 0.21 | 10.0 | 5.0 | 2,500 |
| Example 11 | 10 | 50 | 10 | 10 | 116 | 0.17 | 3.5 | 5.2 | 2,000 |
| Example 12 | 10 | 130 | 10 | 10 | 196 | 0.10 | 5.0 | 5.5 | 1,100 |
| Comparative Example 6 | 10 | 130 | 0 | 20 | 196 | 0.10 | 5.0 | 5.1 | 600 |

Evaluation Results 2

The organic electroluminescent devices 11 of Examples 9 to 12 and Comparative Example 6 prepared as described above were evaluated as in Examples 1 to 8.

According to the results, it was confirmed that particularly good lifetime characteristics could be obtained in Example 9, in which the ratio [d1]/[da] of the total thickness [d1] of the first electron transport layer 14d-1 and the second electron transport layer 14d-2 to the total thickness [da] of the entire organic layer 14 satisfies the relationship 0.90>[d1]/[da] >0.30, and the relationship [d1]>[d2] is satisfied where [d2] represents the total thickness of the hole supply layer including the hole injection layer 14a and the hole transport layer 14b. The lifetime characteristics of Comparative Example 6 including an electron transport layer having a single-layer structure were significantly inferior to those of Examples 9 to 12.

Furthermore, Examples 9 to 11, in which the total thickness [d2] of the hole supply layer including the hole injection layer 14a and the hole transport layer 14b was 60 nm or less, exhibited lifetime characteristics better than the lifetime characteristics of Example 12, in which the total thickness [d2] was larger than the total thicknesses [d2] of Examples 9 to 11.

Examples 13 to 21

Organic electroluminescent devices 11 of Examples 13 to 21 and Comparative Examples 7 and 8 were prepared by the same method as that used in Examples 1 to 8. However, the materials and the thicknesses of the hole injection layer 14a, the hole transport layer 14b, the first electron transport layer 14d-1, and the second electron transport layer 14d-2 were set as shown in Table 29 below.

TABLE 29

|  | Hole injection layer 14a (5)-1 [d2] = 40 (nm) | Hole transport layer 14b (7)-42 | First electron transport layer 14d-1 (1)-13 [d1] = 120 (nm) | Second electron transport layer 14d-2 (3)-27 | Current efficiency (cd/A) | Voltage (V) | Time (hr) |
|---|---|---|---|---|---|---|---|
| Comparative Example 7 | 10 nm | 30 nm | 0 | 120 | 8.1 | 6 | 2,200 |
| Example 13 |  |  | 5 | 115 | 8.1 | 6 | 2,800 |
| Example 14 |  |  | 10 | 110 | 8.1 | 6.1 | 3,300 |
| Example 15 |  |  | 20 | 100 | 8.1 | 6.2 | 3,900 |
| Example 16 |  |  | 40 | 80 | 8.1 | 6.3 | 4,100 |
| Example 17 |  |  | 50 | 70 | 8.1 | 6.4 | 4,400 |
| Example 18 |  |  | 60 | 60 | 8.1 | 6.5 | 4,800 |
| Example 19 |  |  | 80 | 40 | 8.1 | 6.6 | 5,000 |
| Example 20 |  |  | 90 | 30 | 8.1 | 6.7 | 5,100 |
| Example 21 |  |  | 110 | 10 | 7.0 | 7.3 | 3,500 |
| Comparative Example 8 |  |  | 120 | 0 | 6.0 | 10.0 | 800 |

Evaluation Results 3

Figure 9:
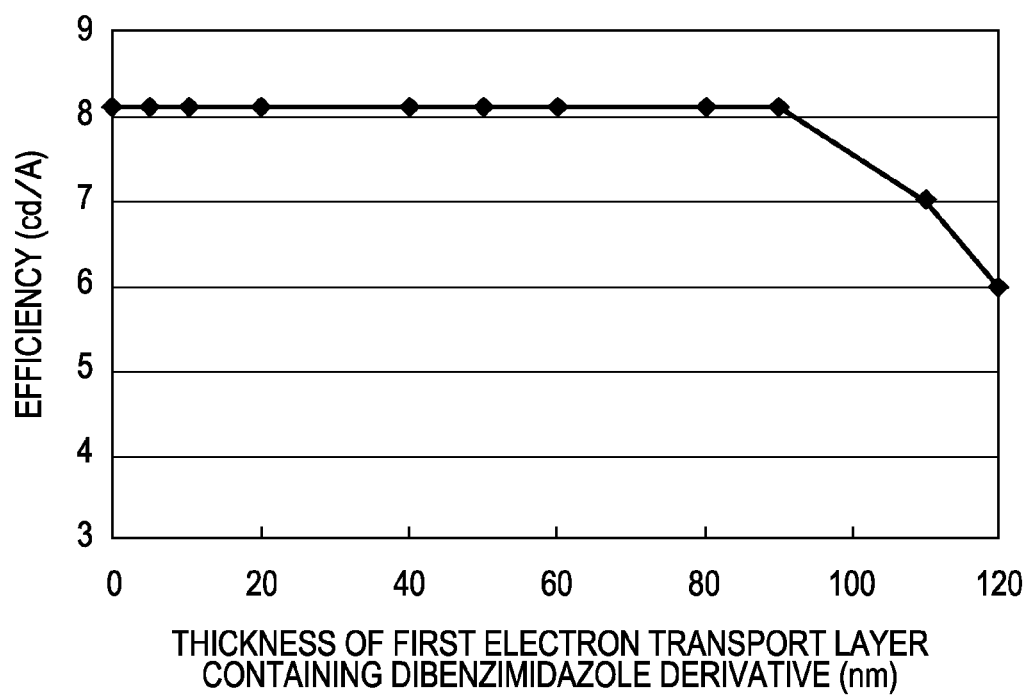
FIG. 9 is a graph showing a change in the current efficiency when the thickness of a layer containing a dibenzimidazole derivative in an electron transport layer was changed.
Figure 10:
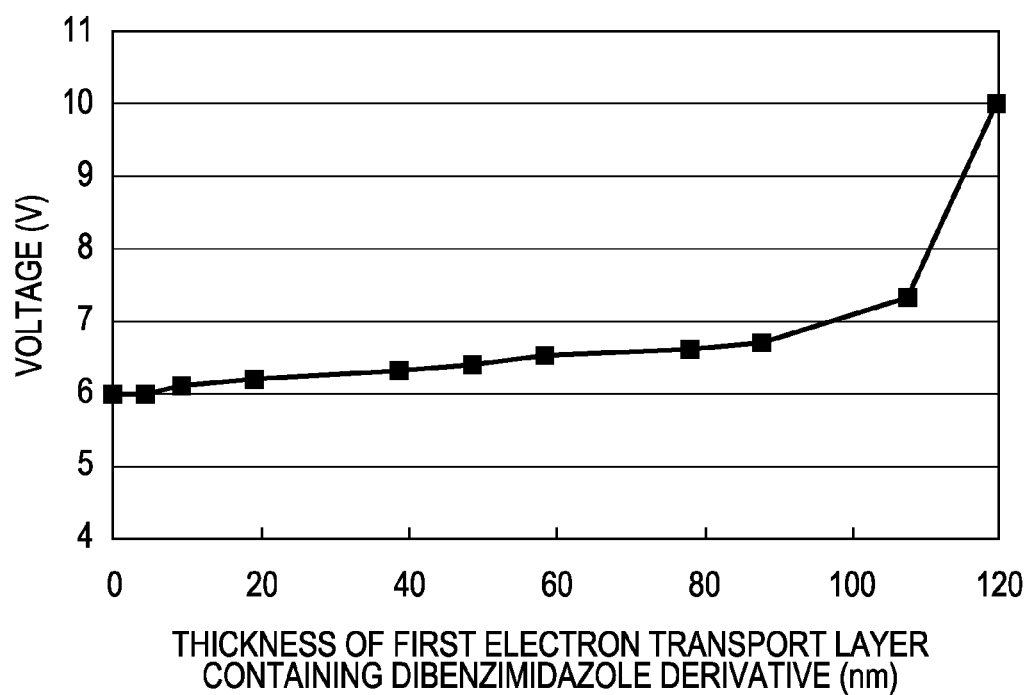
FIG. 10 is a graph showing a change in the drive voltage when the thickness of the layer containing the dibenzimidazole derivative in the electron transport layer was changed.
Figure 11:
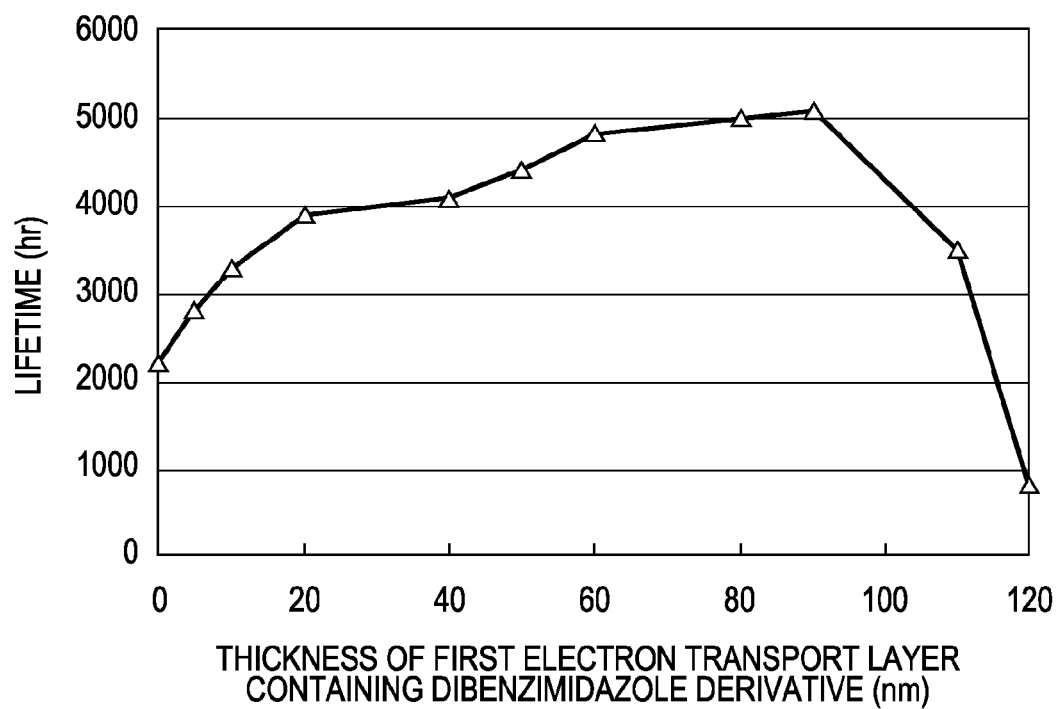
FIG. 11 is a graph showing a change in the emission lifetime when the thickness of the layer containing the dibenzimidazole derivative in the electron transport layer was changed.

The organic electroluminescent devices 11 of Examples 13 to 21 and Comparative Examples 7 and 8 prepared as described above were evaluated as in Examples 1 to 8. FIGS. 9 to 11 are graphs showing the evaluation results of Examples 13 to 21 and Comparative Examples 7 and 8. The horizontal axis of each of the graphs represents the thickness of the first electron transport layer 14d-1 containing a dibenzimidazole derivative. FIG. 9 shows the current efficiency, FIG. 10 shows the voltage, and FIG. 11 shows the lifetime.

The results showed that a long lifetime of 3,000 hours or more could be achieved by stacking a first electron transport layer 14d-1 containing a dibenzimidazole derivative and having a large thickness of 10 nm or more. In addition, the lifetime characteristics of Comparative Example 8 including an electron transport layer having a single-layer structure were significantly inferior to those of Examples 13 to 21.

The present application contains subject matter related to that disclosed in Japanese Priority Patent Application JP 2009-090765 filed in the Japan Patent Office on Apr. 3, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An organic electroluminescent device comprising:

an anode;

a cathode; and an organic layer including at least (i) a light-emitting layer, (ii) a hole supply layer including a hole injection layer, and a hole transport layer and (iii) an electron transport layer, the organic layer between the anode and the cathode, wherein, the electron transport layer being located between the cathode and the light-emitting layer, the electron transport layer has a stacked structure including a layer containing a benzimidazole derivative and a layer containing a dibenzimidazole derivative represented by general formula (1):

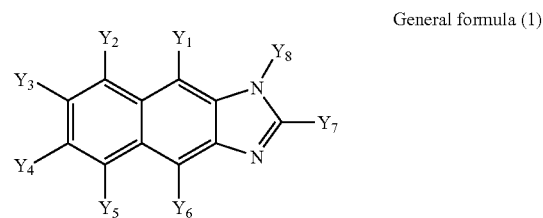

General formula (1)

where $Y_1$ to $Y_8$ each represent a substituted or unsubstituted aryl group having 6 to 60 carbon atoms, a substituted or unsubstituted alkenyl group, a substituted or unsubstituted pyridyl group, a substituted or unsubstituted quinolyl group, a substituted or unsubstituted alkyl group having 1 to 20 carbon atoms, a substituted or unsubstituted alkoxy group having 1 to 20 carbon atoms, or a substituted or unsubstituted aliphatic cyclic group, and $Y_7$ and $Y_8$ may form a ring through a linking group, the thickness, [d1], of the electron transport layer, is larger than the total thickness, [d2], of the hole supply layer, and the ratio of the thickness [d1] of the electron transport layer to the total thickness [da] of the organic layer satisfies the relationship 0.90>[d1]/[da]>0.30.

2. The organic electroluminescent device according to claim 1, wherein the electron transport layer has a structure in which the layer containing the dibenzimidazole derivative and the layer containing the benzimidazole derivative are stacked in this order from the light-emitting layer side where the layer containing the dibenzimidazole derivative is closer to the light-emitting layer side than the layer containing the benzimidazole derivative.

3. The organic electroluminescent device according to claim 1, wherein the hole injection layer is between the anode and the light-emitting layer.

4. The organic electroluminescent device according to claim 1, wherein the thickness [d1] of the electron transport layer is 70 nm or more.

5. The organic electroluminescent device according to claim 1, wherein the thickness [d2] of the hole supply layer is 60 nm or less.

6. The organic electroluminescent device according to claim 1, wherein light generated in the light-emitting layer is resonated between the anode and the cathode and extracted from one of the anode and the cathode.

7. The organic electroluminescent device according to claim 1, wherein the light-emitting layer contains an anthracene derivative.

8. A display apparatus comprising:
an anode;
a cathode; and
an organic layer including at least (i) a light-emitting layer, (ii) a hole supply layer including a hole injection layer and a hole transport layer, and (iii) an electron transport layer, the organic layer located between the anode and the cathode, wherein,
the electron transport layer is located between the cathode and the light-emitting layer,
the electron transport layer has a structure in which a layer containing a dibenzimidazole derivative represented by general formula (1) and a layer containing a benzimidazole derivative are stacked in this order from the light-emitting layer side, where the layer containing the dibenzimidazole derivative is closer to the light-emitting layer side than the layer containing the benzimidazole derivative,
general formula 1 being:

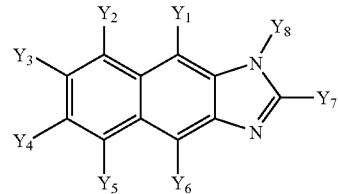

General formula (1)

where $Y_1$ to $Y_8$ each represent a substituted or unsubstituted aryl group having 6 to 60 carbon atoms, a substituted or unsubstituted alkenyl group, a substituted or unsubstituted pyridyl group, a substituted or unsubstituted quinolyl group, a substituted or unsubstituted alkyl group having 1 to 20 carbon atoms, a substituted or unsubstituted alkoxy group having 1 to 20 carbon atoms, or a substituted or unsubstituted aliphatic cyclic group, and $Y_7$ and $Y_8$ may form a ring through a linking group, a substrate on which an organic electroluminescent device including the anode, the cathode, and the organic layer disposed between the anode and the cathode is arranged, the thickness, [d1], of the electron transport layer, is larger than the total thickness, [d2], of the hole supply layer, and the ratio of the thickness [d1] of the electron transport layer to the total thickness [da] of the organic layer satisfies the relationship 0.90>[d1]/[da]22 0.30.

9. The organic electroluminescent device according to claim 4, wherein the hole supply layer has a thickness [d2] of 60 nm or less.

* * * * *